US010355012B2

(12) United States Patent
Shimabukuro et al.

(10) Patent No.: US 10,355,012 B2
(45) Date of Patent: Jul. 16, 2019

(54) MULTI-TIER THREE-DIMENSIONAL MEMORY DEVICE WITH STRESS COMPENSATION STRUCTURES AND METHOD OF MAKING THEREOF

(71) Applicant: SANDISK TECHNOLOGIES LLC, Plano, TX (US)

(72) Inventors: Seiji Shimabukuro, Yokkaichi (JP); Raghuveer S. Makala, Campbell, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/632,983

(22) Filed: Jun. 26, 2017

(65) Prior Publication Data

US 2018/0374865 A1    Dec. 27, 2018

(51) Int. Cl.
*H01L 27/11582* (2017.01)
*H01L 27/11556* (2017.01)
(Continued)

(52) U.S. Cl.
CPC ...... *H01L 27/11582* (2013.01); *H01L 23/535* (2013.01); *H01L 27/1157* (2013.01);
(Continued)

(58) Field of Classification Search
CPC .............. H01L 27/11551–27/11556; H01L 27/11578–27/11582; H01L 29/7842;
(Continued)

(56) References Cited

U.S. PATENT DOCUMENTS 5,915,167 A   6/1999 Leedy
8,884,357 B2  11/2014 Wang et al.
(Continued)

FOREIGN PATENT DOCUMENTS

WO    2017034710 A1   3/2017

OTHER PUBLICATIONS

Endoh, et al., "Novel Ultra High Density Memory with a Stacked-Surrounding Gate Transistor (S-SGT) Structured Cell," IEDM Proc. (2001) 33-36.
(Continued)

*Primary Examiner* — Tucker J Wright
(74) *Attorney, Agent, or Firm* — The Marbury Law Group PLLC

(57) ABSTRACT

An alternating stack of insulating layers and spacer material layers is formed over a substrate. The spacer material layers are formed as, or are subsequently replaced with, electrically conductive layers. A retro-stepped dielectric material portion comprising a compressive-stress-generating dielectric material on stepped surfaces of the alternating stack. Memory stack structures are formed through the first-tier alternating stack. Each of the memory stack structures includes a vertical semiconductor channel and a memory film. A patterned tensile-stress-generating material layer is formed over the retro-stepped dielectric material portion in a region that is laterally spaced outward from an outer periphery of a topmost layer within the alternating stack. The patterned tensile-stress-generating material layer applies a tensile stress to the retro-stepped dielectric material portion and to the alternating stack to compensate for the compressive stress generated by the retro-stepped dielectric material portion.

9 Claims, 36 Drawing Sheets

(51) Int. Cl.
  *H01L 29/78* (2006.01)
  *H01L 29/788* (2006.01)
  *H01L 29/792* (2006.01)
  *H01L 29/66* (2006.01)
  *H01L 23/535* (2006.01)
  *H01L 27/1157* (2017.01)
  *H01L 27/11573* (2017.01)
  *H01L 27/11575* (2017.01)

(52) U.S. Cl.
  CPC .. *H01L 27/11556* (2013.01); *H01L 27/11573* (2013.01); *H01L 27/11575* (2013.01); *H01L 29/66553* (2013.01); *H01L 29/66825* (2013.01); *H01L 29/66833* (2013.01); *H01L 29/7849* (2013.01); *H01L 29/7889* (2013.01); *H01L 29/7926* (2013.01)

(58) Field of Classification Search
  CPC ............. H01L 29/7843; H01L 29/7849; H01L 29/7889; H01L 29/7926
  See application file for complete search history.

(56) References Cited

U.S. PATENT DOCUMENTS

| | | | |
|---|---|---|---|
| 8,946,023 B2 | 2/2015 | Makala et al. | |
| 9,034,760 B2 | 5/2015 | Chen et al. | |
| 9,230,987 B2 | 1/2016 | Pachamuthu et al. | |
| 9,343,358 B1 | 5/2016 | Xu | |
| 9,419,135 B2 | 8/2016 | Baenninger et al. | |
| 9,449,982 B2 | 9/2016 | Lu et al. | |
| 9,455,267 B2 | 9/2016 | Zhang et al. | |
| 9,502,471 B1 | 11/2016 | Lu et al. | |
| 9,570,463 B1 | 2/2017 | Zhang et al. | |
| 9,627,403 B2 | 4/2017 | Liu et al. | |
| 9,853,052 B1* | 12/2017 | Setta | H01L 27/11582 |
| 2015/0236038 A1 | 8/2015 | Pachamuthu et al. | |
| 2016/0049421 A1 | 2/2016 | Zhang et al. | |
| 2016/0141294 A1 | 5/2016 | Peri et al. | |
| 2016/0149002 A1* | 5/2016 | Sharangpani | H01L 29/1054 257/314 |
| 2016/0204117 A1 | 7/2016 | Liu et al. | |
| 2016/0300848 A1 | 10/2016 | Pachamuthu et al. | |
| 2017/0062454 A1 | 3/2017 | Lu et al. | |
| 2017/0069645 A1 | 3/2017 | Kubota | |

OTHER PUBLICATIONS

U.S. Appl. No. 15/015,190, filed Feb. 4, 2016, SanDisk Technologies LLC.
U.S. Appl. No. 15/049,444, filed Feb. 22, 2016, SanDisk Technologies LLC.
U.S. Appl. No. 15/186,768, filed Jun. 20, 2016, SanDisk Technologies LLC.
U.S. Appl. No. 15/195,377, filed Jun. 28, 2016, SanDisk Technologies LLC.
U.S. Appl. No. 15/195,446, filed Jun. 28, 2016, SanDisk Technologies LLC.
U.S. Appl. No. 15/243,260, filed Aug. 22, 2016, SanDisk Technologies LLC.
U.S. Appl. No. 15/335,850, filed Oct. 27, 2016, SanDisk Technologies LLC.
U.S. Appl. No. 15/347,101, filed Nov. 9, 2016, SanDisk Technologies LLC.
U.S. Appl. No. 15/434,544, filed Feb. 16, 2017, SanDisk Technologies LLC.
U.S. Appl. No. 15/488,924, filed Apr. 17, 2017, SanDisk Technologies LLC.
International Application No. PCT/US2018/019853, International Search Report and Written Opinion, dated May 22, 2018, 14pgs.

* cited by examiner

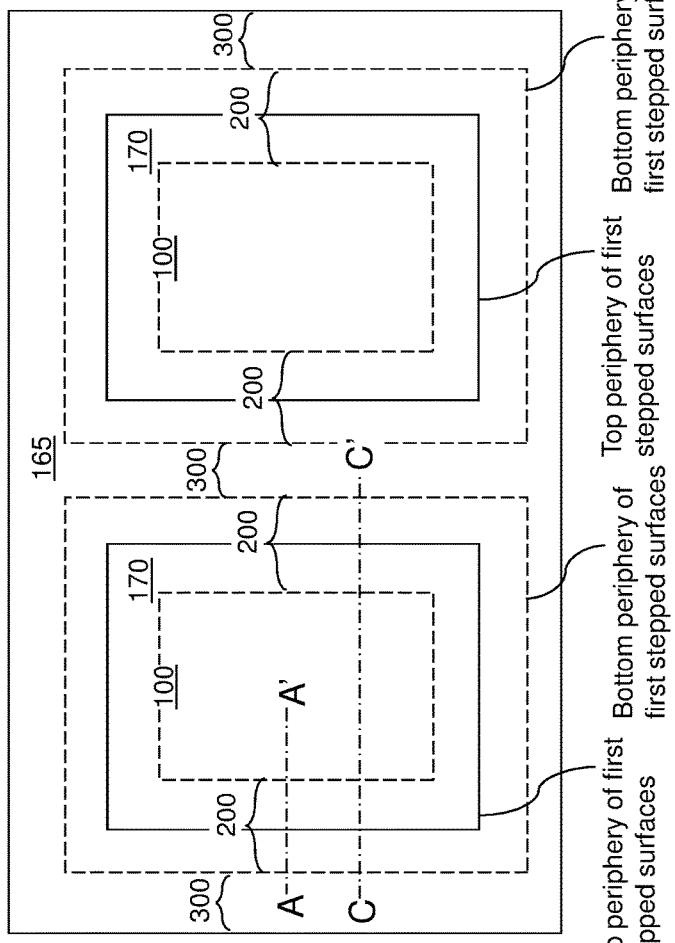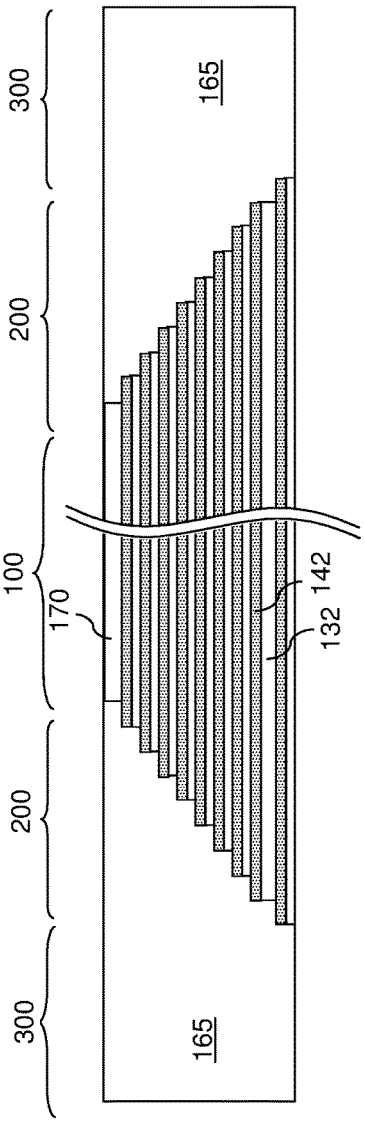

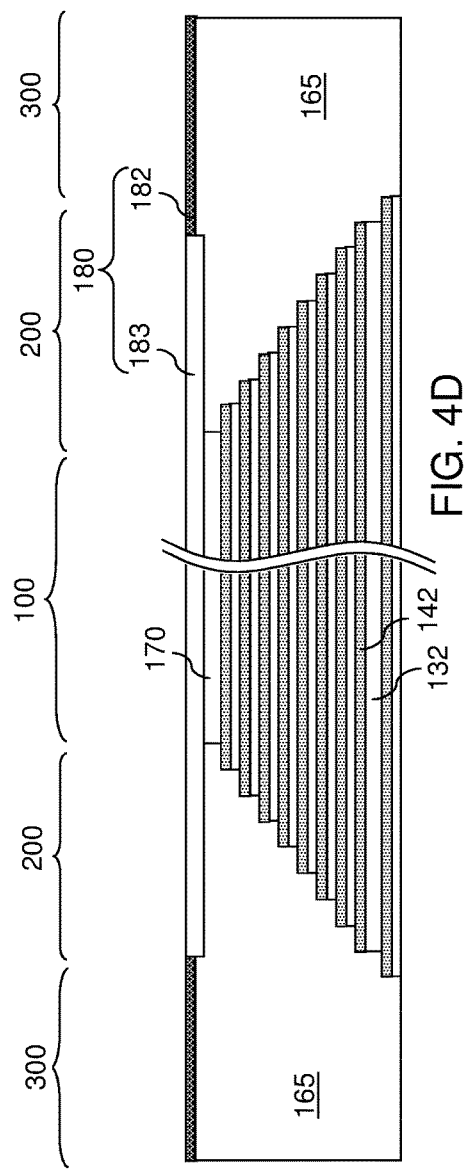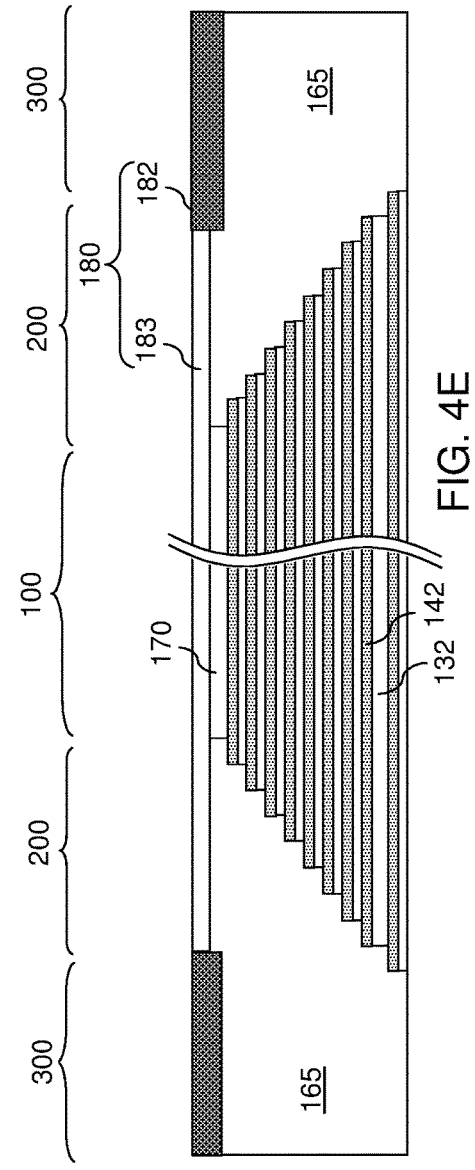

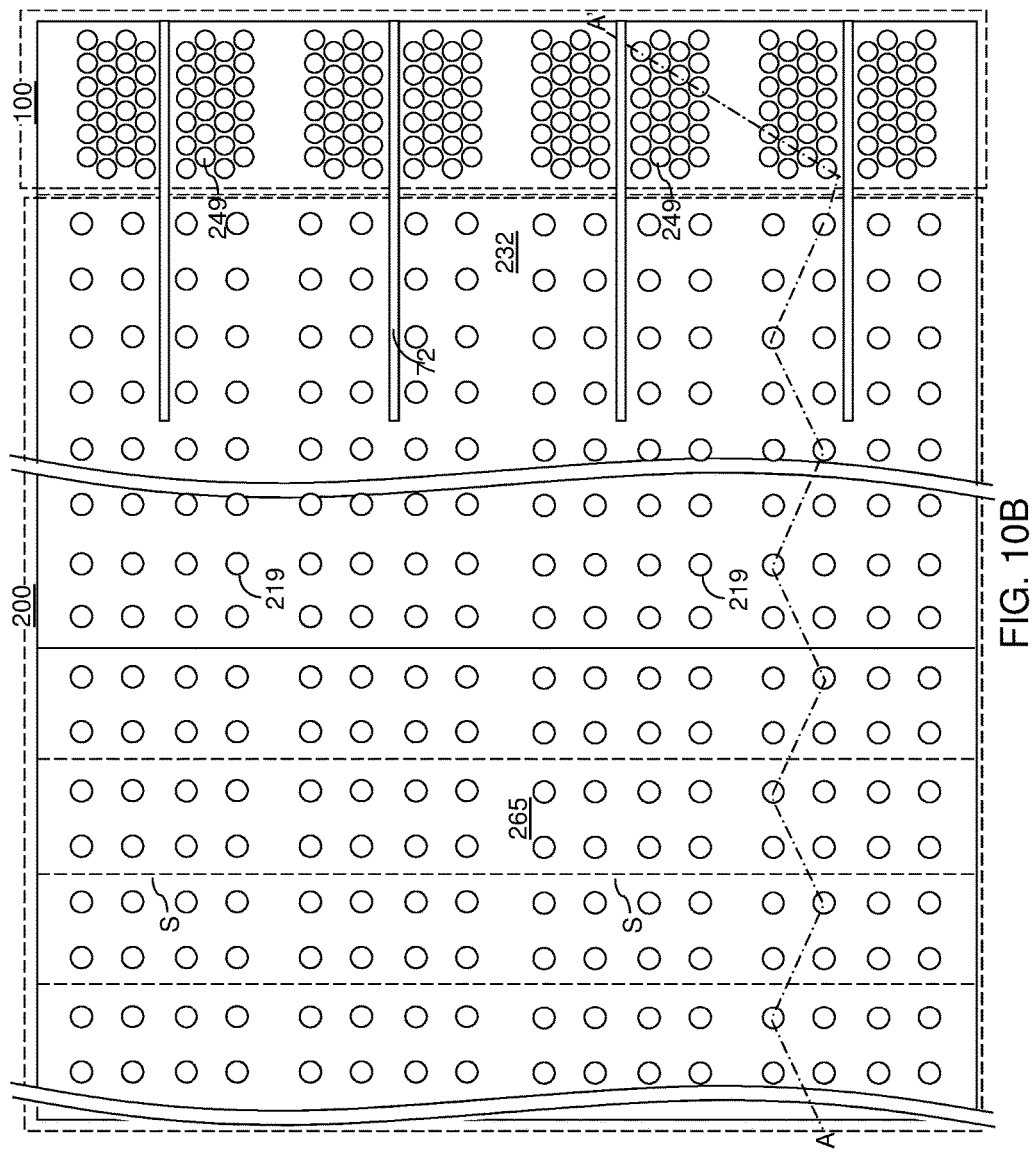

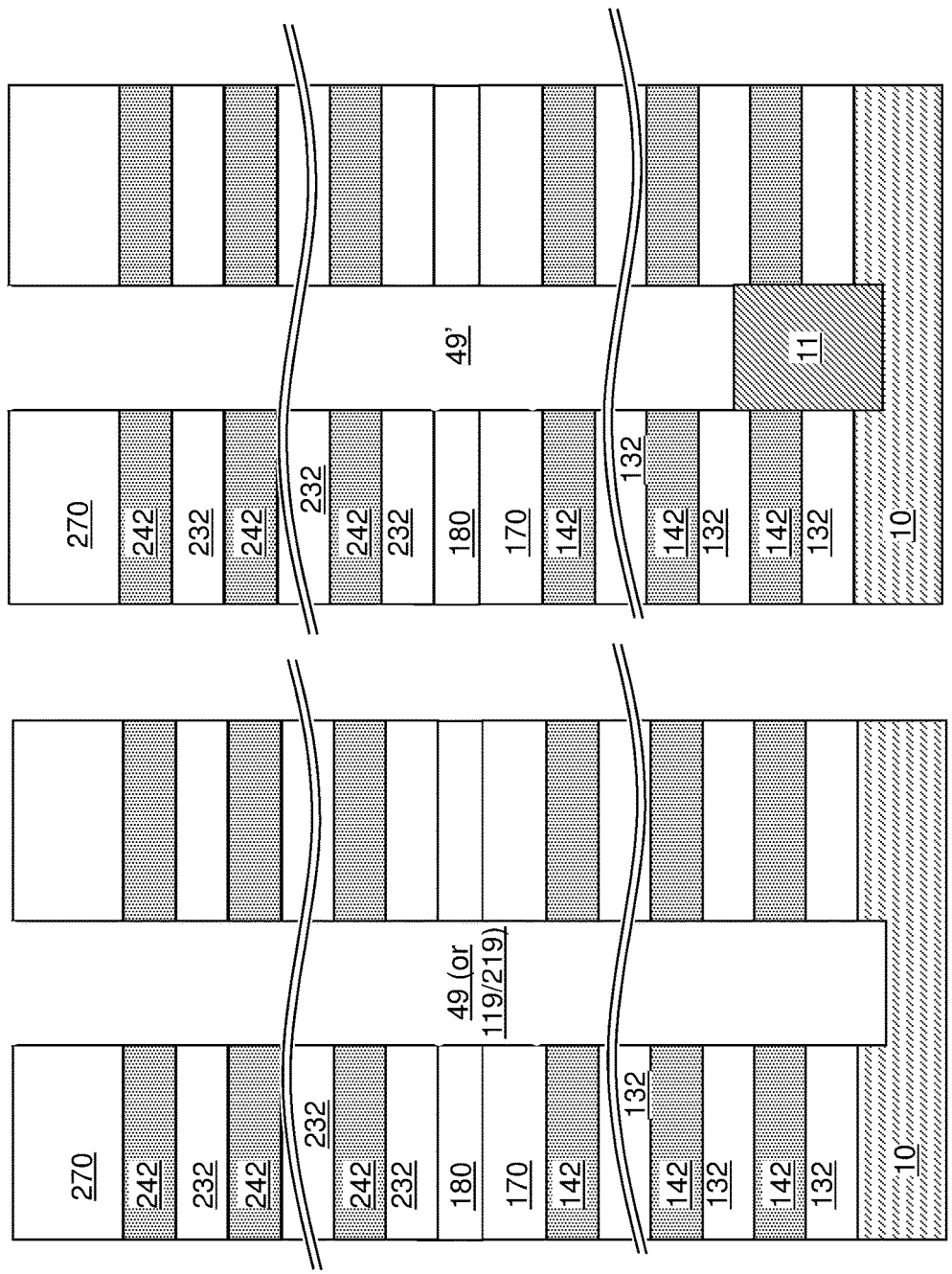

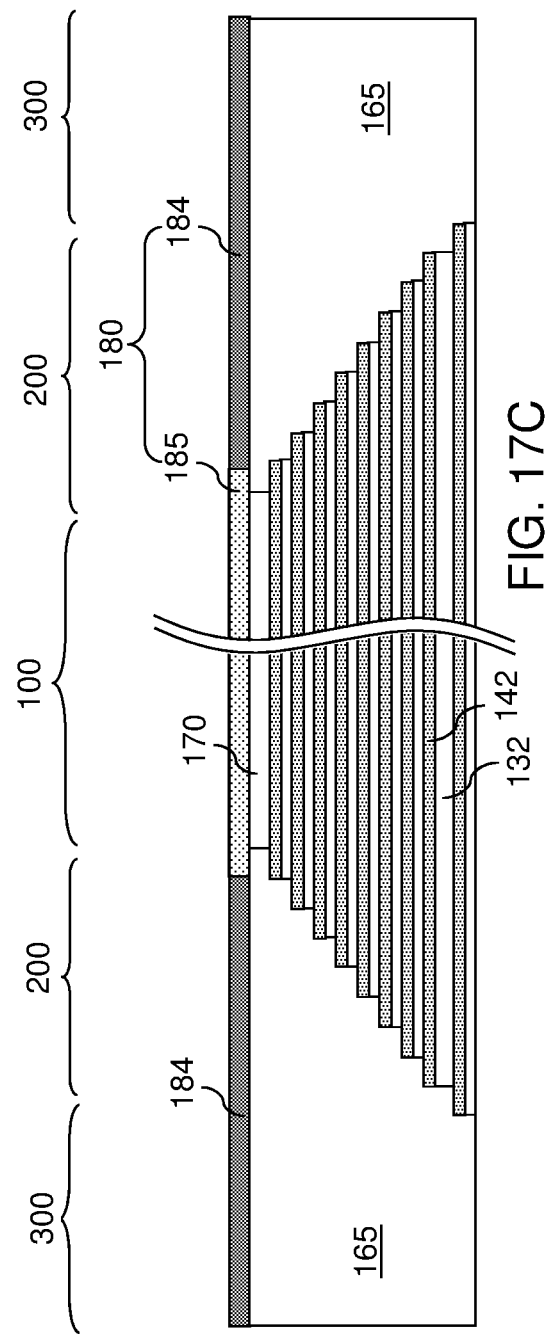

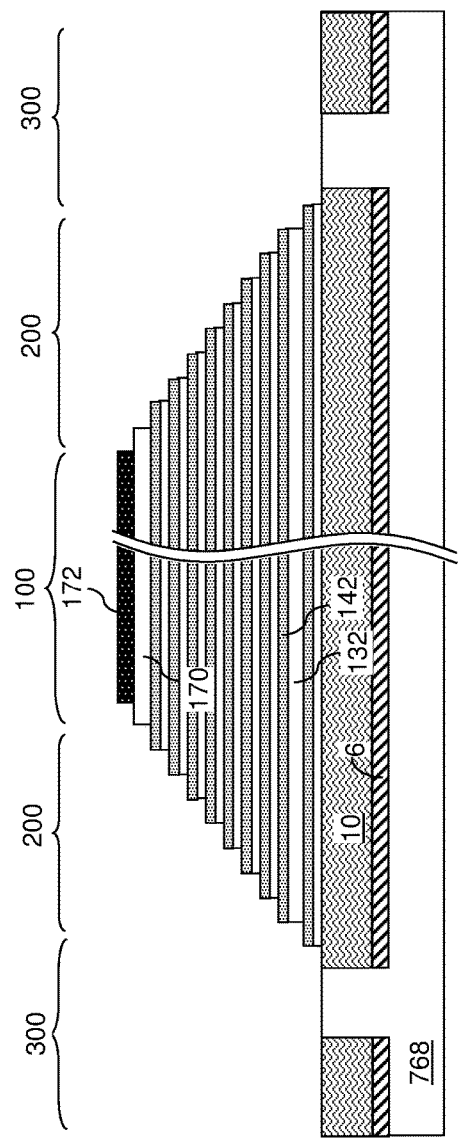
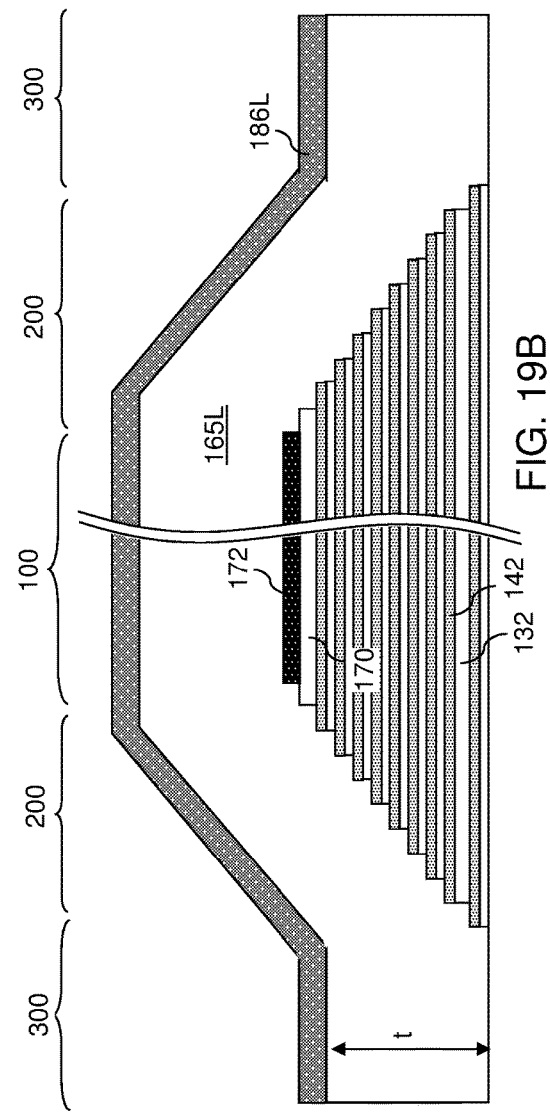

MULTI-TIER THREE-DIMENSIONAL MEMORY DEVICE WITH STRESS COMPENSATION STRUCTURES AND METHOD OF MAKING THEREOF

FIELD

The present disclosure relates generally to the field of semiconductor devices and specifically to stress compensation structures for a multi-tier three-dimensional memory device, and methods of making the same.

BACKGROUND

Recently, ultra high density storage devices have been proposed using a three-dimensional (3D) stacked memory stack structure sometimes referred to as Bit Cost Scalable (BiCS) architecture. For example, a 3D NAND stacked memory device can be formed from an array of an alternating stack of insulating materials and spacer material layers that are formed as electrically conductive layer or replaced with electrically conductive layers. Memory openings are formed through the alternating stack, and are filled with memory stack structures, each of which includes a vertical stack of memory elements and a vertical semiconductor channel. A memory-level assembly including the alternating stack and the memory stack structures is formed over a substrate. The electrically conductive layers can function as word lines of a 3D NAND stacked memory device, and bit lines overlying an array of memory stack structures can be connected to drain-side ends of the vertical semiconductor channels.

SUMMARY

According to an aspect of the present disclosure, a semiconductor structure is provided, which comprises: a first-tier alternating stack of first insulating layers and first electrically conductive layers located over a substrate, wherein the first-tier alternating stack comprises a first terrace region; memory stack structures extending through the first-tier alternating stack, wherein each of the memory stack structures comprises a vertical semiconductor channel and a memory film; a first retro-stepped dielectric material portion comprising a compressive-stress-generating dielectric material, contacting stepped surfaces of the first terrace region, and laterally surrounding the first-tier alternating stack; and a patterned tensile-stress-generating material layer overlying the first retro-stepped dielectric material portion, laterally spaced outward from an outer periphery of a topmost layer within the first-tier alternating stack, and applying a tensile stress to the first retro-stepped dielectric material portion and to the first-tier alternating stack.

According to another aspect of the present disclosure, a method of forming a semiconductor structure is provided. A first-tier alternating stack of first insulating layers and first spacer material layers is formed over a substrate, wherein the first spacer material layers are formed as, or are subsequently replaced with, first electrically conductive layers. The first-tier alternating stack is patterned to form a first terrace region. A first retro-stepped dielectric material portion comprising a compressive-stress-generating dielectric material is formed on stepped surfaces of the first terrace region, wherein the first retro-stepped dielectric material portion laterally surrounds the first-tier alternating stack. Memory stack structures are formed through the first-tier alternating stack, wherein each of the memory stack structures comprises a vertical semiconductor channel and a memory film. A patterned tensile-stress-generating material layer is formed over the first retro-stepped dielectric material portion in a region that is laterally spaced outward from an outer periphery of a topmost layer within the first-tier alternating stack, wherein the patterned tensile-stress-generating material layer applies a tensile stress to the first retro-stepped dielectric material portion and to the first-tier alternating stack.

BRIEF DESCRIPTION OF THE DRAWINGS

FIG. 3B is a plan view of the first exemplary structure of FIG. 3A. The vertical cross-sectional plane A-A' corresponds the plane of the vertical cross-sectional view of FIG. 3A. The vertical cross-sectional plane C-C' corresponds to the plane of the vertical cross-sectional view of FIG. 3C.

FIG. 3C is a vertical cross-sectional view of the first exemplary structure of FIGS. 3A and 3B along the vertical cross-sectional plane C-C' of FIG. 3B.

FIG. 4D is a vertical cross-sectional view of a first alternative configuration of the first exemplary structure after formation of a patterned tensile-stress-generating material layer according to the first embodiment of the present disclosure.

FIG. 4E is a vertical cross-sections view of a second alternative configuration of the first exemplary structure after formation of a patterned tensile-stress-generating material layer according to the first embodiment of the present disclosure.

FIG. 10B is a horizontal cross-sectional view of the first exemplary structure along the horizontal plane B-B' in FIG. 10A. The zig-zag vertical plane A-A' corresponds to the plane of the vertical cross-sectional view of FIG. 10A.

FIGS. 12A-12H are sequential vertical cross-sectional views of an inter-tier memory opening during formation of a pillar channel portion, a memory stack structure, a dielectric core, and a drain region according to the first embodiment of the present disclosure.

FIGS. 17A-17C are sequential vertical cross-sectional views of a second exemplary structure during formation of a second exemplary patterned tensile-stress-generating material layer according to a second embodiment of the present disclosure.

FIGS. 19A-19E are sequential vertical cross-sectional views of a third exemplary structure during formation of a third exemplary patterned tensile-stress-generating material layer according to a third embodiment of the present disclosure.

DETAILED DESCRIPTION

Figure 1:
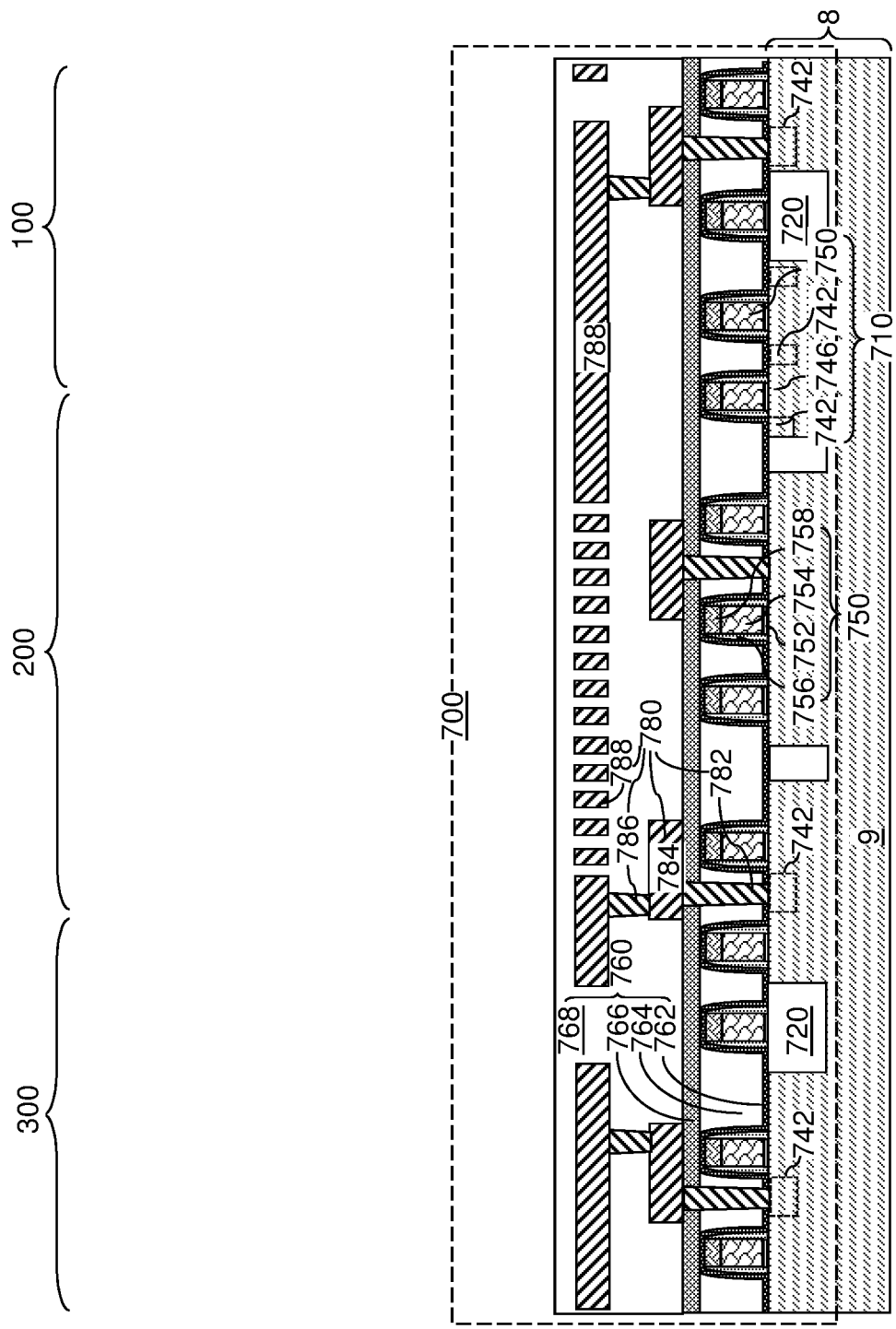
FIG. 1 is a vertical cross-sectional view of a first exemplary structure after formation of semiconductor devices, at least one lower level dielectric layer, and lower level metal interconnect structures on a semiconductor substrate according to a first embodiment of the present disclosure.

Three-dimensional memory devices include many stress-generating elements. For example, dielectric materials laterally surrounding stepped surfaces of an alternating stack of insulating layers and electrically conductive layers can generate a height-dependent stress, which can tilt memory stack structures within the alternating stack and cause alignment problems for additional alternating stack to be subsequently formed. Embodiments of the present disclosure provide a structure and method for controlling stress and strain in multi-tier three-dimensional memory device.

As discussed above, the present disclosure is directed to three-dimensional non-volatile memory devices, such as vertical NAND strings and other three-dimensional devices, and methods of making the same, the various aspects of which are described below. The embodiments of the disclosure can be employed to form various semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise.

Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between or at a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-memory-level" element refers to an element that vertically extends through a memory level.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The substrate may include integrated circuits fabricated thereon, such as driver circuits for a memory device The various three dimensional memory devices of the present disclosure include a monolithic three-dimensional NAND string memory device, and can be fabricated employing the various embodiments described herein. The monolithic three dimensional NAND string is located in a monolithic, three dimensional array of NAND strings located over the substrate. At least one memory cell in the first device level of the three dimensional array of NAND strings is located over another memory cell in the second device level of the three dimensional array of NAND strings.

Referring to FIG. 1, a first exemplary structure according to a first embodiment of the present disclosure is illustrated. The first exemplary structure includes a semiconductor substrate 8, and peripheral devices 700 including semiconductor devices 710 formed thereupon. The semiconductor substrate 8 includes a substrate semiconductor layer 9 at least at an upper portion thereof. Shallow trench isolation structures 720 can be formed in an upper portion of the substrate semiconductor layer 9 to provide electrical isolation among the semiconductor devices. The semiconductor devices 710 can include, for example, field effect transistors including respective transistor active regions 742 (i.e., source regions and drain regions), channel regions 746 and gate structures 750. The field effect transistors may be arranged in a CMOS configuration. Each gate structure 750 can include, for example, a gate dielectric 752, a gate electrode 754, a dielectric gate spacer 756 and a gate cap dielectric 758. The peripheral devices 700 including the semiconductor devices 710 can include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices 710 can include driver transistors arranged in a CMOS configuration which can function as word line switching devices for electrically biasing word lines of three-dimensional memory structures to be subsequently formed.

The semiconductor substrate 8 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The semiconductor substrate 8 can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface. In one embodiment, the semiconductor substrate 8 includes single crystalline silicon. In one embodiment, the substrate semiconductor layer 9 can be doped with electrical dopants, which may be p-type dopants or n-type dopants. The conductivity type of the doping of the substrate semiconductor layer 9 is herein referred to as a first conductivity type. The dopant concentration in the substrate semiconductor layer 9 can be in a range from $1.0 \times 10^{14}/cm^{3}$ to $1.0 \times 10^{17}/cm^{3}$, although lesser and greater dopant concentrations can also be employed. The substrate semiconductor layer 9 can be formed as a doped well implanted into the semiconductor substrate 8 or as a thin film deposited on the major surface 7 of the semiconductor substrate 8.

At least one dielectric layer is formed over the semiconductor devices, which is herein referred to as at least one lower level dielectric layer 760. The at least one lower level dielectric layer 760 can include, for example, a dielectric liner 762 such as a silicon nitride liner that blocks diffusion of mobile ions and/or apply appropriate stress to underlying structures, a planarization dielectric layer 764 that is employed to provide a planar surface that is coplanar with the topmost surface of the dielectric liner 762 or the topmost surfaces of the gate structures 750, an optional planar liner 766, and at least one lower level interconnect dielectric layer 768 that collectively functions as a matrix for lower level metal interconnect structures 780 that provide electrical wiring among the various nodes of the semiconductor devices and landing pads for through-memory-level via structures to be subsequently formed. The lower level metal interconnect structures 780 can include various device contact via structures 782 (e.g., source and drain electrodes which contact the respective source and drain nodes of the device or gate electrode contacts), lower level metal lines 784, lower level via structures 786, and lower level topmost metal structures 788 that are configured to function as landing pads for through-memory-level via structures to be subsequently formed. A peripheral device region 300 containing peripheral devices 700 including the semiconductor devices 710 and the combination of the at least one lower level dielectric layer 760 and the lower level metal interconnect structures 780 can be located around or to the side of a memory-level assembly (e.g., memory array region 100) to be subsequently formed. Alternatively, at least part of the peripheral devices 700 can also be located underneath a memory-level assembly (e.g., the memory array region 100) to be subsequently formed, in addition to the peripheral device region 300. The lower level metal interconnect structures 780 are embedded in the at least one lower level dielectric layer 760. In one embodiment, the topmost surfaces of the lower level topmost metal structures 788 may be located at or below a horizontal plane including the topmost surface of the at least one lower level dielectric layer 760.

The lower level metal interconnect structures 780 can be electrically shorted to active nodes (e.g., transistor active regions 742 or gate electrodes 750) of the semiconductor devices 710 (e.g., CMOS devices), and are located at the level of the at least one lower level dielectric layer 760. Only a subset of the active nodes is illustrated in FIG. 1 for clarity. Through-memory-level via structures (not shown in FIG. 1) can be subsequently formed directly on the lower level metal interconnect structures 780 to provide electrical connection to memory devices to be subsequently formed. In one embodiment, the pattern of the lower level metal interconnect structures 780 can be selected such that the lower level topmost metal structures 788 (which are a subset of the lower level metal interconnect structures 780 located at the topmost portion of the lower level metal interconnect structures 780) can provide landing pad structures for the through-memory-level via structures to be subsequently formed.

Figure 2:
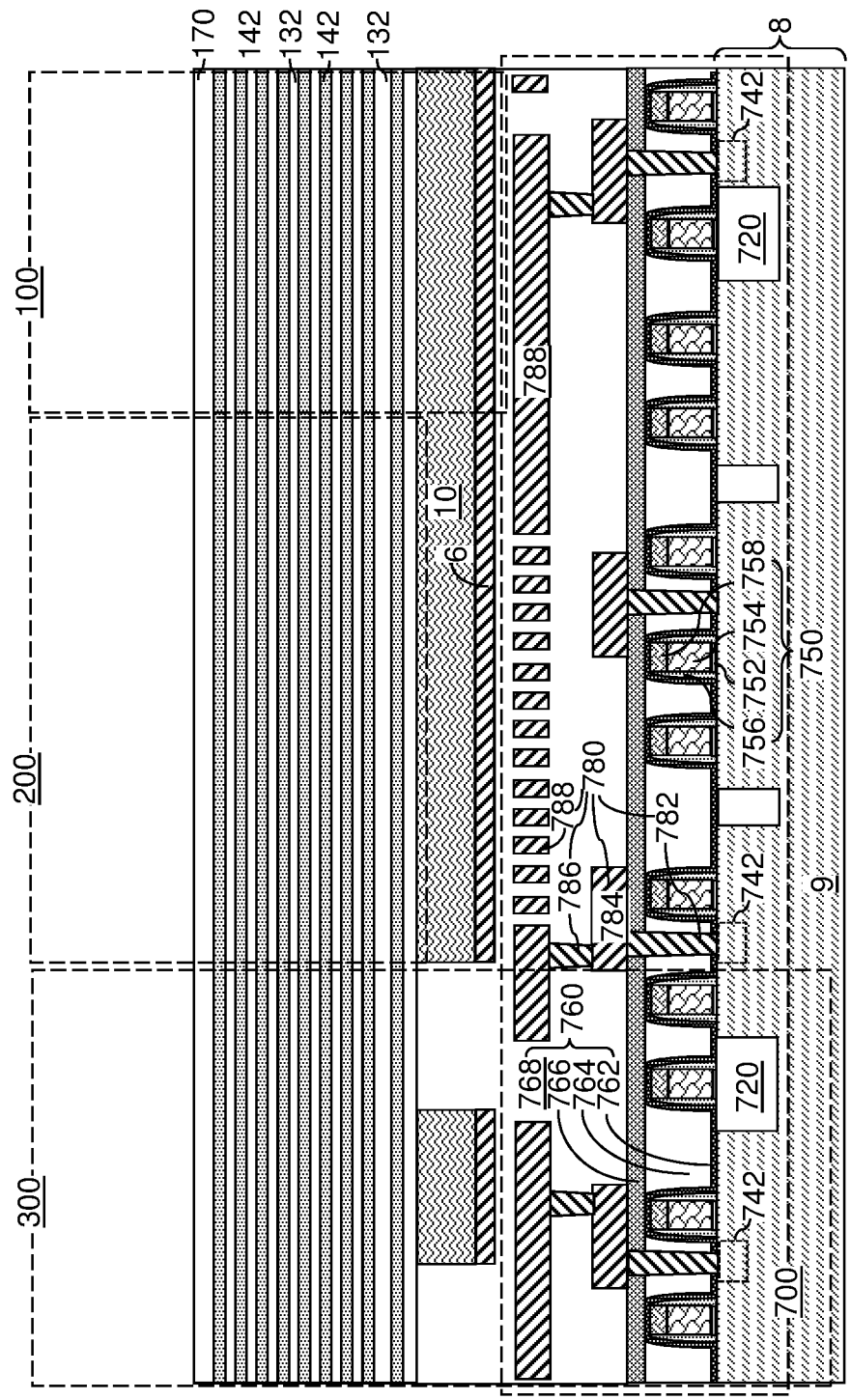
FIG. 2 is a vertical cross-sectional view of the first exemplary structure after formation of a planar semiconductor material layer and a first-tier alternating stack of first insulting layers and first spacer material layers according to the first embodiment of the present disclosure.

Referring to FIG. 2, an optional planar conductive material layer 6 and a planar semiconductor material layer 10 can be formed over the substrate and over any optional underlying peripheral devices 700 (if any are present outside the peripheral device region 300). The optional planar conductive material layer 6 includes a conductive material such as a metal or a heavily doped semiconductor material. The optional planar conductive material layer 6, for example, may include a tungsten layer having a thickness in a range from 3 nm to 100 nm, although lesser and greater thicknesses can also be employed. A metal nitride layer (not shown) may be provided as a diffusion barrier layer on top of the planar conductive material layer 6. Layer 6 may function as a special source line in the completed device. Alternatively, layer 6 may comprise an etch stop layer and may comprise any suitable conductive, semiconductor or insulating layer.

The planar semiconductor material layer 10 can be formed over the at least one lower level dielectric layer 760. The planar semiconductor material layer 10 includes a semiconductor material, which can include at least one elemental semiconductor material, at least one III-V compound semiconductor material, at least one II-VI compound semiconductor material, at least one organic semiconductor material, and/or other semiconductor materials known in the art. In one embodiment, the planar semiconductor material layer 10 can include a polycrystalline semiconductor material (such as polysilicon), or an amorphous semiconductor material (such as amorphous silicon) that is converted into a polycrystalline semiconductor material in a subsequent processing step (such as an anneal step). The planar semiconductor material layer 10 can be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 9). In one embodiment, the planar semiconductor material layer 10 or portions thereof can be doped with electrical dopants, which may be p-type dopants or n-type dopants. The conductivity type of the dopants in the planar semiconductor material layer 10 is herein referred to as a first conductivity type. A dielectric pad layer 52 can be formed on the top surface of the planar semiconductor material layer 10.

An alternating stack of first material layers and second material layers is subsequently formed. Each first material layer can include a first material, and each second material layer can include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack can include first insulting layers 132 as the first material layers, and first spacer material layers as the second material layers. In one embodiment, the first spacer material layers can be sacrificial material layers that are subsequently replaced with electrically conductive layers. In another embodiment, the first spacer material layers can be electrically conductive layers that are not subsequently replaced with other layers. While the present disclosure is described employing embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the planar semiconductor material layer 10. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first-tier alternating stack (132, 142) can have a uniform thickness that is substantially invariant within each respective first sacrificial material layer 142.

A first insulating cap layer 170 is subsequently formed over the stack (132, 142). The first insulating cap layer 170 includes a dielectric material, which can be any dielectric material that can be employed for the first insulating layers 132. In one embodiment, the first insulating cap layer 170 includes the same dielectric material as the first insulating layers 132. The thickness of the insulating cap layer 170 can be in a range from 20 nm to 300 nm, although lesser and greater thicknesses can also be employed.

Figure 3A:
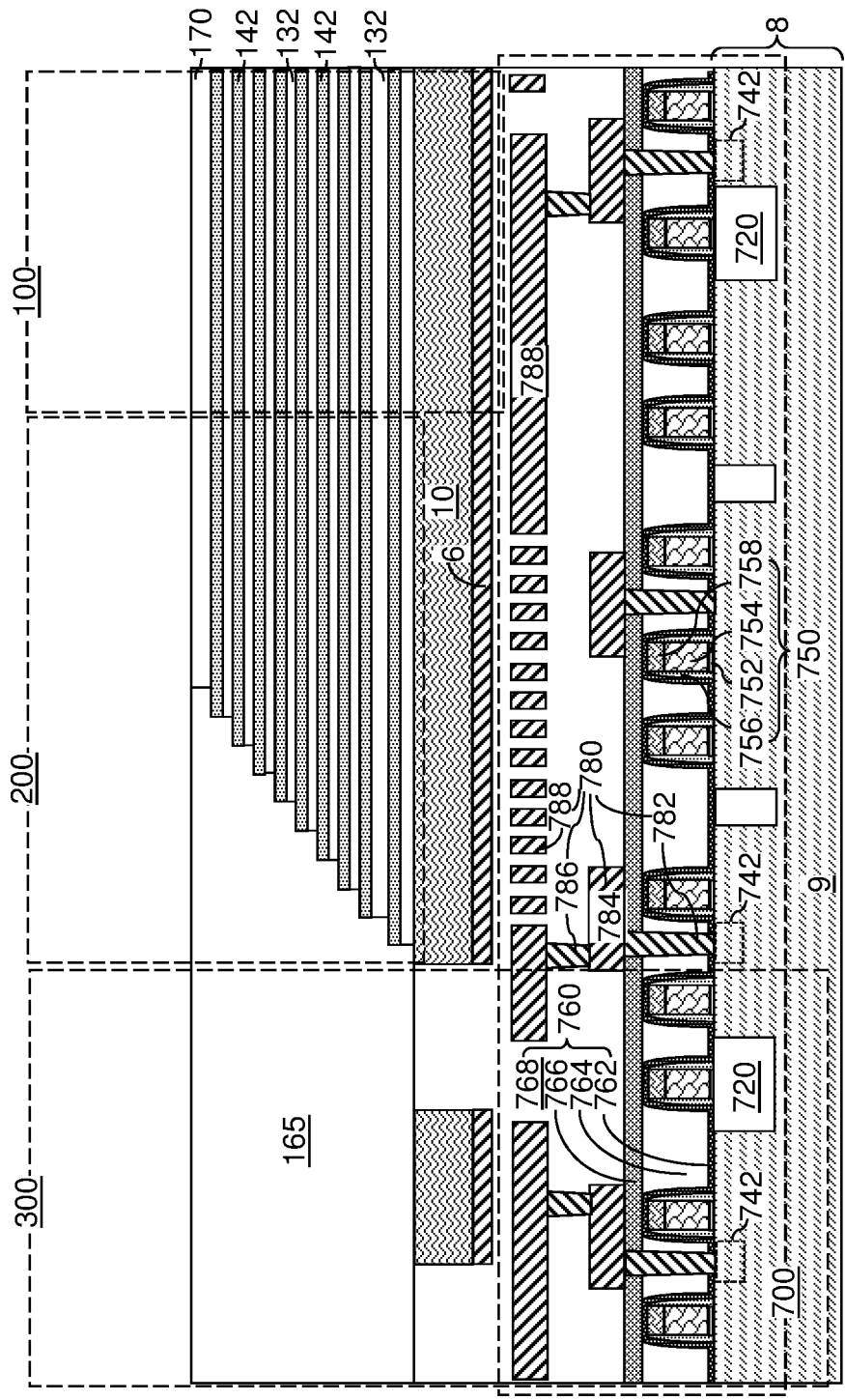
FIG. 3A is a vertical cross-sectional view of the first exemplary structure after patterning first-tier staircase regions on the first-tier alternating stack and forming a first-tier retro-stepped dielectric material portion according to the first embodiment of the present disclosure.

Referring to FIGS. 3A-3C, the first insulating cap layer 170 and the first-tier alternating stack (132, 142) can be patterned to form first stepped surfaces around each memory array region 100. In one embodiment, the first stepped surfaces can be formed at least one two sides of each memory array region 100. In one embodiment, each memory array region 100 can be a memory plane containing an array of memory devices, such as vertical NAND strings. For example, there may be two memory planes 100 over the substrate surrounded by the stepped surfaces containing a word line contact via region 200 and optional dummy stepped surfaces which lack word line contact vias, as shown in FIG. 3B. The stepped surfaces are surrounded by the peripheral device region 300, as shown in FIG. 3B. In one embodiment, the first stepped surfaces may laterally surround each of the memory array regions 100. The word line contact via region 200 can include a respective first stepped area including the first stepped surfaces, and a second stepped area in which additional stepped surfaces are to be subsequently formed in a second tier structure (to be subsequently formed over a first tier structure) and/or additional tier structures. Thus, in case multiple tier structures are employed, the memory array regions 100 may be laterally offset from the top periphery of the first stepped surfaces.

The first stepped surfaces can be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. A dielectric material can be deposited to fill the first stepped cavity, and can be planarized, to form a first-tier retro-stepped dielectric material portion, or a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The planarization of the dielectric material can be performed by chemical mechanical planarization (CMP). In one embodiment, the top surface of the first retro-stepped dielectric material portion 165 can be coplanar with the top surface of the first insulating cap layer 170. The first-tier alternating stack (132, 142) and the first-tier retro-stepped dielectric material portion 165 collectively constitute a first tier structure, which is an in-process structure that is subsequently modified.

Generally, materials have intrinsic stress, which is applied to surrounding elements. Such stress applied to surrounding elements can be compressive or tensile. If a material applies compressive stress to adjoining material portions, such as material is herein referred to as a "compressive-stress-generating" material, or a "compressive stress material." If a material applies tensile stress to adjoining material portions, such as material is herein referred to as a "tensile-stress-generating" material, or a "tensile stress material." In one embodiment, the first retro-stepped dielectric material portion 165 can include a compressive-stress-generating dielectric material such as silicon oxide formed by decomposition of tetraethylorthosilicate (TEOS) as a silicon dioxide precursor, i.e., a "TEOS oxide." The TEOS oxide can generate compressive stress, of which the magnitude varies depending on the deposition conditions. Typically, the TEOS oxide can generate compressive stress in a range from 20 MPa to 200 MPa, although lesser and greater compressive stress can also be generated.

TEOS oxides include residual carbon at an atomic concentration of at least 10 parts per million, and typically at least 100 parts per million. In one embodiment, the first retro-stepped dielectric material portion 165 includes a TEOS based silicon oxide material including carbon at an atomic concentration of at least 10 parts per million over the first terrace region and over a topmost surface of the first-tier alternating stack by plasma enhanced chemical vapor deposition (PECVD) or low pressure chemical vapor deposition (LPCVD) process. The planarization process can remove portions of the TEOS based silicon oxide material from above a horizontal plane including the top surface of the first insulating cap layer 170. The remaining portion of the TEOS based silicon oxide material constitutes the first retro-stepped dielectric material portion.

The first retro-stepped dielectric material portion 165 can laterally surround, and apply compressive stress to, each patterned portion of the first-tier alternating stack (132, 142). Because the area of the first retro-stepped dielectric material portion 165 increases with distance from the substrate 8, the magnitude of the compressive stress applied to the first-tier alternating stack (132, 142) increases with distance from the substrate 8, which can cause tilting of memory openings that are formed through the first-tier alternating stacks (132, 142) in subsequent processing steps.

Figure 4A:
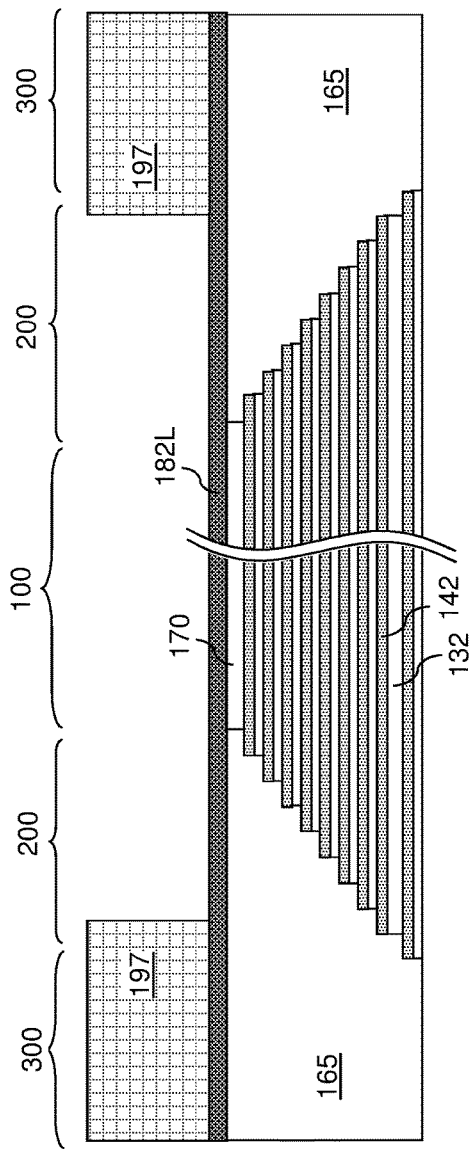
FIGS. 4A-4C are sequential vertical cross-sectional views of the first exemplary structure during formation of a first exemplary patterned tensile-stress-generating material layer according to the first embodiment of the present disclosure.

Referring to FIG. 4A, a continuous tensile-stress-generating material layer 182L is deposited on the top surfaces of the first insulating cap layer 170 and the first retro-stepped dielectric material portion 165. Layer 182L can include any material that applies tensile stress, such as an insulating, semiconductor or conductive material. For example, the tensile-stress-generating material layer 182L can be a silicon nitride layer or a tungsten layer. In the following embodiment, a continuous silicon nitride layer is used as an exemplary continuous tensile-stress-generating material layer 182L. Generally, the stress that a silicon nitride material applies to adjoining materials can be in a range from a tensile stress of about 1.8 GPa to a compressive stress of about 3.0 GPa depending on the deposition conditions (and the compositional change that occurs as a result) and post-deposition treatment. According to an embodiment of the present disclosure, the silicon nitride material for the continuous silicon nitride layer 182L can be deposited under a condition that induces formation of a tensile silicon nitride material, i.e., a silicon nitride material that applies tensile stress to adjoining material portions. For example, a tensile silicon nitride material can be deposited by low pressure chemical vapor deposition or by plasma enhanced chemical vapor deposition under process conditions that is conductive to formation of stretched silicon-nitrogen bonds and minimizes hydrogen incorporation. For example, atomic concentration of hydrogen less than 15% is preferable. In one embodiment, the magnitude of the tensile stress applied by the continuous silicon nitride layer 182L to adjoining material portions (e.g., the first retro-stepped dielectric material portion 165) can be in a range from 0.1 GPa to 1.8 GPa, such as from 0.5 GPa to 1.5 GPa, although lesser and greater magnitudes of the tensile stress can also be employed. In one embodiment, the continuous silicon nitride layer 182L can be deposited by plasma enhanced chemical vapor deposition (PECVD), and can have a thickness in a range from 10 nm to 300 nm, such as from 30 nm to 100 nm, although lesser and greater thicknesses can also be employed.

A portion of the continuous silicon nitride layer 182L overlying the area of the first retro-stepped dielectric material portion 165 can be masked with an oxidation mask layer 197. In one embodiment, the oxidation mask layer 197 includes at least one continuous closed inner periphery defined by a respective opening within the oxidation mask layer 197. The area of each opening includes the entire memory array region (e.g., memory plane) 100 area which includes the first insulating cap layer 170 that overlies a first-tier alternating stack (132, 142) of first insulating layers 132 and the first sacrificial material layers 142. As used herein, a closed periphery refers to a periphery having a closed shape, i.e., a shape that separates the inside from the outside with an unbroken contour. Each closed periphery of the oxidation mask layer 197 is laterally offset outward from a periphery of a topmost layer in the first-tier alternating stack (132, 142). In one embodiment, the oxidation mask layer 197 can be a patterned hard mask layer that is impervious to oxidant gas to be subsequently employed. For example, the oxidation mask layer 197 can include a patterned metal nitride layer, such as a TiN layer. As used herein, a "patterned" element refers to an element that does not extend across the entire area of an underlying structure. A "patterned" element may be formed by lithographic patterning of a mask and transfer of a lithographic pattern by an etch process or by any other suitable method to make the patterned element extend across less than the entire area of an underlying structure. In contrast, a "blanket" element refers to an element that extends across the entire area of the underlying structure.

Figure 4B:
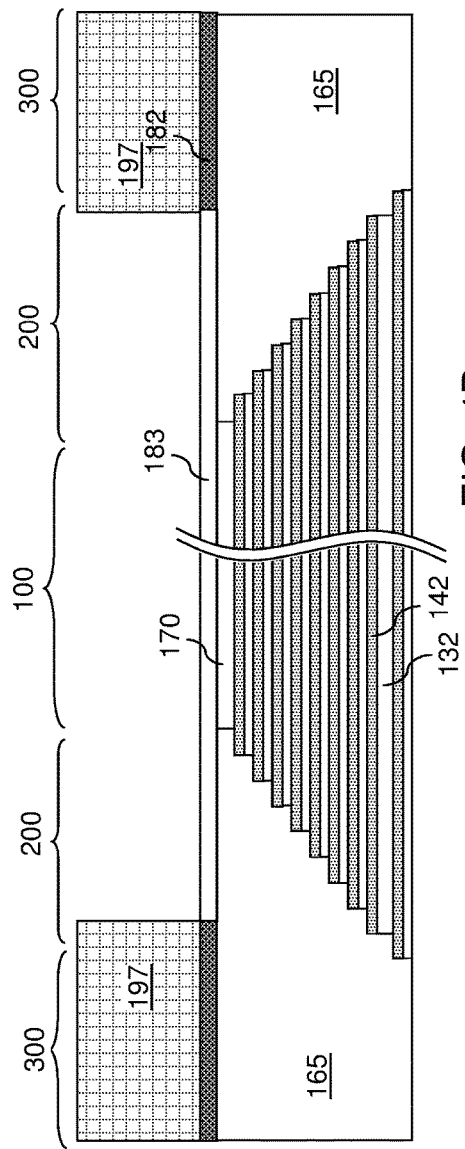

Referring to FIG. 4B, an oxidation process is performed to convert each unmasked portion of the continuous silicon nitride layer 182L located over the memory array region 100 into a material portion that applies less tensile stress to the underlying first-tier alternating stack (132, 142) than the continuous silicon nitride layer 182L, which is herein referred to as a dielectric material layer 183, (e.g., a patterned dielectric material layer). The continuous unconverted portion of the continuous silicon nitride layer 182L that underlies the oxidation mask layer 197 constitutes a patterned tensile-stress-generating material layer 182. In one embodiment, conversion of each unmasked portion of the continuous silicon nitride layer 182L into a respective patterned dielectric material layer 183 can be performed by thermal oxidation or plasma oxidation. Thus, the patterned tensile-stress-generating material layer 182 can be formed by depositing and patterning a tensile-stress-generating material such that the patterned tensile-stress-generating material layer 182 laterally surrounds an entire area of a topmost layer of each of the first-tier alternating stacks (132, 142) in the memory array region 100 as a single continuous material layer within openings therein. In one embodiment, the patterned dielectric material layer 183 comprises silicon oxide or silicon oxynitride; and a nitrogen concentration gradient is present near an interface between the patterned silicon nitride layer 182 and the patterned dielectric material layer 183 such that nitrogen concentration in the patterned dielectric material layer 183 decreases with distance from the interface.

In one embodiment, the patterned tensile-stress-generating material layer 182 can be also formed over the first retro-stepped dielectric material portion 165 in a peripheral portion of the word line contact via regions 200 (e.g., over the bottom steps but not the top steps in regions 200) that are laterally spaced outward from an outer periphery of the topmost layer within each first-tier alternating stack (132, 142) in the memory array region 100. The patterned tensile-stress-generating material layer 182 applies a tensile stress to the first retro-stepped dielectric material portion 165 and to the first-tier alternating stacks (132, 142). In one embodiment, the first retro-stepped dielectric material portion 165 can include a silicon oxide (such as a TEOS oxide) applying a compressive stress to adjoining regions, the patterned tensile-stress-generating material layer 182 can include silicon nitride applying a tensile stress to adjoining regions, and each of the patterned dielectric material layers 183 can include silicon oxide or silicon oxynitride that applies a compressive stress of a lesser magnitude that the magnitude of the tensile stress of the patterned tensile-stress-generating material layer 182.

In an alternative embodiment, another method may be used instead of selective oxidation of the portion of the continuous silicon nitride layer 182L to form the patterned tensile-stress-generating material layer 182. For example, layer 182L can comprise any suitable tensile-stress-generating material, such as tungsten or silicon nitride. The unmasked portion of layer 182L over the memory array region 100 (and optionally over the inner portions of the word line contact via region 200 adjacent to region 100) can be removed by etching to leave the portion of layer 182L covered by the mask 197 as the patterned tensile-stress-generating material layer 182 over the peripheral device regions 300 (and optionally over the outer/peripheral portion of the word line contact via region 200). The space left by the removed portion of layer 182L over the memory array region 100 is subsequently refilled by another material, such as a silicon oxide layer, followed by planarization.

Figure 4C:
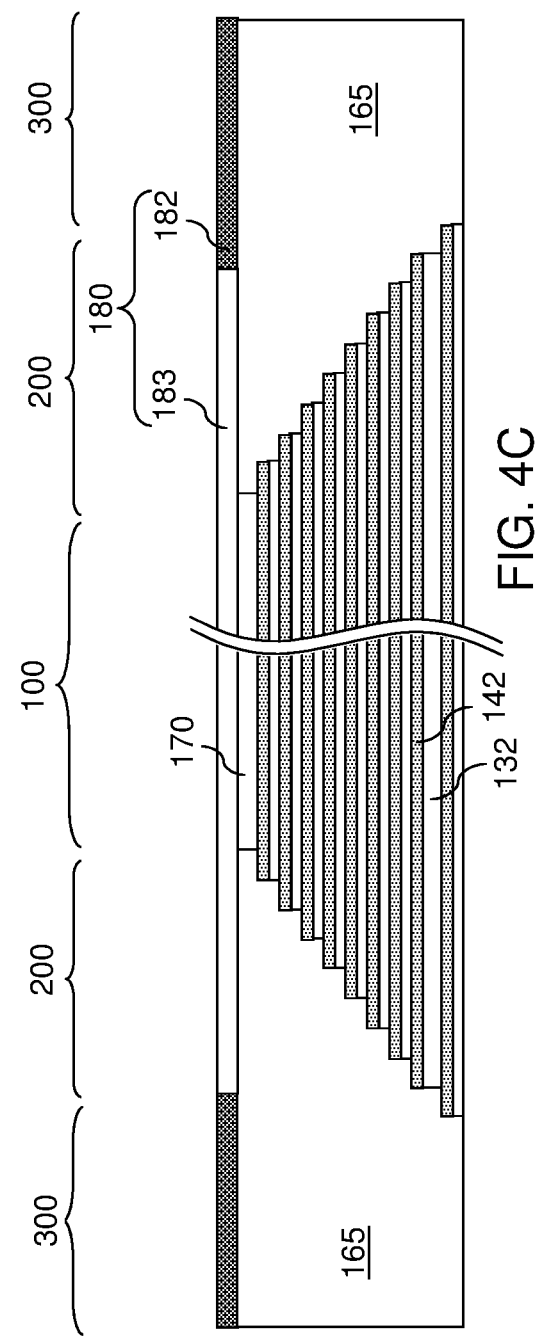

Referring to FIG. 4C, the oxidation mask layer 197 can be removed selective to the materials of the patterned tensile-stress-generating material layer 182 and the patterned dielectric material layers 183. If the oxidation mask layer 197 includes a metal nitride, a wet etch process that removes the material of the metal nitride selective to silicon nitride and silicon oxide can be employed to remove the oxidation mask layer 197. The patterned dielectric material layers 183 and the patterned tensile-stress-generating material layer 182 can complementarily cover the entire area of the first exemplary structure.

The patterned tensile-stress-generating material layer 182 may have the same or different thickness as patterned dielectric material layers 183 depending on the nature and duration of the oxidation process. FIG. 4D illustrates an alternative configuration in which the patterned tensile-stress-generating material layer 182 has a lesser thickness than the patterned dielectric material layers 183. FIG. 4E illustrates an alternative configuration in which the patterned tensile-stress-generating material layer 182 has a greater thickness than the patterned dielectric material layers 183. Alternatively, formation of the combination of the patterned tensile-stress-generating material layer 182 and the patterned dielectric material layers 183 may be formed by deposition of the material of the patterned tensile-stress-generating material layer 182 as a blanket material layer (i.e., a layer without any opening therein), patterning of openings through the blanket material layer to form the patterned tensile-stress-generating material layer 182, and deposition and planarization of the material of the patterned dielectric material layers 183 in the openings through the patterned tensile-stress-generating material layer 182 to form the patterned dielectric material layers 183. Yet alternatively, formation of the combination of the patterned tensile-stress-generating material layer 182 and the patterned dielectric material layers 183 may be formed by deposition of the material of the patterned dielectric material layers 183 as a blanket material layer (i.e., a layer without any opening therein), patterning of the blanket material layer into multiple discrete material portions to form the patterned dielectric material layers 183, and deposition and planarization of the material of the patterned tensile-stress-generating material layer 182 in the gaps among the patterned dielectric material layers 183 to form the patterned tensile-stress-generating material layer 182.

Figure 5:
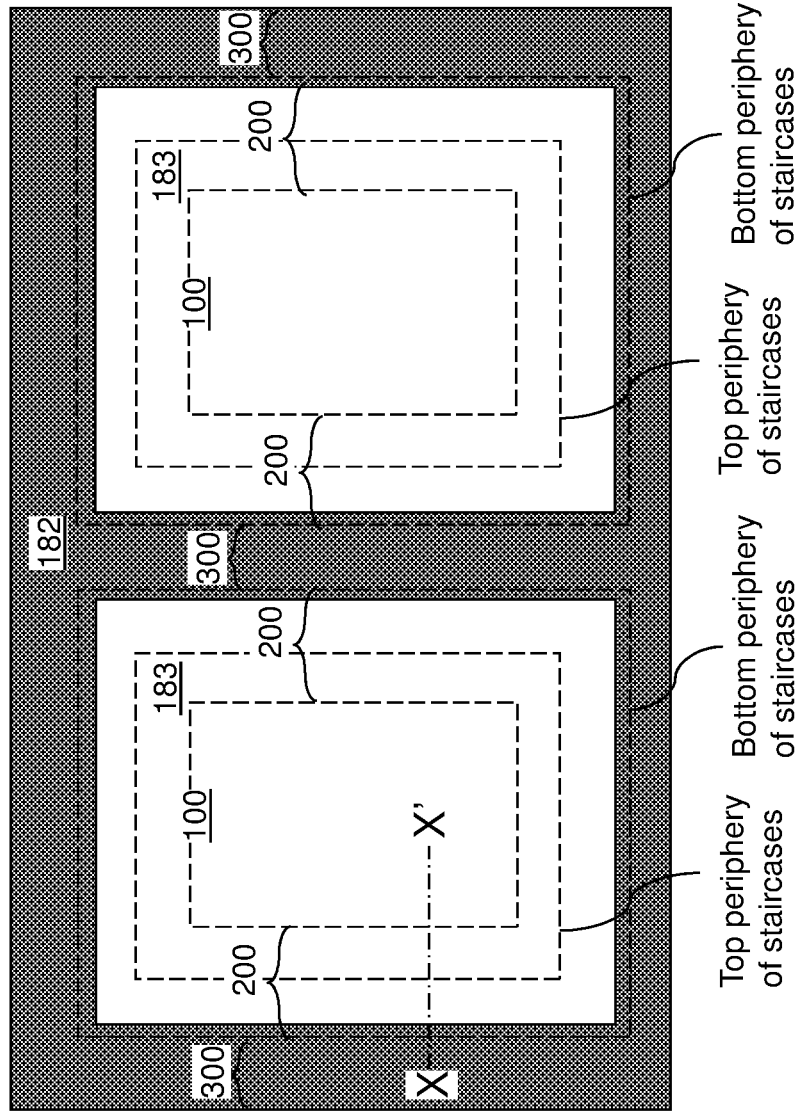
FIG. 5 is a plan view of the first exemplary structure after formation of the first exemplary patterned tensile-stress-generating material layer after removal of an oxidation mask layer according to the first embodiment of the present disclosure.
Figure 6:
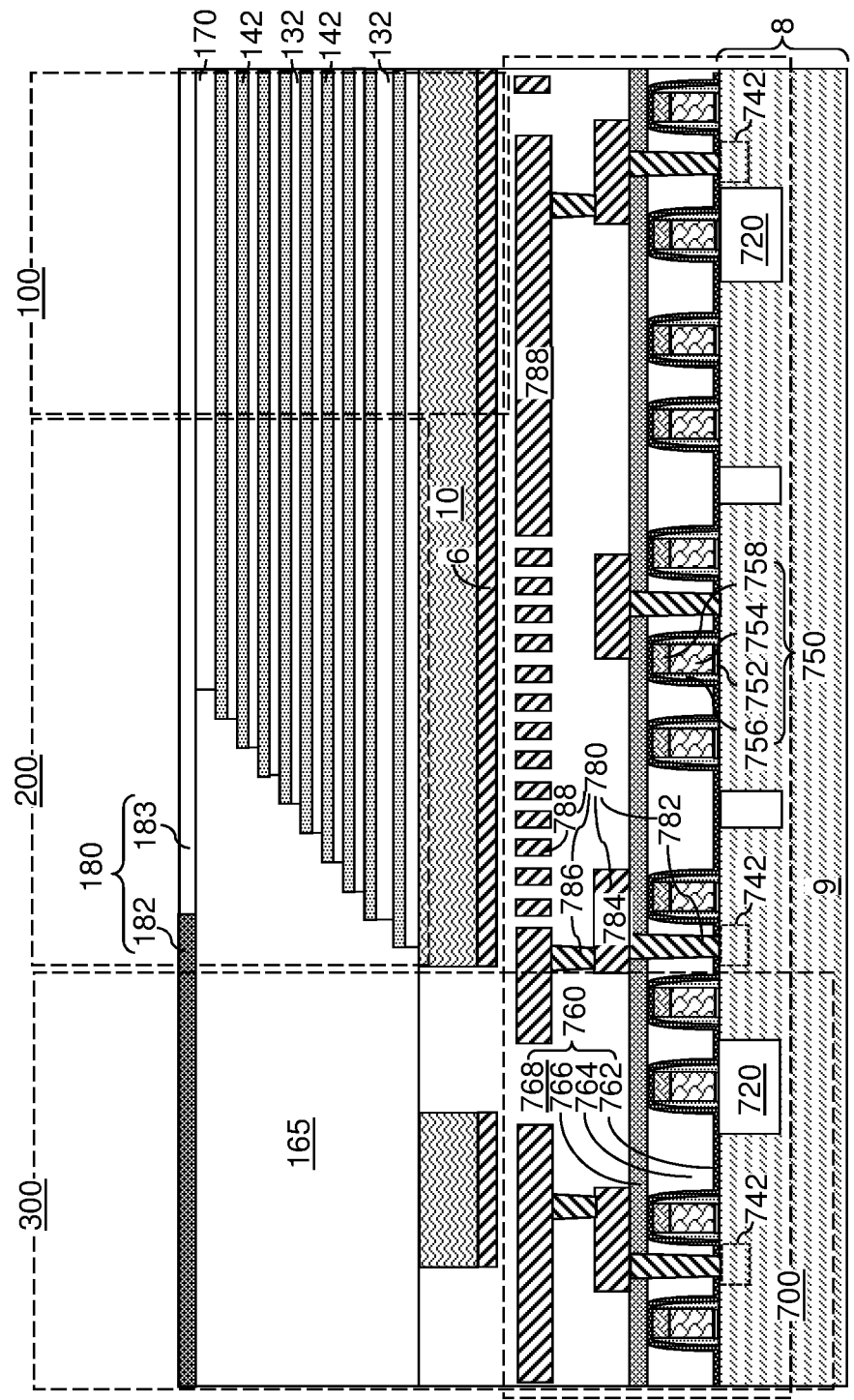
FIG. 6 is a vertical cross-sectional view of the first exemplary structure of FIG. 5.

FIG. 5 shows a top-down view of an exemplary layout of the patterned tensile-stress-generating material layer 182 and the patterned dielectric material layers 183 after removal of the oxidation mask layer 197. In one embodiment, the patterned dielectric material layers 183 extend partially into the peripheral/outer portions of the word line contact via regions 200 over the bottom steps but not over the top steps, as shown in FIG. 5. FIG. 6 shows a vertical cross-sectional view of the exemplary structure of FIG. 5 along the vertical plane X-X'. The patterned tensile-stress-generating material layer 182 and the patterned dielectric material layers 183 collectively constitute an inter-tier dielectric layer 180.

Figure 7A:
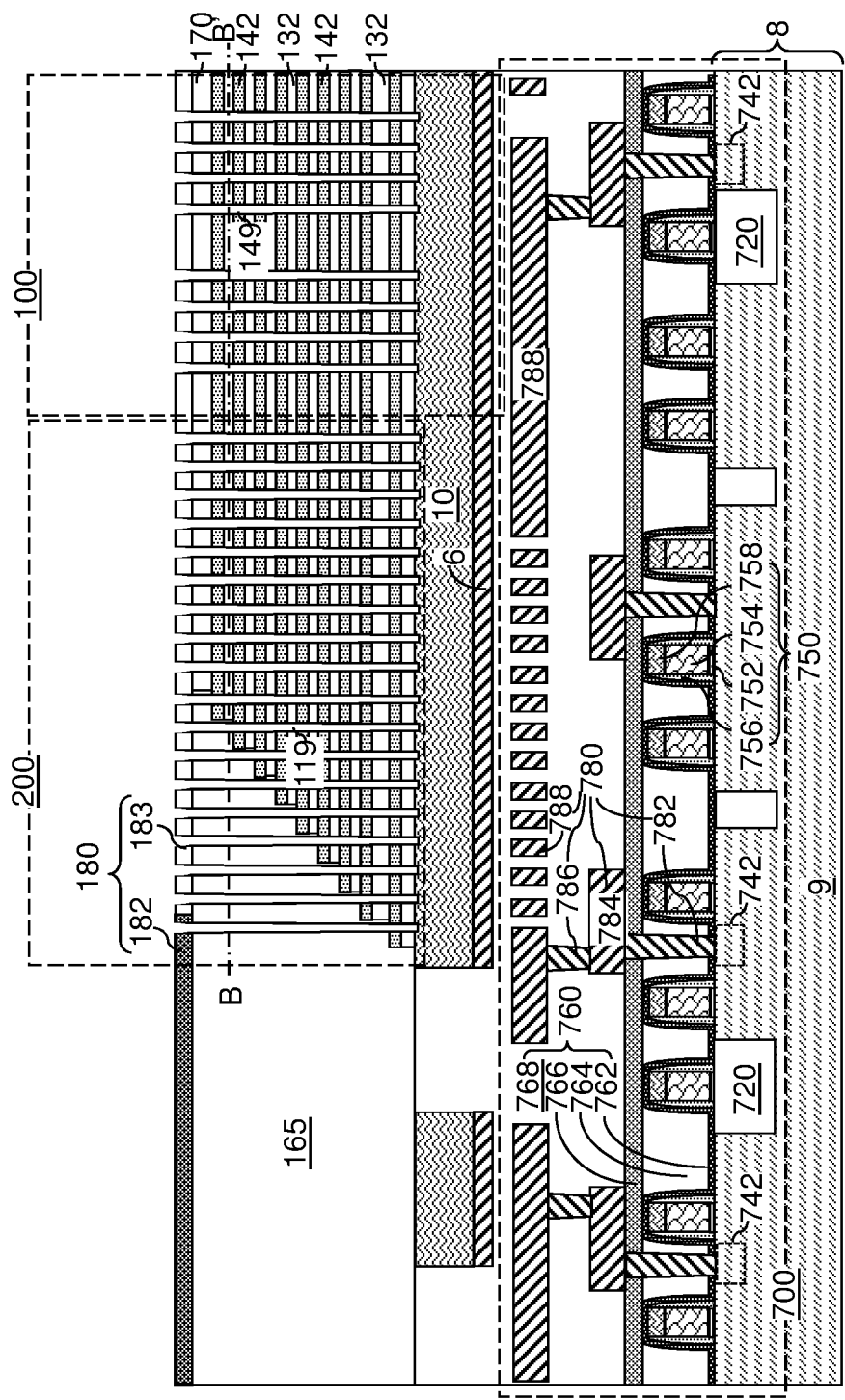
FIG. 7A is a vertical cross-sectional view of the first exemplary structure after formation of first-tier memory openings and first tier support openings according to the first embodiment of the present disclosure.
Figure 7B:
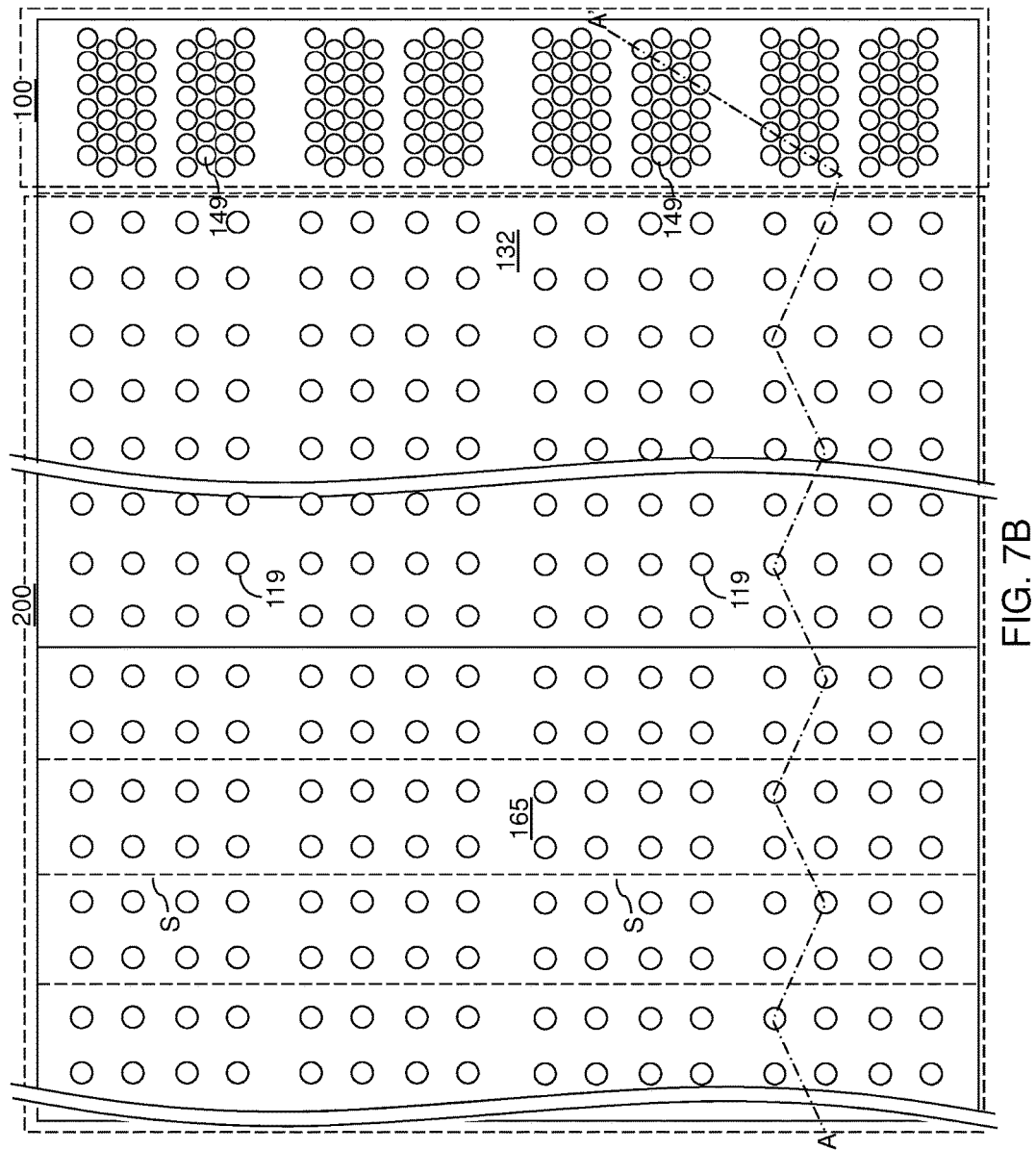
FIG. 7B is a horizontal cross-sectional view of the first exemplary structure along the horizontal plane B-B' in FIG. 7A. The zig-zag vertical plane A-A' corresponds to the plane of the vertical cross-sectional view of FIG. 7A.

Referring to FIGS. 7A and 7B, first-tier memory openings 149 and first tier support openings 119 can be formed. The first-tier memory openings 149 and the first-tier support openings 119 extend through the first-tier alternating stack (132, 142) at least to a top surface of the planar semiconductor material layer 10. The first-tier memory openings 149 can be formed in the memory array region 100 at locations at which memory stack structures including vertical stacks of memory elements are to be subsequently formed. The first-tier support openings 119 can be formed in the word line contact via region 200. For example, a lithographic material stack (not shown) including at least a photoresist layer can be formed over the inter-tier dielectric layer 180, and can be lithographically patterned to form openings within the lithographic material stack. The pattern in the lithographic material stack can be transferred through the inter-tier dielectric layer 180, the first insulating cap layer 170, the first retro-stepped dielectric material portion 165, and the first-tier alternating stacks (132, 142) by at least one anisotropic etch that employs the patterned lithographic material stack as an etch mask. Portions of the inter-tier dielectric layer 180, the first insulating cap layer 170, the first retro-stepped dielectric material portion 165, and the first-tier alternating stacks (132, 142) underlying the openings in the patterned lithographic material stack are etched to form the first-tier memory openings 149 and the first-tier support openings 119. In other words, the transfer of the pattern in the patterned lithographic material stack through the first insulating cap layer 170 and the first-tier alternating stack (132, 142) forms the first-tier memory openings 149 and the first-tier support openings 119.

In one embodiment, the chemistry of the anisotropic etch process employed to etch through the materials of the first-tier alternating stacks (132, 142) can alternate to optimize etching of the first and second materials in the first-tier alternating stack (132, 142). The anisotropic etch can be, for example, a series of reactive ion etches or a single etch (e.g., $CF_4/O_2/Ar$ etch). The sidewalls of the first-tier memory openings 149 and the support openings 119 can be substantially vertical, or can be tapered. Subsequently, the patterned lithographic material stack can be subsequently removed, for example, by ashing.

Figure 8:
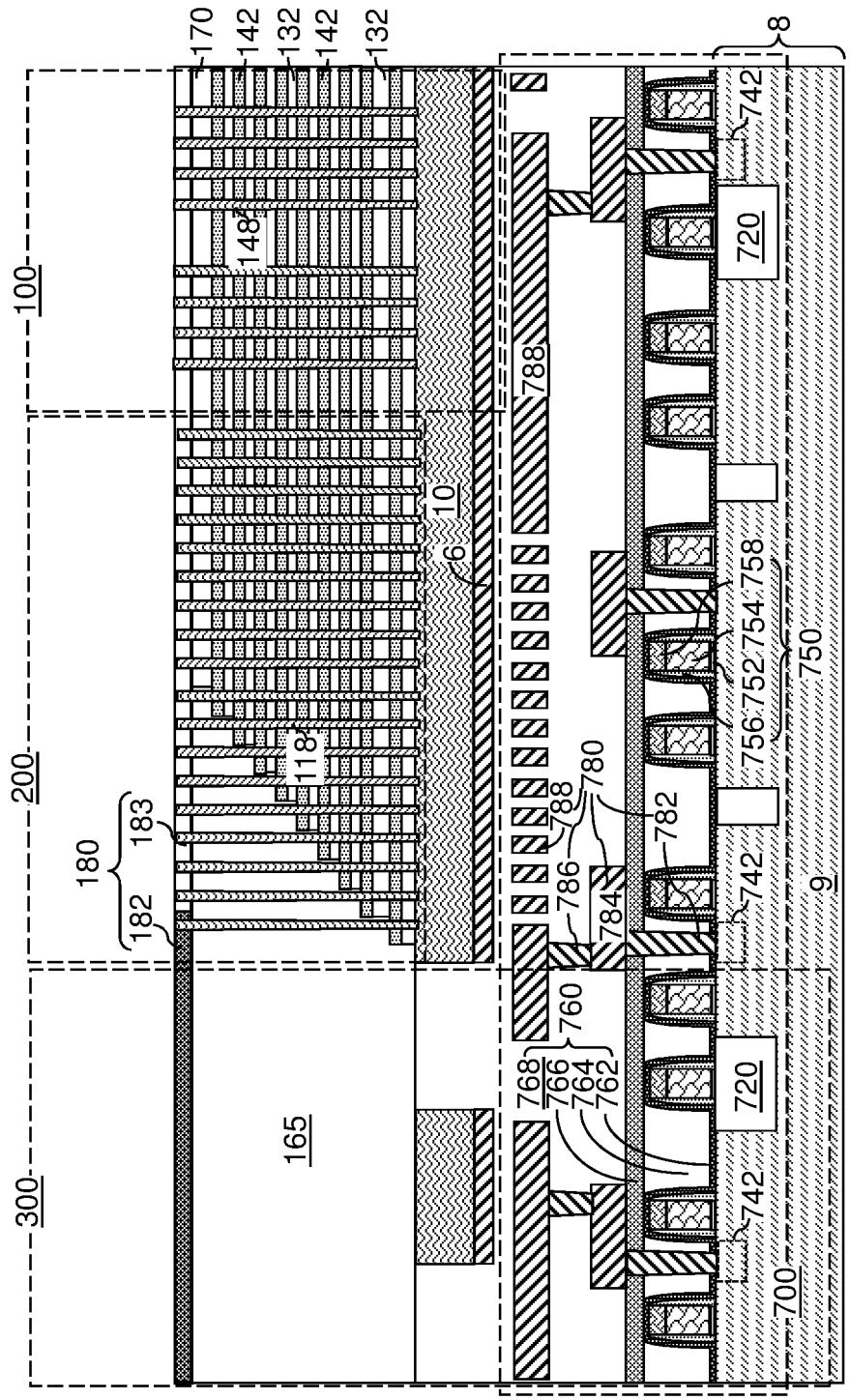
FIG. 8 is a vertical cross-sectional view of the first exemplary structure after formation of sacrificial memory opening fill structures and sacrificial support opening fill structures according to the first embodiment of the present disclosure.

Referring to FIG. 8, sacrificial memory opening fill portions 148 can be formed in the first-tier memory openings 149, and sacrificial support opening fill portions 118 can be formed in the first-tier support openings 119. For example, a sacrificial fill material layer is deposited in the first-tier memory openings 149 and the first-tier support openings 119. The sacrificial fill material layer includes a sacrificial material which can be subsequently removed selective to the materials of the first insulating layers 132 and the first sacrificial material layers 142. In one embodiment, the sacrificial fill material layer can include a semiconductor material such as silicon (e.g., a-Si or polysilicon), a silicon-germanium alloy, germanium, a III-V compound semiconductor material, or a combination thereof. Optionally, a thin etch stop layer (such as a silicon oxide layer having a thickness in a range from 1 nm to 3 nm) may be employed prior to depositing the sacrificial fill material layer. The sacrificial fill material layer may be formed by a non-conformal deposition or a conformal deposition method. In another embodiment, the sacrificial fill material layer can include amorphous silicon or a carbon-containing material (such as amorphous carbon or diamond-like carbon) that can be subsequently removed by ashing.

Portions of the deposited sacrificial material can be removed from above inter-tier dielectric layer 180. For example, the sacrificial fill material layer can be recessed to a top surface of the inter-tier dielectric layer 180 employing a planarization process. The planarization process can include a recess etch, chemical mechanical planarization (CMP), or a combination thereof. The top surface of the inter-tier dielectric layer 180 can be employed as an etch stop layer or a planarization stop layer. Each remaining portion of the sacrificial material in a first-tier memory opening 149 constitutes a sacrificial memory opening fill portion 148. Each remaining portion of the sacrificial material in a first-tier support opening 119 constitutes a sacrificial support opening fill portion 118. The top surfaces of the sacrificial memory opening fill portions 148 and the sacrificial support opening fill portions 118 can be coplanar with the top surface of the inter-tier dielectric layer 180. The sacrificial memory opening fill portion 148 and the sacrificial support opening fill portions 118 may, or may not, include cavities therein.

Figure 9:
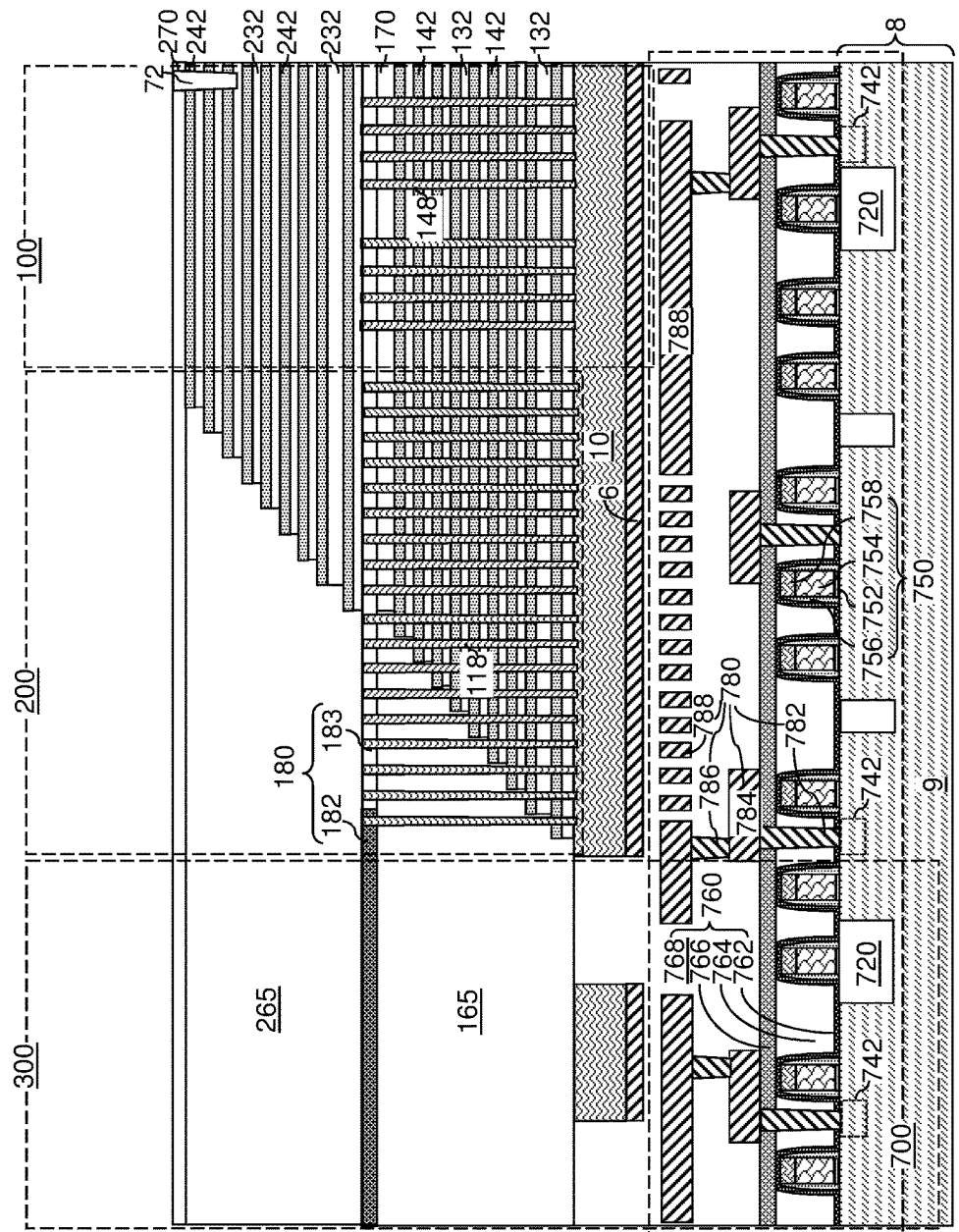
FIG. 9 is a vertical cross-sectional view of the first exemplary structure after formation of a second-tier alternating stack of second insulating layers and second spacer material layers, a second-tier retro-stepped dielectric material portion, and a second insulating cap layer according to the first embodiment of the present disclosure.

Referring to FIG. 9, a second tier structure can be formed over the first tier structure (132, 142, 170, 148, 118). The second tier structure can include an additional alternating stack of insulating layers and spacer material layers, which can be sacrificial material layers. For example, a second-tier alternating stack (232, 242) of material layers can be subsequently formed on the top surface of the first-tier alternating stack (132, 142). The second-tier alternating stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second-tier alternating stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second-tier alternating stack (232, 242) can have a uniform thickness that is substantially invariant within each respective second sacrificial material layer 242.

Second stepped surfaces in the second stepped area can be formed in the word line contact via region 200 employing a same set of processing steps as the processing steps employed to form the first stepped surfaces in the first stepped area with suitable adjustment to the pattern of at least one masking layer. A second-tier retro-stepped dielectric material portion 265 can be formed over the second stepped surfaces in the word line contact via region 200.

A second insulating cap layer 270 can be subsequently formed over the second-tier alternating stack (232, 242). The second insulating cap layer 270 includes a dielectric material that is different from the material of the second sacrificial material layers 242. In one embodiment, the second insulating cap layer 270 can include silicon oxide. In one embodiment, the first and second sacrificial material layers (142, 242) can comprise silicon nitride.

Generally speaking, at least one alternating stack of insulating layers (132, 232) and spacer material layers (such as sacrificial material layers (142, 242)) can be formed over the planar semiconductor material layer 10, and at least one retro-stepped dielectric material portion (165, 265) can be formed over the staircase regions on the at least one alternating stack (132, 142, 232, 242).

Optionally, drain-select-level shallow trench isolation structures 72 can be formed through a subset of layers in an upper portion of the second-tier alternating stack (232, 242). The second sacrificial material layers 242 that are cut by the select-drain-level shallow trench isolation structures 72 correspond to the levels in which drain-select-level electrically conductive layers are subsequently formed. The drain-select-level shallow trench isolation structures 72 include a dielectric material such as silicon oxide.

Figure 10A:
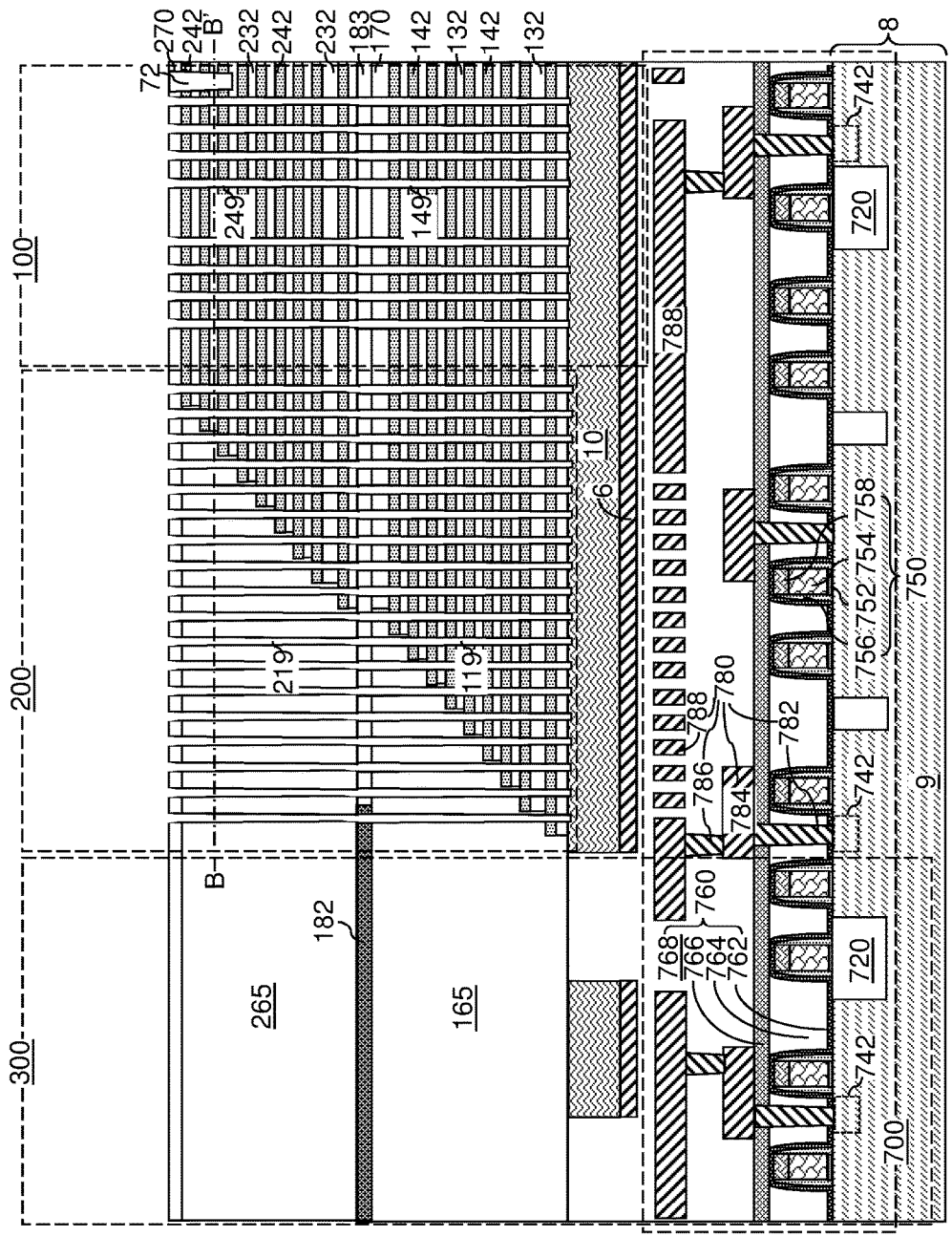
FIG. 10A is a vertical cross-sectional view of the first exemplary structure after formation of second-tier memory openings and second-tier support openings according to the first embodiment of the present disclosure.

Referring to FIGS. 10A and 10B, second-tier memory openings 249 and second tier support openings 219 extending through the second tier structure (232, 242, 270, 265) are formed in areas overlying the sacrificial memory opening fill portions 148. A photoresist layer can be applied over the second tier structure (232, 242, 270, 265), and can be lithographically patterned to form a same pattern as the pattern of the sacrificial memory opening fill portions 148 and the sacrificial support opening fill portions 118, i.e., the pattern of the first-tier memory openings 149 and the first-tier support openings 119. Thus, the lithographic mask employed to pattern the first-tier memory openings 149 and the first-tier support openings 119 can be employed to pattern the second-tier memory openings 249 and the second-tier support openings 219. An anisotropic etch can be performed to transfer the pattern of the lithographically patterned photoresist layer through the second tier structure (232, 242, 270, 265). In one embodiment, the chemistry of the anisotropic etch process employed to etch through the materials of the second-tier alternating stack (232, 242) can alternate to optimize etching of the alternating material layers in the second-tier alternating stack (232, 242). The anisotropic etch can be, for example, a series of reactive ion etches. The patterned lithographic material stack can be removed, for example, by ashing after the anisotropic etch process.

A top surface of an underlying sacrificial memory opening fill portion 148 can be physically exposed at the bottom of each second-tier memory opening 249. A top surface of an underlying sacrificial support opening fill portion 118 can be physically exposed at the bottom of each second-tier support opening 219. After the top surfaces of the sacrificial memory opening fill portions 148 and the sacrificial support opening fill portions 118 are physically exposed, an etch process can be performed, which removes the sacrificial material of the sacrificial memory opening fill portions 148 and the sacrificial support opening fill portions 118 selective to the materials of the second-tier alternating stack (232, 242) and the first-tier alternating stack (132, 142) (e.g., $C_4F_8/O_2/Ar$ etch).

Upon removal of the sacrificial memory opening fill portions 148, each vertically adjoining pair of a second-tier memory opening 249 and a first-tier memory opening 149 forms a continuous cavity that extends through the first-tier alternating stack (132, 142) and the second-tier alternating stack (232, 242). Likewise, upon removal of the sacrificial support opening fill portions 118, each vertically adjoining pair of a second-tier support opening 219 and a first-tier support opening 119 forms a continuous cavity that extends through the first-tier alternating stack (132, 142) and the second-tier alternating stack (232, 242). The continuous cavities are herein referred to as memory openings (or inter-tier memory openings) and support openings (or inter-tier support openings), respectively. A top surface of the planar semiconductor material layer 10 can be physically exposed at the bottom of each memory opening and at the bottom of each support openings. Locations of steps S in the first-tier alternating stack (132, 142) and the second-tier alternating stack (232, 242) are illustrated as dotted lines.

Figure 11:
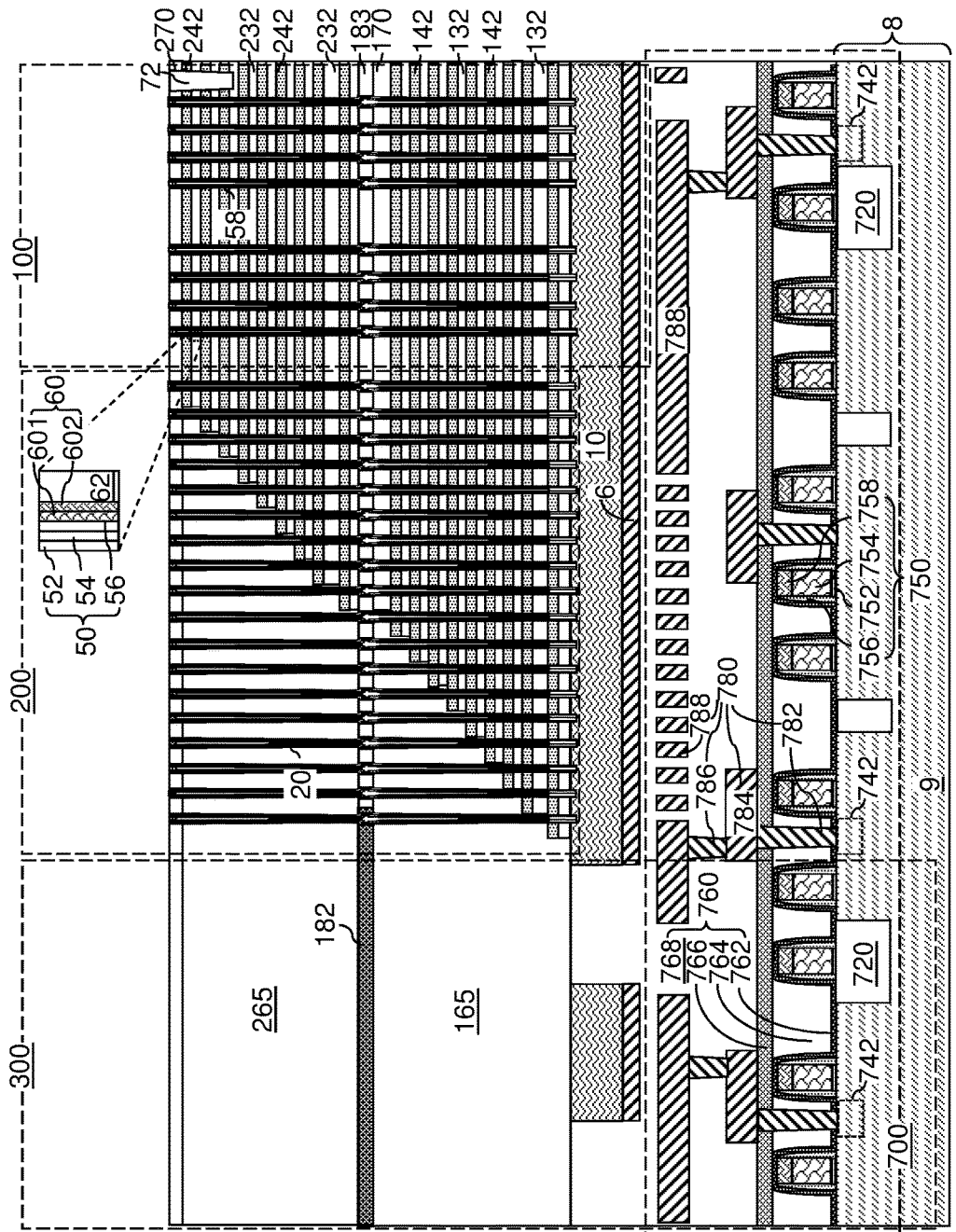
FIG. 11 is a vertical cross-sectional view of the first exemplary structure after formation of memory stack structures according to the first embodiment of the present disclosure.

Referring to FIG. 11, memory opening fill structures 58 are formed within each memory opening, and support pillar structures 20 are formed within each support opening. The memory opening fill structures 58 and the support pillar structures 20 can include a same set of components, and can be formed simultaneously.

FIGS. 12A-12H provide sequential cross-sectional views of a memory opening 49 or a support opening (119, 219) during formation of a memory opening fill structure 58 or a support pillar structure 20. While a structural change in a memory opening 49 is illustrated in FIGS. 12A-12H, it is understood that the same structural change occurs in each memory openings 49 and in each of the support openings (119, 219) during the same set of processing steps.

Referring to FIG. 12A, a memory opening 49 in the exemplary device structure of FIG. 11 is illustrated. The memory opening 49 extends through the first tier structure and the second tier structure. Likewise, each support opening (119, 219) extends through the first tier structure and the second tier structure.

Referring to FIG. 12B, an optional pedestal channel portion (e.g., an epitaxial pedestal) 11 can be formed at the bottom portion of each memory opening 49 and each support openings (119, 219), for example, by a selective semiconductor deposition process. In one embodiment, the pedestal channel portion 11 can be doped with electrical dopants of the same conductivity type as the planar semiconductor material layer 10. In one embodiment, at least one source select gate electrode can be subsequently formed by replacing each sacrificial material layer 42 located below the horizontal plane including the top surfaces of the pedestal channel portions 11 with a respective conductive material layer. A cavity 49' is present in the unfilled portion of the memory opening 49 (or of the support opening) above the pedestal channel portion 11. In one embodiment, the pedestal channel portion 11 can comprise single crystalline silicon. In one embodiment, the pedestal channel portion 11 can have a doping of the same as the conductivity type of the planar semiconductor material layer 10.

Figure 12D:
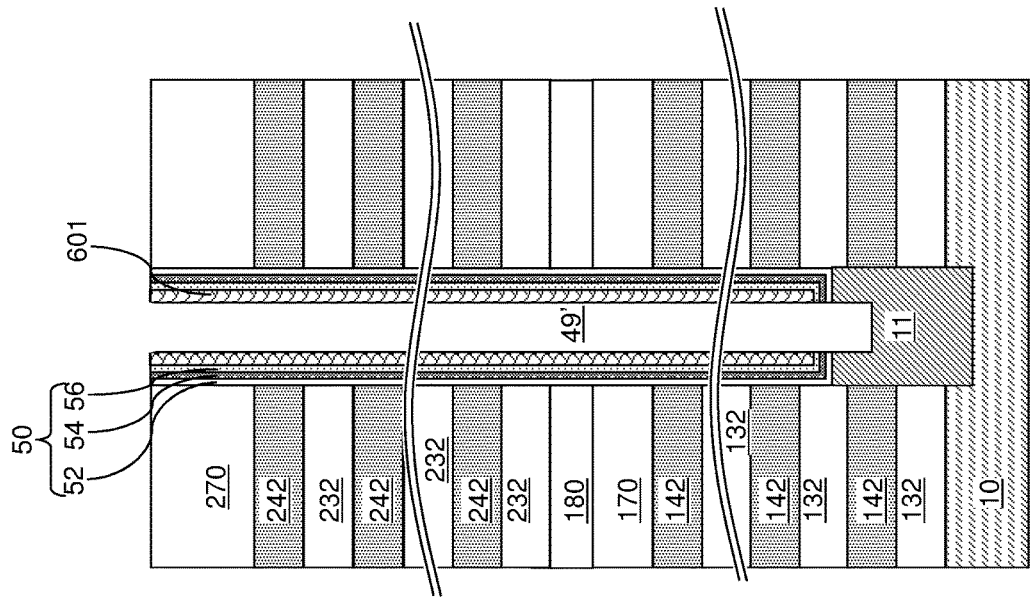
Figure 12C:
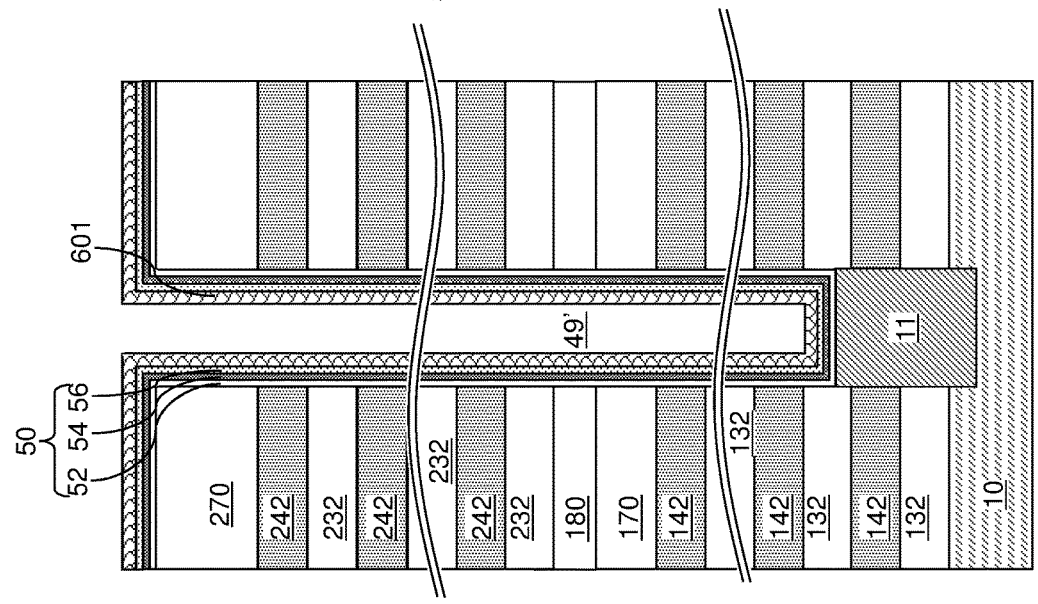

Referring to FIG. 12C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) can have vertically coincident sidewalls, and the charge storage layer 54 can be formed as a single continuous layer.

In another embodiment, the sacrificial material layers (142, 242) can be laterally recessed with respect to the sidewalls of the insulating layers (132, 232), and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A cavity 49' is formed in the volume of each memory opening 49 that is not filled with the deposited material layers (52, 54, 56, 601).

Referring to FIG. 12D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the second insulating cap layer 270 can be removed by the at least one anisotropic etch process. Further, the horizontal portions of the first semiconductor channel layer 601, the tunneling dielectric layer 56, the charge storage layer 54, and the blocking dielectric layer 52 at a bottom of each cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers (142, 242) constitutes a charge storage region.

A surface of the pedestal channel portion 11 (or a surface of the planar semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each cavity 49' can be vertically recessed so that the recessed semiconductor surface underneath the cavity 49' is vertically offset from the topmost surface of the pedestal channel portion 11 (or of the planar semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Figure 12F:
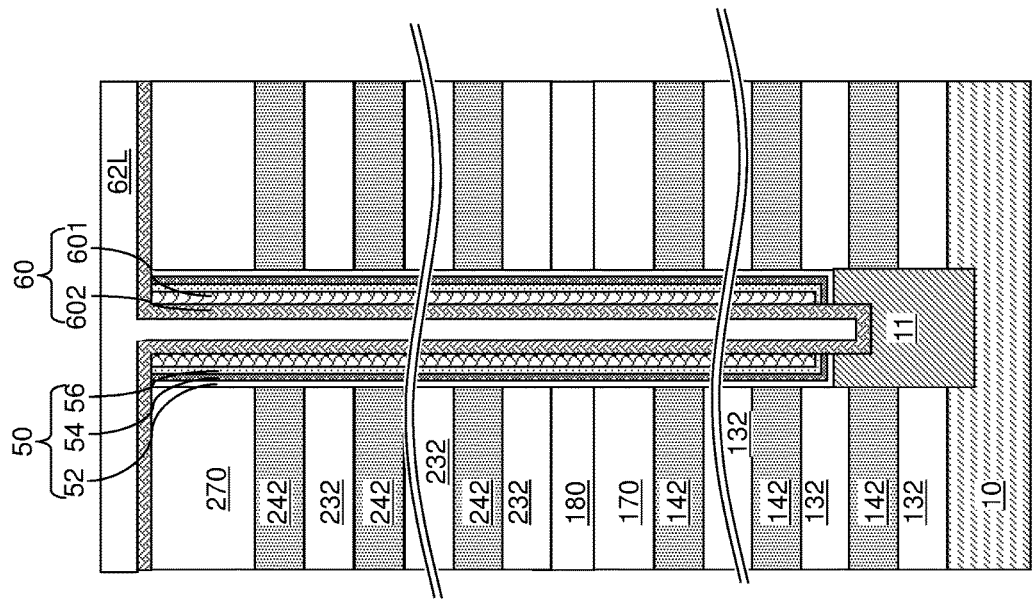
Figure 12E:
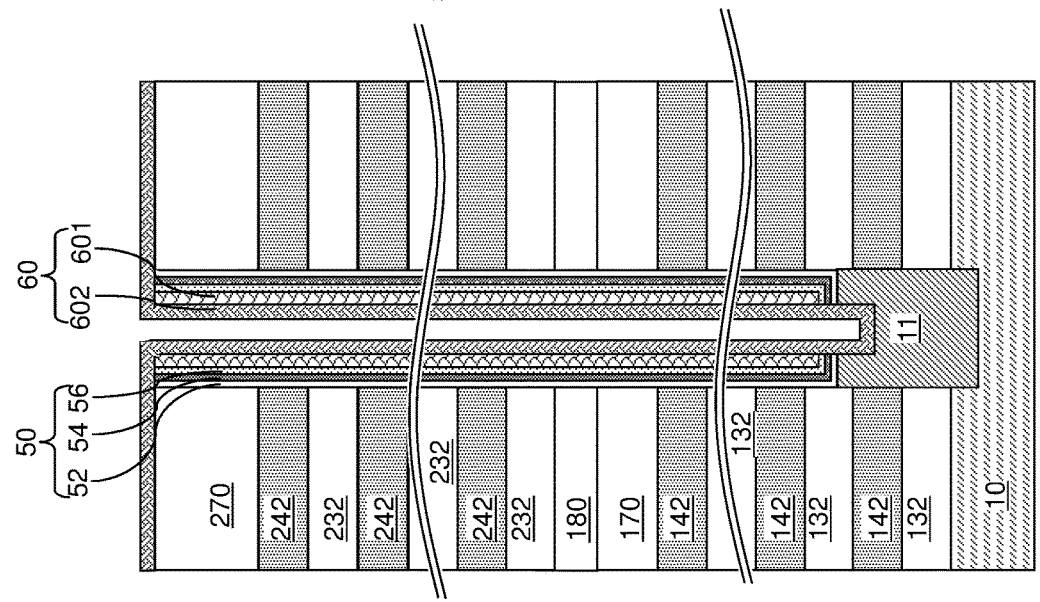

Referring to FIG. 12E, a second semiconductor channel layer 602 can be deposited directly on the semiconductor surface of the pedestal channel portion 11 or the semiconductor substrate layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 12F, in case the cavity 49' in each memory opening is not completely filled by the second semiconductor channel layer 602, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 12G:
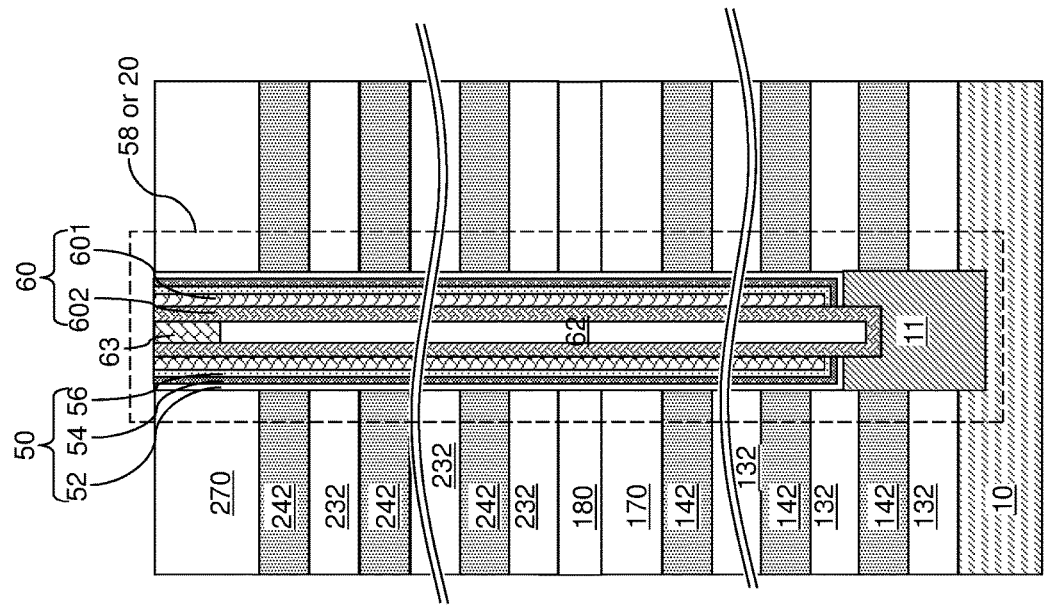

Referring to FIG. 12G, the horizontal portion of the dielectric core layer 62L can be removed, for example, by a recess etch from above the top surface of the second insulating cap layer 270. Each remaining portion of the dielectric core layer 62L constitutes a dielectric core 62. Further, the horizontal portion of the second semiconductor channel layer 602 located above the top surface of the second insulating cap layer 270 can be removed by a planarization process, which can employ a recess etch or chemical mechanical planarization (CMP). Each remaining portion of the second semiconductor channel layer 602 can be located entirety within a memory opening 49 or entirely within a support opening (119, 219).

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Figure 12H:
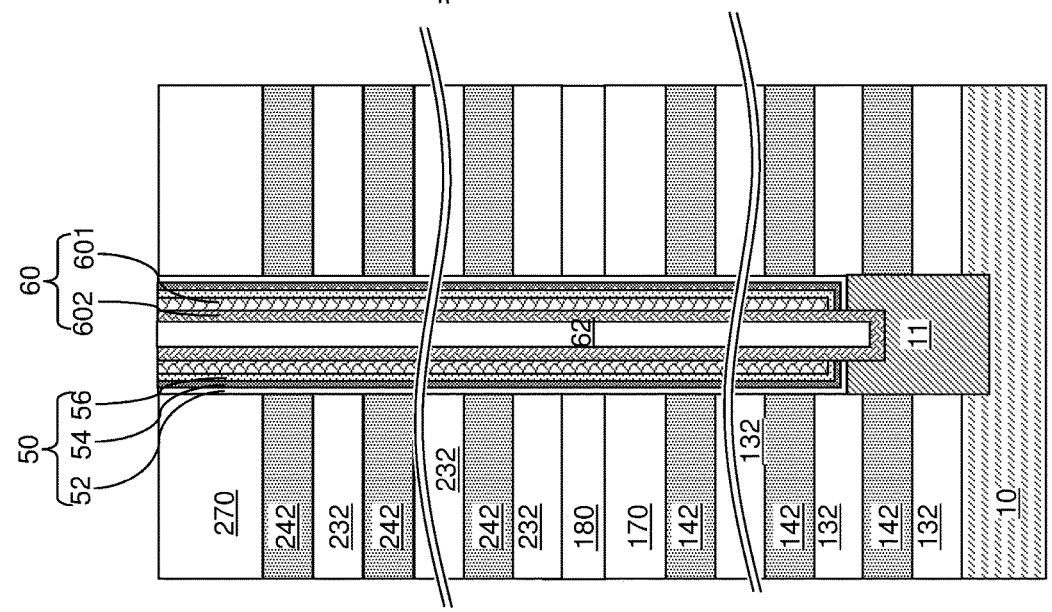

Referring to FIG. 12H, the top surface of each dielectric core 62 can be further recessed within each memory opening, for example, by a recess etch to a depth that is located between the top surface of the second insulating cap layer 270 and the bottom surface of the second insulating cap layer 270. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the second insulating cap layer 270, for example, by chemical mechanical planarization (CMP) or a recess etch to form the drain regions 63.

Each combination of a memory film 50 and a vertical semiconductor channel 60 (which is a vertical semiconductor channel) within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 constitutes a memory opening fill structure 58. Each combination of a pedestal channel portion 11 (if present), a memory film 50, a vertical semiconductor channel 60, a dielectric core 62, and a drain region 63 within each support opening (119, 219) fills the respective support openings (119, 219), and constitutes a support pillar structure 20.

The first tier structure (132, 142, 170, 165), the second tier structure (232, 242, 270, 265), the inter-tier dielectric layer 180, the memory opening fill structures 58, and the support pillar structures 20 collectively constitute a memory-level assembly. The memory-level assembly is formed over the planar semiconductor material layer 10 such that the planar semiconductor material layer 10 includes horizontal semiconductor channels electrically connected to vertical semiconductor channels 60 within the memory stack structures 55.

Figure 13A:
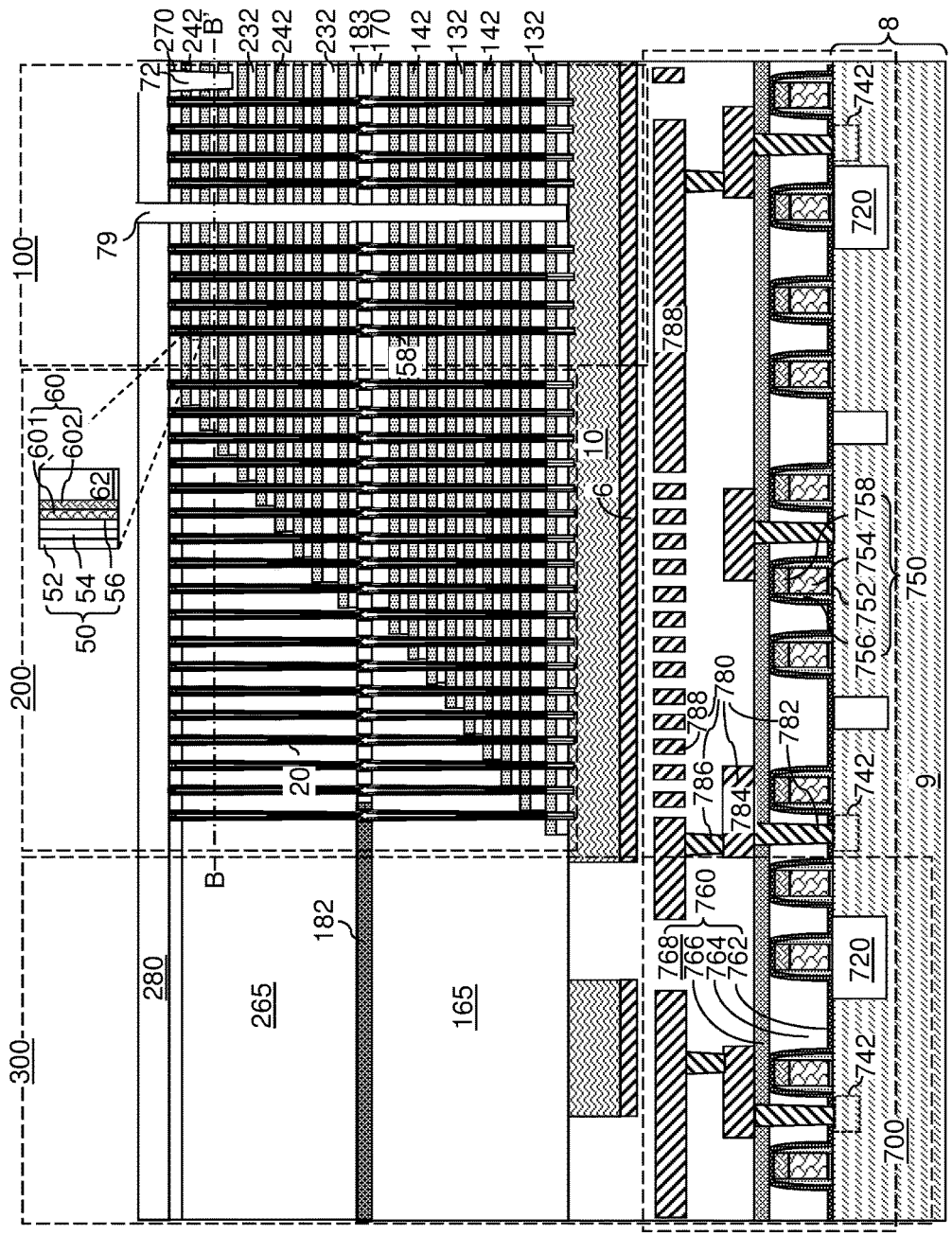
FIG. 13A is a vertical cross-sectional view of the first exemplary structure after formation of a contact level dielectric layer and backside contact trenches according to the first embodiment of the present disclosure.
Figure 13B:
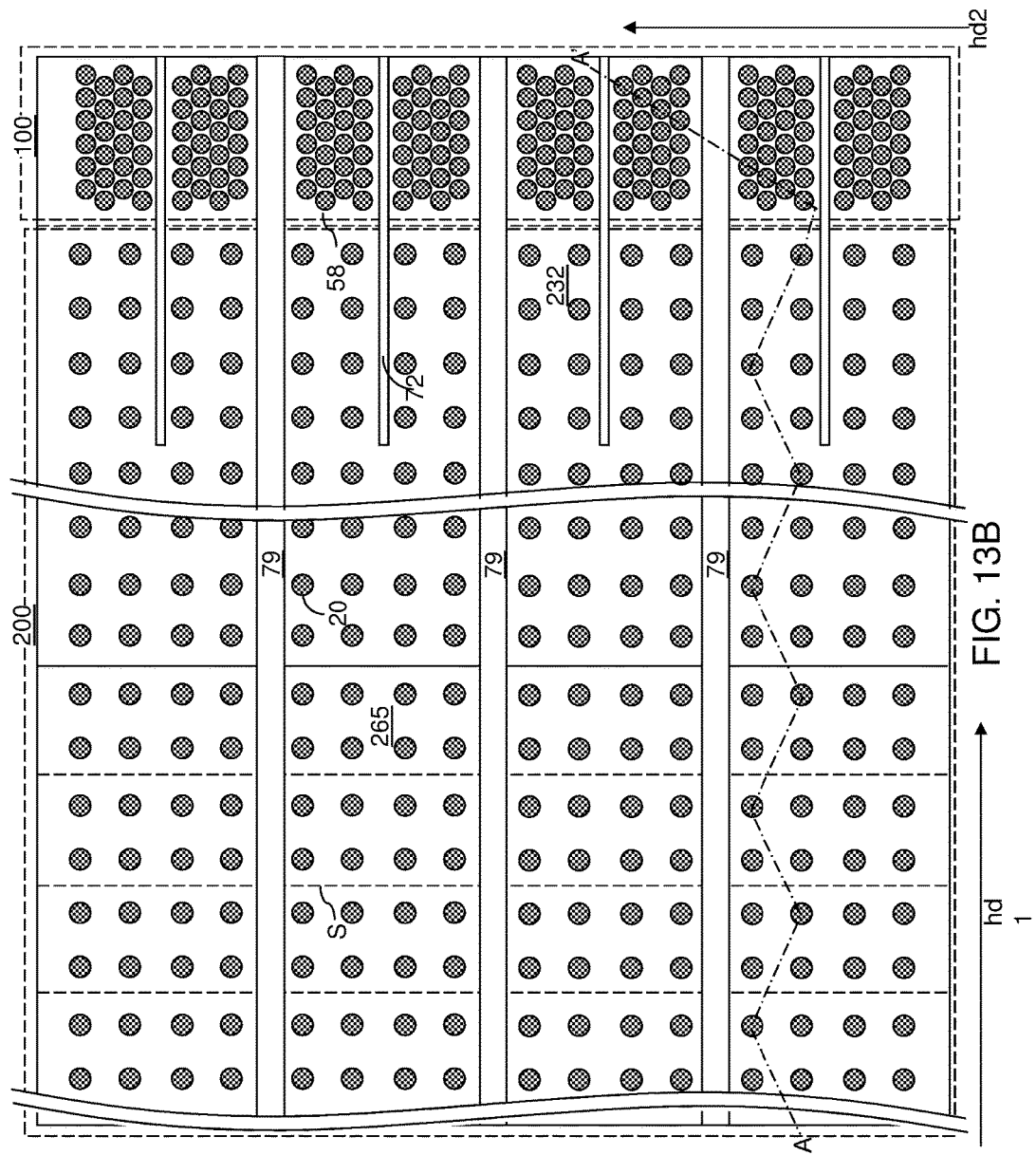
FIG. 13B is a horizontal cross-sectional view of the first exemplary structure along the horizontal plane B-B' in FIG. 13A. The zig-zag vertical plane A-A' corresponds to the plane of the vertical cross-sectional view of FIG. 13A.

Referring to FIGS. 13A and 13B, a first contact level dielectric layer 280 can be formed over the memory-level assembly. The first contact level dielectric layer 280 is formed at a contact level through which various contact via structures are subsequently formed to the drain regions 63 and the various electrically conductive layers that replaces the sacrificial material layers (142, 242) in subsequent processing steps.

Backside contact trenches 79 are subsequently formed through the first contact level dielectric layer 280 and the memory-level assembly. For example, a photoresist layer can be applied and lithographically patterned over the first contact level dielectric layer 280 to form elongated openings that extend along a first horizontal direction hd1. An anisotropic etch is performed to transfer the pattern in the patterned photoresist layer through the first contact level dielectric layer 280 and the memory-level assembly to a top surface of the planar semiconductor material layer 10. The photoresist layer can be subsequently removed, for example, by ashing.

The backside contact trenches 79 extend along the first horizontal direction hd1, and thus, are elongated along the first horizontal direction hd1. The backside contact trenches 79 can be laterally spaced among one another along a second horizontal direction hd2, which can be perpendicular to the first horizontal direction hd1. The backside contact trenches 79 can extend through the memory array region 100 and the word line contact via region 200. The first subset of the backside contact trenches 79 laterally divides the memory-level assembly.

Figure 14:
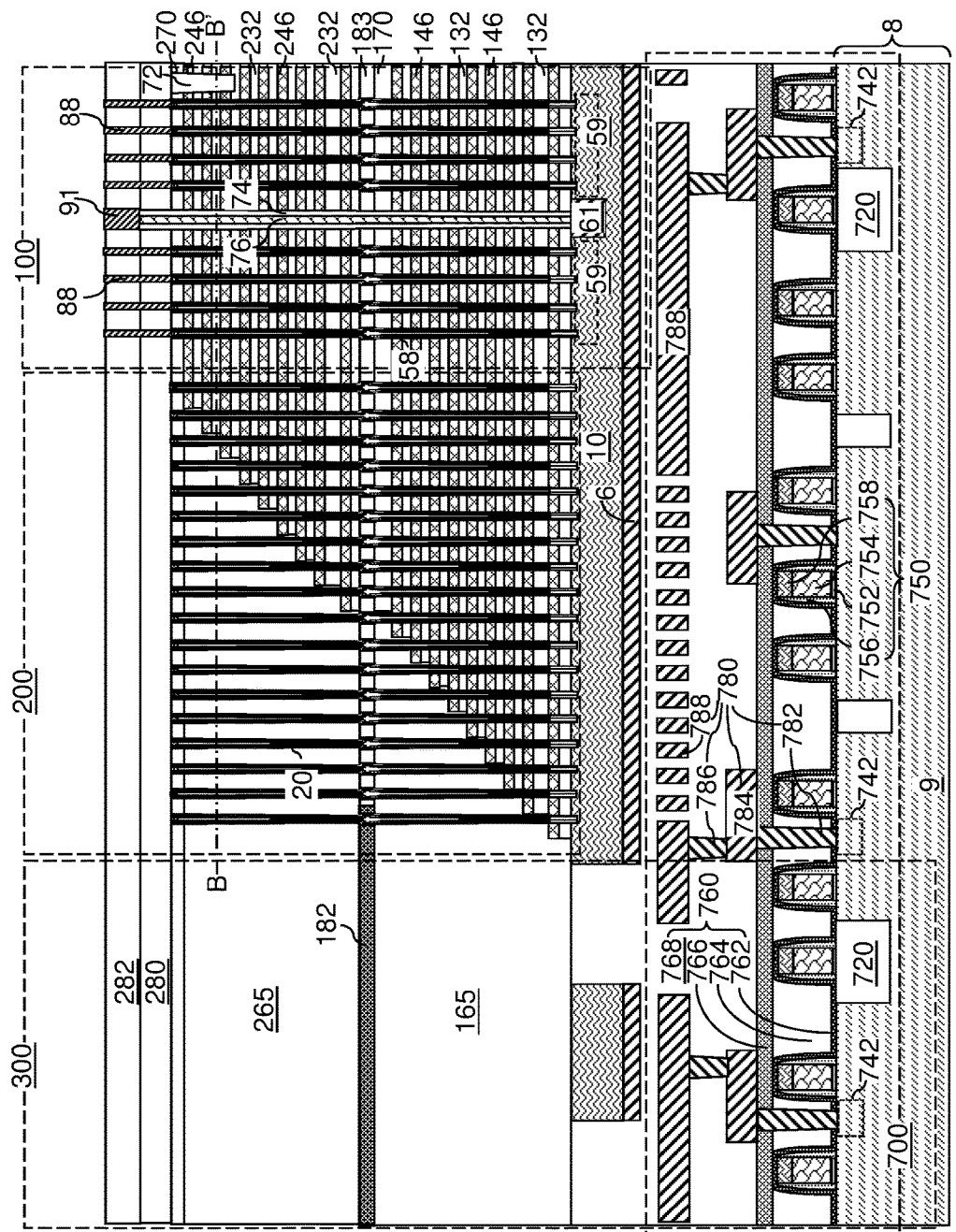
FIG. 14 is a vertical cross-sectional view of the first exemplary structure after replacement of sacrificial material layers with electrically conductive layers and formation of insulating spacers, backside contact via structures, drain contact via structures, and source bias line structures according to the first embodiment of the present disclosure.

Referring to FIG. 14, an etchant that selectively etches the materials of the first and second sacrificial material layers (142, 242) with respect to the materials of the first and second insulating layers (132, 232), the first and second insulating cap layers (170, 270), and the material of the outermost layer of the memory films 50 can be introduced into the backside contact trenches 79, for example, employing an isotropic etch process. First backside recesses are formed in volumes from which the first sacrificial material layers 142 are removed. Second backside recesses are formed in volumes from which the second sacrificial material layers 242 are removed. In one embodiment, the first and second sacrificial material layers (142, 242) can include silicon nitride, and the materials of the first and second insulating layers (132, 232), can be silicon oxide. In another embodiment, the first and second sacrificial material layers (142, 242) can include a semiconductor material such as germanium or a silicon-germanium alloy, and the materials of the first and second insulating layers (132, 232) can be selected from silicon oxide and silicon nitride.

The isotropic etch process can be a wet etch process employing a wet etch solution, or can be a gas phase (dry) etch process in which the etchant is introduced in a vapor phase into the backside contact trench 79. For example, if the first and second sacrificial material layers (142, 242) include silicon nitride, the etch process can be a wet etch process in which the exemplary structure is immersed within a wet etch tank including phosphoric acid, which etches silicon nitride selective to silicon oxide, silicon, and various other materials employed in the art. In case the sacrificial material layers (142, 242) comprise a semiconductor material, a wet etch process (which may employ a wet etchant such as a KOH solution) or a dry etch process (which may include gas phase HCl) may be employed.

Each of the first and second backside recesses can be a laterally extending cavity having a lateral dimension that is greater than the vertical extent of the cavity. In other words, the lateral dimension of each of the first and second backside recesses can be greater than the height of the respective backside recess. A plurality of first backside recesses can be formed in the volumes from which the material of the first sacrificial material layers 142 is removed. A plurality of second backside recesses can be formed in the volumes from which the material of the second sacrificial material layers 242 is removed. Each of the first and second backside recesses can extend substantially parallel to the top surface of the substrate 9. A backside recess can be vertically bounded by a top surface of an underlying insulating layer (132 or 232) and a bottom surface of an overlying insulating layer (132 or 232). In one embodiment, each of the first and second backside recesses can have a uniform height throughout.

In one embodiment, a sidewall surface of each pedestal channel portion 11 can be physically exposed at each bottommost first backside recess after removal of the first and second sacrificial material layers (142, 242). Further, a top surface of the planar semiconductor material layer 10 can be physically exposed at the bottom of each backside contact trench 79. An annular dielectric spacer (not shown)

can be formed around each pedestal channel portion 11 by oxidation of a physically exposed peripheral portion of the pedestal channel portions 11. Further, a semiconductor oxide portion (not shown) can be formed from each physically exposed surface portion of the planar semiconductor material layer 10 concurrently with formation of the annular dielectric spacers.

A backside blocking dielectric layer (not shown) can be optionally deposited in the backside recesses and the backside contact trenches 79 and over the first contact level dielectric layer 280. The backside blocking dielectric layer can be deposited on the physically exposed portions of the outer surfaces of the memory stack structures 55. The backside blocking dielectric layer includes a dielectric material such as a dielectric metal oxide, silicon oxide, or a combination thereof. If employed, the backside blocking dielectric layer can be formed by a conformal deposition process such as atomic layer deposition or chemical vapor deposition. The thickness of the backside blocking dielectric layer can be in a range from 1 nm to 60 nm, although lesser and greater thicknesses can also be employed.

At least one conductive material can be deposited in the plurality of backside recesses, on the sidewalls of the backside contact trench 79, and over the first contact level dielectric layer 280. The at least one conductive material can include at least one metallic material, i.e., an electrically conductive material that includes at least one metallic element.

A plurality of first electrically conductive layers 146 can be formed in the plurality of first backside recesses, a plurality of second electrically conductive layers 246 can be formed in the plurality of second backside recesses, and a continuous metallic material layer (not shown) can be formed on the sidewalls of each backside contact trench 79 and over the first contact level dielectric layer 280. Thus, the first and second sacrificial material layers (142, 242) can be replaced with the first and second conductive material layers (146, 246), respectively. Specifically, each first sacrificial material layer 142 can be replaced with an optional portion of the backside blocking dielectric layer and a first electrically conductive layer 146, and each second sacrificial material layer 242 can be replaced with an optional portion of the backside blocking dielectric layer and a second electrically conductive layer 246. A backside cavity is present in the portion of each backside contact trench 79 that is not filled with the continuous metallic material layer.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the backside recesses include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the backside recesses can be a combination of titanium nitride layer and a tungsten fill material. In one embodiment, the metallic material can be deposited by chemical vapor deposition or atomic layer deposition.

Residual conductive material can be removed from inside the backside contact trenches 79. Specifically, the deposited metallic material of the continuous metallic material layer can be etched back from the sidewalls of each backside contact trench 79 and from above the first contact level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Each electrically conductive layer (146, 246) can be a conductive line structure.

A subset of the second electrically conductive layers 246 located at the levels of the drain-select-level shallow trench isolation structures 72 constitutes drain select gate electrodes. A subset of the first electrically conductive layers 146 located at each level of the annular dielectric spacers (not shown) constitutes source select gate electrodes. A subset of the electrically conductive layer (146, 246) located between the drain select gate electrodes and the source select gate electrodes can function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) can comprise word lines for the memory elements. The semiconductor devices 710 in the peripheral device region 300 can comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246). Each of the at least one an alternating stack (132, 146, 232, 246) includes alternating layers of respective insulating layers (132 or 232) and respective electrically conductive layers (146 or 246). The at least one alternating stack (132, 146, 232, 246) comprises staircase regions that include terraces in which each underlying electrically conductive layer (146, 246) extends farther along the first horizontal direction hd1 than any overlying electrically conductive layer (146, 246) in the memory-level assembly.

Dopants of a second conductivity type, which is the opposite of the first conductivity type of the planar semiconductor material layer 10, can be implanted into a surface portion of the planar semiconductor material layer 10 to form a source region 61 underneath the bottom surface of each backside contact trench 79. An insulating spacer 74 including a dielectric material can be formed at the periphery of each backside contact trench 79, for example, by deposition of a conformal insulating material (such as silicon oxide) and a subsequent anisotropic etch. The first contact level dielectric layer 280 may be thinned due to a collateral etch during the anisotropic etch that removes the vertical portions of horizontal portions of the deposited conformal insulating material.

A conformal insulating material layer can be deposited in the backside contact trenches 79, and can be anisotropically etched to form insulating spacers 74. The insulating spacers 74 include an insulating material such as silicon oxide, silicon nitride, and/or a dielectric metal oxide. A cavity laterally extending along the first horizontal direction hd1 is present within each insulating spacer 74.

A backside contact via structure can be formed in the remaining volume of each backside contact trench 79, for example, by deposition of at least one conductive material and removal of excess portions of the deposited at least one conductive material from above a horizontal plane including the top surface of the first contact level dielectric layer 280 by a planarization process such as chemical mechanical planarization or a recess etch. The backside contact via structures are electrically insulated in all lateral directions, and is laterally elongated along the first horizontal direction hd1. As such, the backside contact via structures are herein referred to as laterally-elongated contact via structures 76. As used herein, a structure is "laterally elongated" if the maximum lateral dimension of the structure along a first horizontal direction is greater than the maximum lateral dimension of the structure along a second horizontal direction that is perpendicular to the first horizontal direction at least by a factor of 5.

Optionally, each laterally-elongated contact via structure 76 may include multiple backside contact via portions such as a lower backside contact via portion and an upper backside contact via portion. In an illustrative example, the lower backside contact via portion can include a doped semiconductor material (such as doped polysilicon), and can be formed by depositing the doped semiconductor material layer to fill the backside contact trenches 79 and removing the deposited doped semiconductor material from upper portions of the backside contact trenches 79. The upper backside contact via portion can include at least one metallic material (such as a combination of a TiN liner and a W fill material), and can be formed by depositing the at least one metallic material above the lower backside contact via portions, and removing an excess portion of the at least one metallic material from above the horizontal plane including the top surface of the first contact level dielectric layer 280. The first contact level dielectric layer 280 can be thinned and removed during a latter part of the planarization process, which may employ chemical mechanical planarization (CMP), a recess etch, or a combination thereof. Each laterally-elongated contact via structure 76 can be formed through the memory-level assembly and on a respective source region 61. The top surface of each laterally-elongated contact via structure 76 can located above a horizontal plane including the top surfaces of the memory stack structures 55.

A second contact level dielectric layer 282 can be optionally formed over the first contact level dielectric layer 280. The second contact level dielectric layer 282 includes a dielectric material such as silicon oxide or silicon nitride. The thickness of the second contact level dielectric layer 282 can be in a range from 30 nm to 300 nm, although lesser and greater thicknesses can also be employed. Drain contact via structures 88 contacting the drain regions 63 can extend through the contact level dielectric layers (280, 282) and the second insulating cap layer 270 in the memory array region 100. A source connection via structure 91 can extend through the contact level dielectric layers (280, 282) to provide electrical connection to the laterally-elongated contact via structures 76.

Figure 15A:
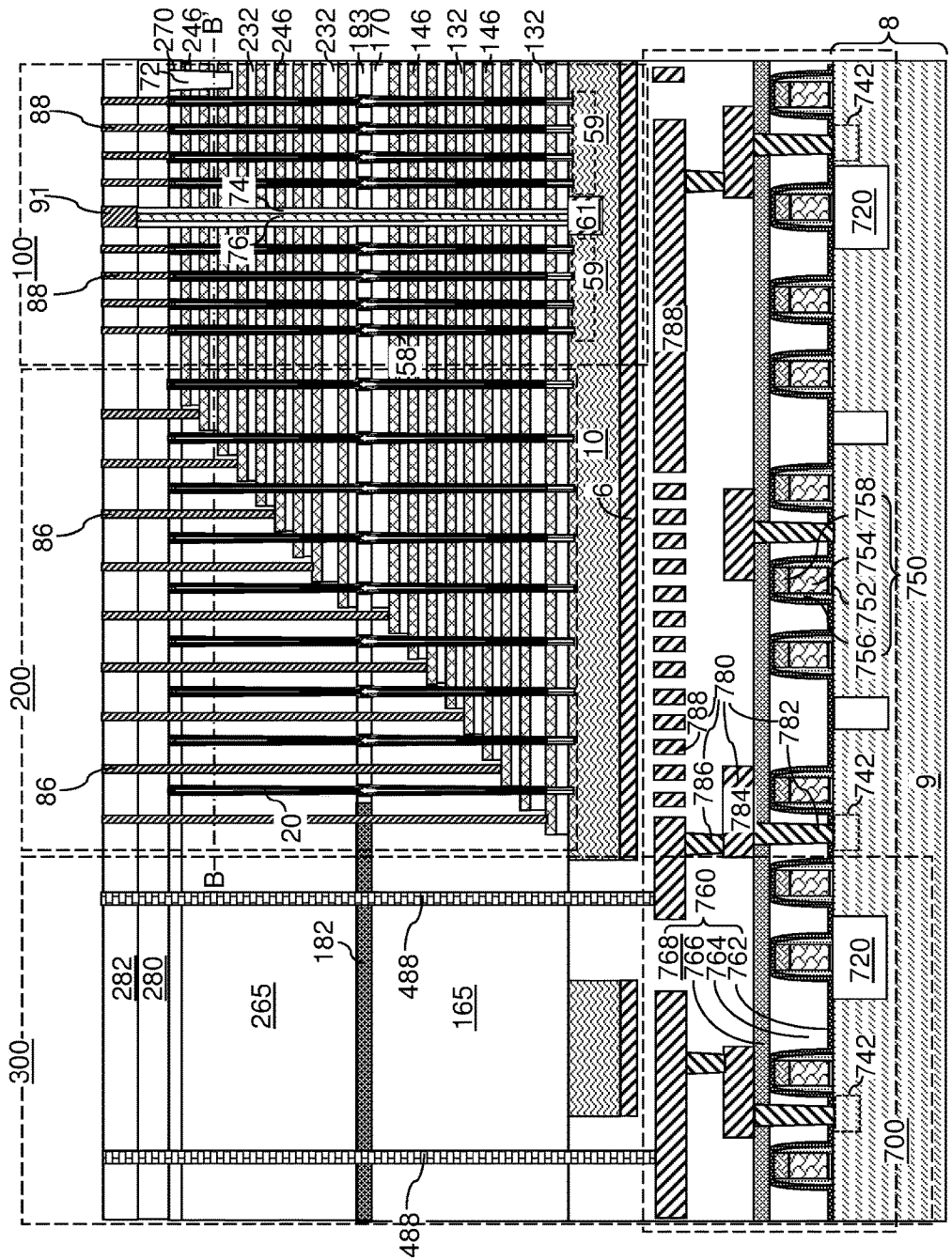
FIG. 15A is a vertical cross-sectional view of the first exemplary structure after formation of through-memory-level via structures and word line contact via structures according to the first embodiment of the present disclosure.
Figure 15B:
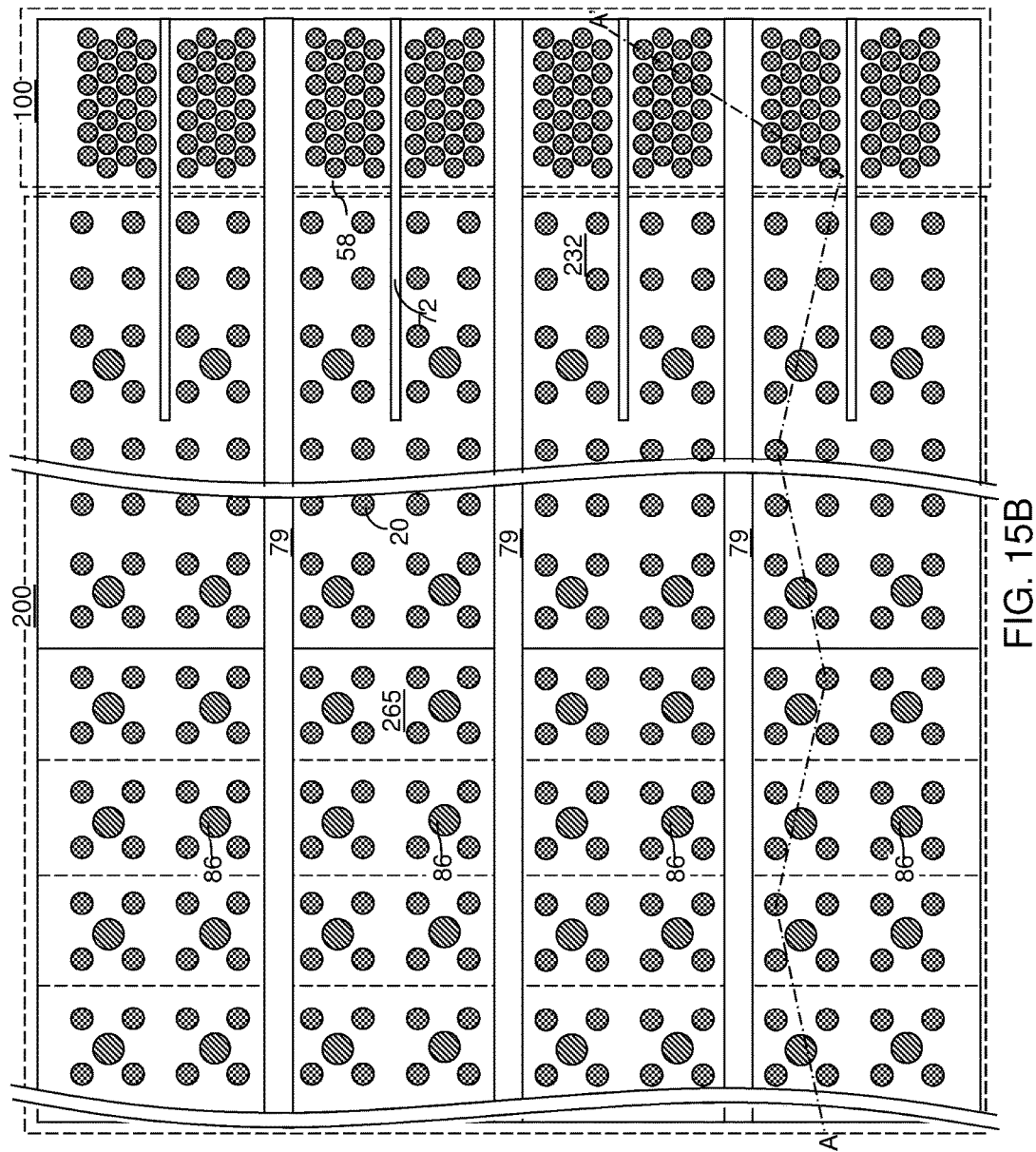
FIG. 15B is a horizontal cross-sectional view of the first exemplary structure along the horizontal plane B-B' in FIG. 15A. The zig-zag vertical plane A-A' corresponds to the plane of the vertical cross-sectional view of FIG. 15A.

Referring to FIGS. 15A and 15B, various contact via structures can be formed through the contact level dielectric layers (280, 282) and the retro-stepped dielectric material portions (165, 265). For example, word line contact via structures 86 can be formed in the word line contact region 200. A subset of the word line contact via structures 86 contacting the second electrically conductive layers 246 extends through the second-tier retro-stepped dielectric material portion 265 in the word line contact region 200, and does not extend through the first-tier retro-stepped dielectric material portion 165. Another subset of the word line contact via structures 86 contacting the first electrically conductive layers 146 extends through the second-tier retro-stepped dielectric material portion 265 and through the first-tier retro-stepped dielectric material portion 165 in the word line contact region 200.

Further, through-memory-level via cavities can be formed through the memory-level assembly outside the areas of the memory array region 100 and the word line contact region 200. In this case, the through-memory-level via cavities can be formed through the contact level dielectric layers (280, 282) and the retro-stepped dielectric material portions (165, 265), and into the at least one lower level dielectric layer 760. A top surface of a respective one of the lower level metal interconnect structures 780 can be physically exposed at the bottom of each through-memory-level via cavities. The through-memory-level openings can be formed, for example, by applying a photoresist layer (not shown) over the first contact level dielectric layer 280, lithographically patterning the photoresist layer to form openings, and transferring the pattern in the photoresist layer through the contact level dielectric layers (280, 282) and the retro-stepped dielectric material portions (165, 265), and into the at least one lower level dielectric layer 760 by an anisotropic etch. The photoresist layer can be removed, for example, by ashing. At least one conductive material can be deposited in the through-memory-level via cavities to form through-memory-level via structures 488. The through-memory-level via structures 488 can provide vertical electrical connection through the memory level structures.

Figure 16:
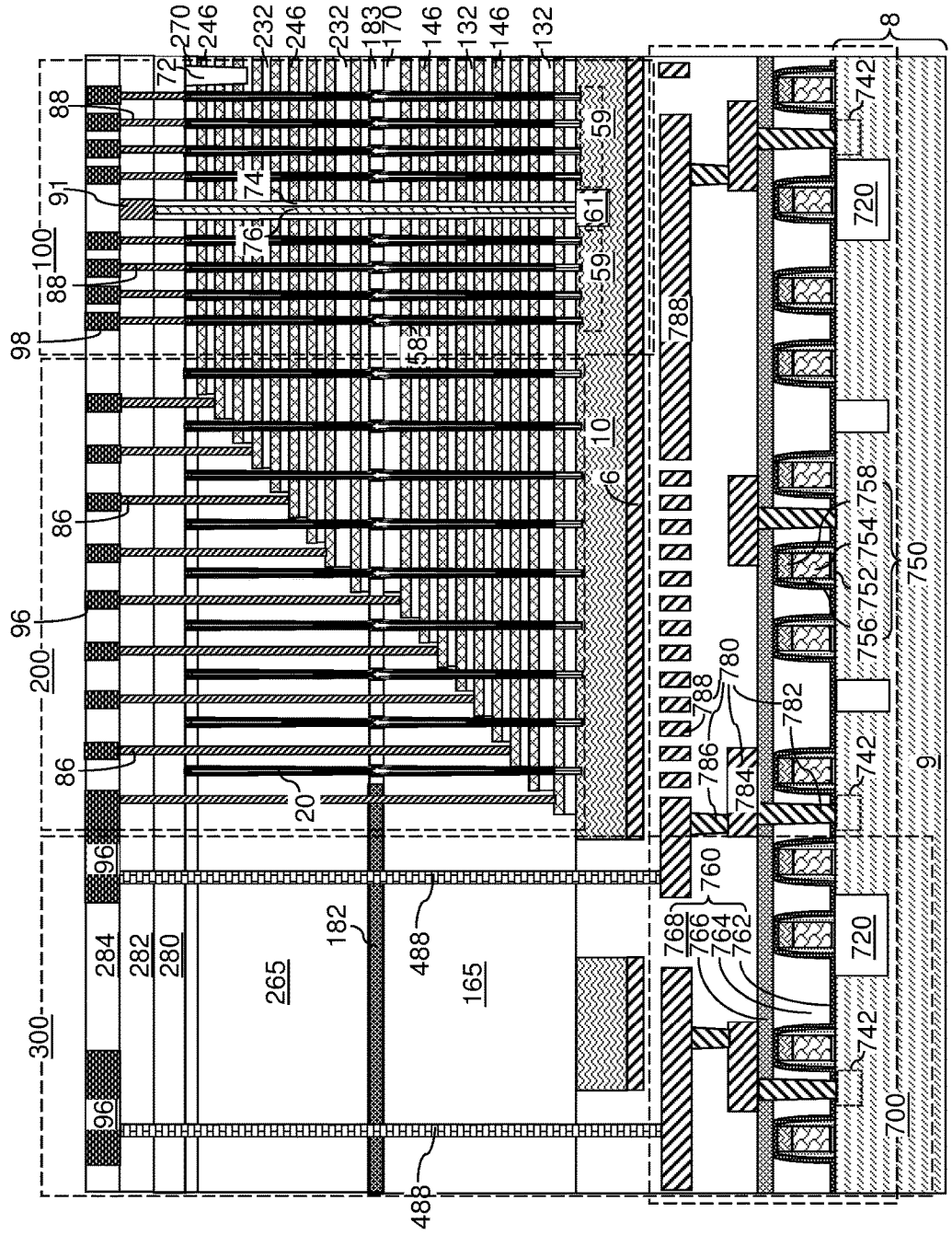
FIG. 16 is a vertical cross-sectional view of the first exemplary structure after formation of upper level line structures according to the first embodiment of the present disclosure.

Referring to FIG. 16, a line level dielectric layer 284 can be formed over the contact level dielectric layers (280, 282). Various line level metal interconnect structures (96, 98) can be formed in the line level dielectric layer 284. The line level metal interconnect structures (96, 98) can include upper level metal interconnect structures 96 that are electrically coupled to (e.g., formed on or in physical contact with) respective pairs of a word line contact via structure 86 and a through-memory-level via structure 488, and bit lines 98 that extend along the second horizontal direction hd2 and perpendicular to the first horizontal direction hd1. Additional line level metal interconnect structures that are not expressly illustrated can include source connection line structures that contact the source connection via structures 91 to provide electrically conductive paths for biasing the source regions 61 through the laterally-elongated contact via structures 76, and drain side select gate electrode contact via structures are located in the word line contact regions 200. The through-memory-level via structures 488 can be conductive structures that provide electrically conductive paths between the device contact via structure 782 and metal lines (such as the upper level metal interconnect structures 96) that are located above a horizontal plane including a top surface of the three-dimensional memory array.

The patterned tensile-stress-generating material layer 182 applies tensile stress to the first retro-stepped dielectric material portion 165 and the second retro-stepped dielectric material portion 265 to at least partially compensate for the compressive stress that the first and second retro-stepped dielectric material portions (165, 265) apply to the first-tier alternating stack (132, 146) and to the second-tier alternating stack (232, 246). The tensile stress that the patterned tensile-stress-generating material layer 182 applies to the first and second retro-stepped dielectric material portions (165, 265) can be tuned to match the total compressive stress that the first and second retro-stepped dielectric material portions (165, 265) apply to the first-tier alternating stack (132, 146) and to the second-tier alternating stack (232, 246). In one embodiment, the tensile stress that the patterned tensile-stress-generating material layer 182 applies to the first and second retro-stepped dielectric material portions (165, 265) can have a magnitude that is in a range from 20% to 180%, and/or in a range from 50% to 150%, and/or in a range from 75% to 125%, of the magnitude of the total compressive stress that the first and second retro-stepped dielectric material portions (165, 265) apply to the first-tier alternating stack (132, 146) and to the second-tier alternating stack (232, 246). The effect of the compressive stress applied by the first and second retro-stepped dielectric material portions (165, 265) to the first-tier alternating stack (132, 146) and to the second-tier alternating stack (232, 246) can be significantly reduced or eliminated.

While an embodiment including only one inter-tier dielectric layer 180 including a patterned tensile-stress-generating material layer 182 is employed to describe stress relief provided by the patterned tensile-stress-generating material layer 182 of the present disclosure, the patterned tensile-stress-generating material layer 182 may be repeatedly employed at each interface between a lower-tier alternating stack and an upper-tier alternating stack in a semiconductor structure including more than two tiers. As such, embodiments are expressly contemplated herein which employ multiple patterned tensile-stress-generating material layers 182 in structures including more than two tier structures.

Figure 17A:
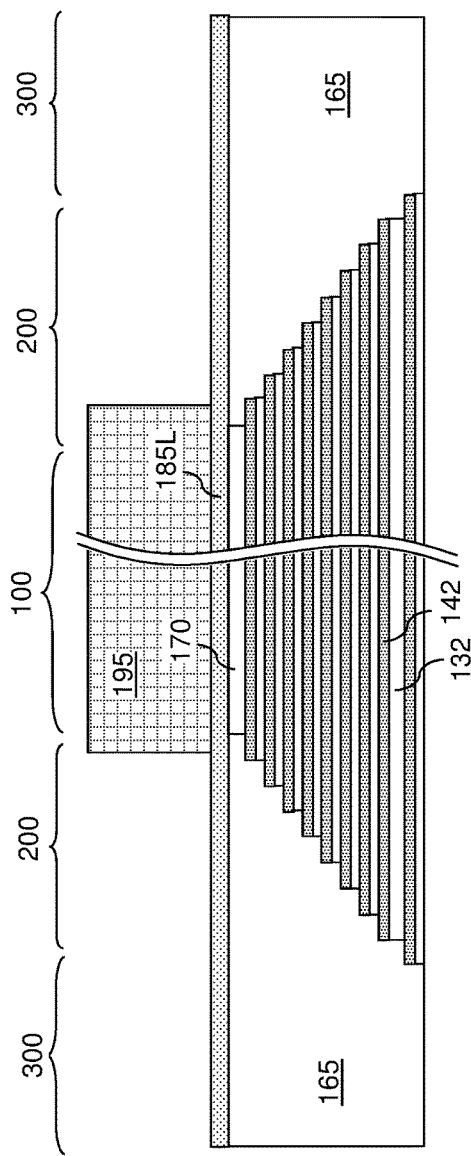

Referring to FIG. 17A, a second exemplary structure according to a second embodiment of the present disclosure can be derived from the first exemplary structure of FIGS. 3A-3C by depositing a continuous silicon nitride layer 185L on the top surfaces of the first insulating cap layer 170 and the first retro-stepped dielectric material portion 165.

According to the second embodiment of the present disclosure, the silicon nitride material for the continuous silicon nitride layer 185L can be deposited under a condition that induces formation of a compressive silicon nitride material, i.e., a silicon nitride material that applies compressive stress to adjoining material portions, or formation of a silicon nitride material that applies less than 0.5 GPa of tensile stress, and preferably less than 0.2 GPa of tensile stress. For example, a compressive silicon nitride material can be deposited by plasma enhanced chemical vapor deposition under process conditions that suppresses formation of stretched silicon-nitrogen bonds and is conducive to hydrogen incorporation. For example, atomic concentration of hydrogen more than 15% is preferable. In one embodiment, the stress applied by the continuous silicon nitride layer 185L to adjoining material portions (e.g., the first retro-stepped dielectric material portion 165) can be in a range from 1.5 GPa of compressive stress to 0.5 GPa of tensile stress, and/or may be in a range from 1.0 GPa of compressive stress to 0.2 GPA of tensile stress, and/or may be in a range from 0.5 GPa of compressive stress to 0 GPa of stress. The continuous silicon nitride layer 185L can be deposited by plasma enhanced chemical vapor deposition (PECVD), and can have a thickness in a range from 10 nm to 300 nm, such as from 30 nm to 100 nm, although lesser and greater thicknesses can also be employed.

Each portion of the continuous silicon nitride layer 185L overlying the area of the topmost layer of the first-tier alternating stacks (132, 142) in the memory array region 100 and optionally over the inner part of the word line contact via region 200 can be masked with a patterned ultraviolet mask layer 195. Each portion of the patterned ultraviolet mask layer 195 includes a closed periphery that defines the lateral extent of the respective portion of the patterned ultraviolet mask layer 195. The area of each portion of the patterned ultraviolet mask layer 195 includes the entire area of the first insulating cap layer 170 that overlies an underlying first-tier alternating stack (132, 142) in the memory array region 100 and optionally over the inner part of the word line contact via region 200. Each closed periphery of the ultraviolet mask layer 195 is laterally offset outward from a periphery of a topmost layer in the first-tier alternating stack (132, 142) in the memory array region 100 into the inner part of the word line contact via region 200. The ultraviolet mask layer 195 can include any material that can block ultraviolet radiation. In one embodiment, the ultraviolet mask layer 195 can be a photoresist layer.

Figure 17B:
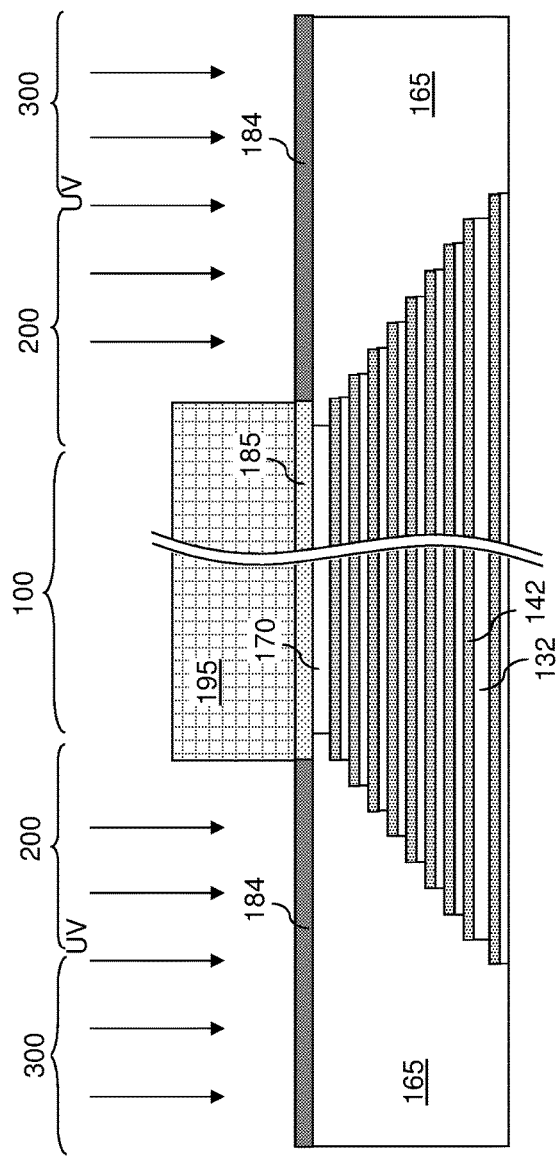

Referring to FIG. 17B, an ultraviolet treatment process is performed to irradiate the unmasked portion of the continuous silicon nitride layer 185L. Hydrogen atoms that are bonded to silicon atoms in the irradiated portion of the continuous silicon nitride layer 185L are dissociated from the silicon atoms, and diffuse out of the irradiated portions of the continuous silicon nitride layer 185L. Thus, the density of hydrogen-silicon bonds in the irradiated portions of the continuous silicon nitride layer 185L decreases, and the atomic concentration of hydrogen atoms in the irradiated portions of the continuous silicon nitride layer 185L decreases. The unmasked portions of the continuous silicon nitride layer 185L are converted by the ultraviolet radiation treatment into material portions that apply more tensile stress to the first retro-stepped dielectric material portion 165 than the continuous silicon nitride layer 185L as deposited.

In one embodiment, the unmasked portions of the continuous silicon nitride layer 185L are converted by the ultraviolet radiation treatment into silicon nitride material portions that apply a tensile stress to the first retro-stepped dielectric material portion 165. The ultraviolet-irradiated portions of the continuous silicon nitride layer 185L can be connected to form a single continuous layer, i.e., a single continuous converted portion, which is herein referred to as a patterned tensile-stress-generating material layer 184. In one embodiment, the magnitude of the tensile stress applied by the patterned tensile-stress-generating material layer 184 to adjoining material portions (e.g., the first retro-stepped dielectric material portion 165) can be in a range from 0.1 GPa to 1.8 GPa, such as from 0.5 GPa to 1.5 GPa, although lesser and greater magnitudes of the tensile stress can also be employed. Each masked portion of the continuous silicon nitride layer 185L that is not irradiated with ultraviolet radiation is herein referred to as a patterned dielectric material layer 185, which has the same composition and the same thickness as the continuous silicon nitride layer 185L. Thus, each patterned dielectric material layer 185 can apply a stress in a range from 1.5 GPa of compressive stress to 0.5 GPa of tensile stress to adjoining material portions (e.g., the first retro-stepped dielectric material portion 165). The patterned tensile-stress-generating material layer 184 applies a more tensile stress to an underlying material portion than stress that the patterned dielectric material layers 185 apply to respective underlying material portions. In one embodiment, the stress applied by the patterned tensile-stress-generating material layer 184 can be more tensile than the stress applied by the patterned dielectric material layers 185 by at least 0.4 GPa, and preferably at least 0.8 GPa, and even more preferably at least 1.2 GPa.

The patterned tensile-stress-generating material layer 184 can be formed over the first retro-stepped dielectric material portion 165 in peripheral/outer parts of the word line contact via regions 200 that are laterally spaced outward from an outer periphery of the topmost layer within each first-tier alternating stack (132, 142) in the memory array region 100. The patterned tensile-stress-generating material layer 184 applies a tensile stress to the first retro-stepped dielectric material portion 165 and to the first-tier alternating stacks (132, 142). In one embodiment, the patterned dielectric material layer 185 comprises a silicon nitride material having a higher atomic concentration of hydrogen than atomic concentration of hydrogen in the patterned tensile-stress-generating material layer 184 as embodied as a patterned silicon nitride layer. In other words, the patterned tensile-stress-generating material layer 184 comprises a first silicon nitride layer having a first atomic concentration of hydrogen, and the patterned dielectric material layer 185 comprises a second silicon nitride layer having second atomic concentration of hydrogen which is higher than the first atomic concentration of hydrogen.

In one embodiment, the first retro-stepped dielectric material portion 165 can include a silicon oxide (such as a TEOS oxide) applying a compressive stress to adjoining regions, the patterned tensile-stress-generating material layer 184 can include silicon nitride applying a tensile stress to adjoining regions, and each of the patterned dielectric material layers 185 can include silicon nitride that applies a compressive stress or a tensile stress of a lesser magnitude than layers 184.

Referring to FIG. 17C, the ultraviolet mask layer 195 can be removed selective to the materials of the patterned tensile-stress-generating material layer 184 and the patterned dielectric material layers 185. If the ultraviolet mask layer 195 includes a photoresist layer, the ultraviolet mask layer 195 can be removed by ashing. The patterned dielectric material layers 185 and the patterned tensile-stress-generating material layer 184 can complementarily cover the entire area of the first exemplary structure. The patterned dielectric material layers 185 and the patterned tensile-stress-generating material layer 184 collectively constitute an inter-tier dielectric layer 180.

Figure 17D:
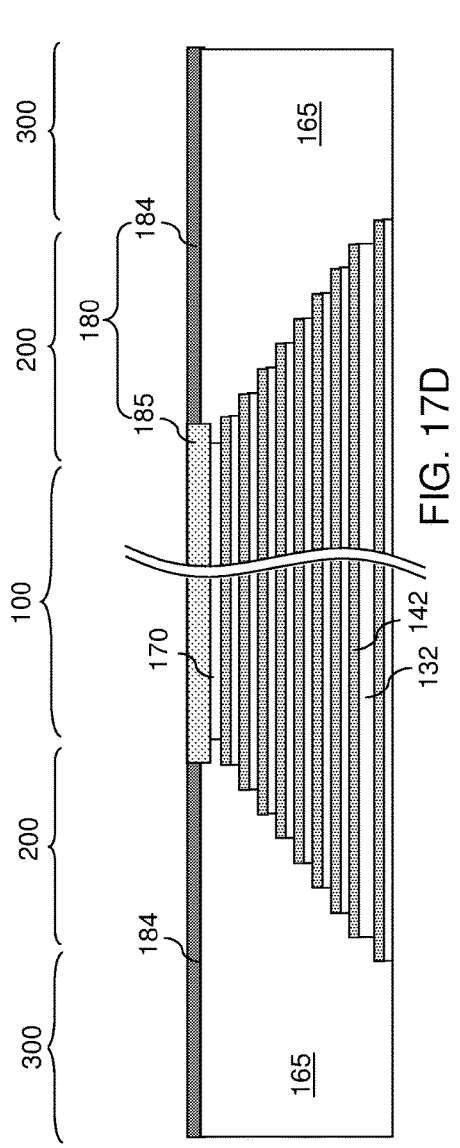
FIGS. 17D and 17E are vertical cross-sectional views of first and second alternative configurations of the second exemplary structure according to the second embodiment of the present disclosure.
Figure 17E:
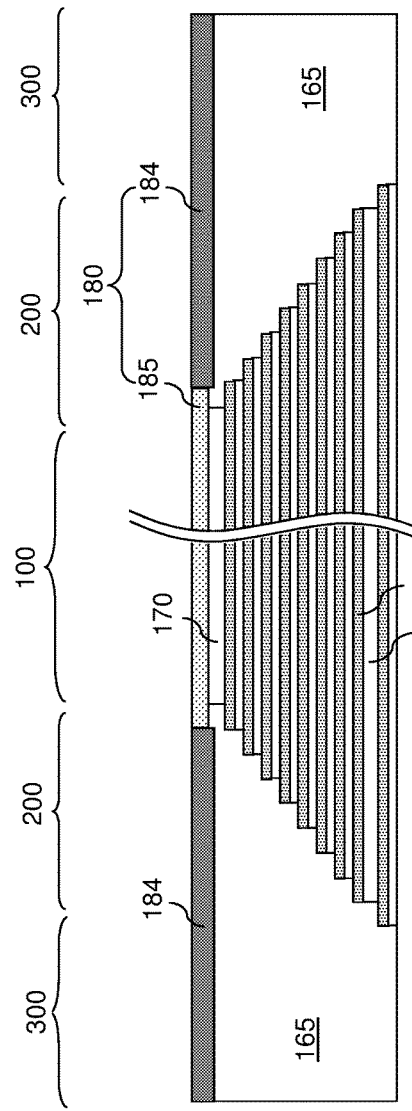

The patterned tensile-stress-generating material layer 184 may have the same or different thickness as patterned dielectric material layers 185 depending on the nature and duration of the oxidation process. FIG. 17D illustrates an alternative configuration in which the patterned tensile-stress-generating material layer 184 has a lesser thickness than the patterned dielectric material layers 185. FIG. 17E illustrates an alternative configuration in which the patterned tensile-stress-generating material layer 184 has a greater thickness than the patterned dielectric material layers 185.

Figure 18:
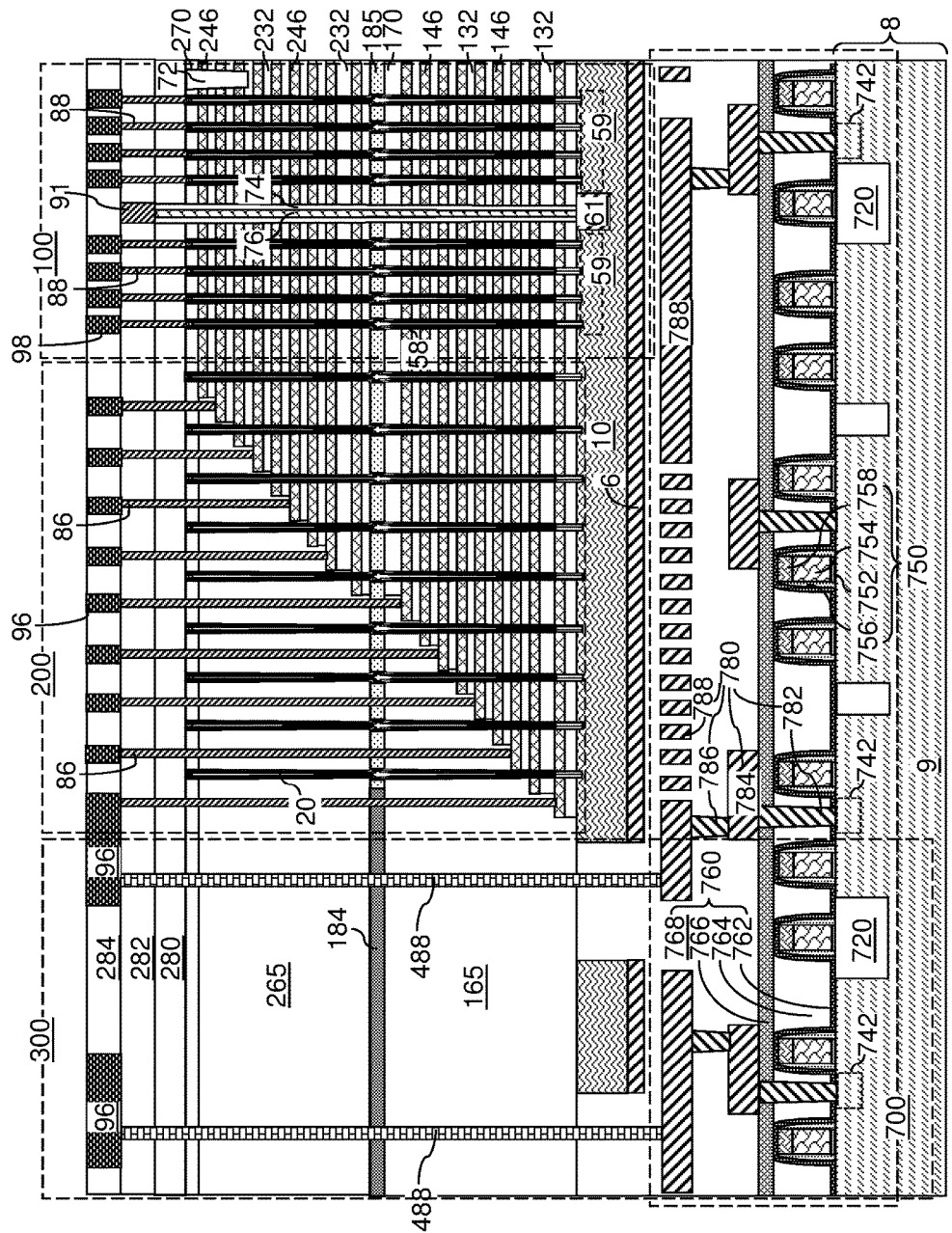
FIG. 18 is a vertical cross-sectional view of the second exemplary structure after formation of upper level line structures according to the second embodiment of the present disclosure.

Subsequently, the processing steps of FIGS. 7A and 7B through the processing steps of FIG. 16 can be performed to provide the second exemplary structure illustrated in FIG. 18. If desired, the patterned dielectric material layers 185 can be removed together with the sacrificial material layers 142, 242 during the word line replacement steps and replaced with an active word line or with a dummy word line (i.e., word line which is not used to program or read a memory cell).

The patterned tensile-stress-generating material layer 184 applies tensile stress to the first retro-stepped dielectric material portion 165 and the second retro-stepped dielectric material portion 265 to at least partially compensate for the compressive stress that the first and second retro-stepped dielectric material portions (165, 265) apply to the first-tier alternating stack (132, 146) and to the second-tier alternating stack (232, 246). The tensile stress that the patterned tensile-stress-generating material layer 184 applies to the first and second retro-stepped dielectric material portions (165, 265) can be tuned to match the total compressive stress that the first and second retro-stepped dielectric material portions (165, 265) apply to the first-tier alternating stack (132, 146) and to the second-tier alternating stack (232, 246). In one embodiment, the tensile stress that the patterned tensile-stress-generating material layer 184 applies to the first and second retro-stepped dielectric material portions (165, 265) can have a magnitude that is in a range from 20% to 180%, and/or in a range from 50% to 150%, and/or in a range from 75% to 125%, of the magnitude of the total compressive stress that the first and second retro-stepped dielectric material portions (165, 265) apply to the first-tier alternating stack (132, 146) and to the second-tier alternating stack (232, 246). The effect of the compressive stress applied by the first and second retro-stepped dielectric material portions (165, 265) to the first-tier alternating stack (132, 146) and to the second-tier alternating stack (232, 246) can be significantly reduced or eliminated.

Referring to FIG. 19A, a third exemplary structure according to a third embodiment of the present disclosure can be derived from the first exemplary structure of FIG. 2 by depositing a sacrificial planarization stopper layer 172. The sacrificial planarization stopper layer 172 includes a material that can function as a planarization stopping layer during a subsequent planarization process that removes the dielectric material of a first-tier retro stepped dielectric material portion 165. For example, the sacrificial planarization stopping layer 172 can include silicon nitride or a dielectric metal oxide (such as aluminum oxide). The thickness of the sacrificial planarization stopping layer 172 can be selected such that entirety of the sacrificial planarization stopping layer 172 can be consumed at the end of a chemical mechanical planarization process. For example, the thickness of the sacrificial planarization stopping layer 172 can be in a range from 10 nm to 100 nm, although lesser and greater thicknesses can also be employed.

The sacrificial planarization stopping layer 172 can be patterned during subsequent patterning of the first insulating cap layer 170 and the first-tier alternating stack (132, 142), which forms first stepped surfaces around each memory array region 100. The area of each patterned portion of the sacrificial planarization stopping layer 172 can be the same as, or can be less than, the area of the portion of the first insulating cap layer 170 that underlies the patterned portion of the sacrificial planarization stopping layer 172.

A dielectric material can be deposited around the first-tier alternating stacks (132, 142) to form a planarization dielectric layer 165L. In one embodiment, the planarization dielectric layer 165L can include a compressive-stress-generating dielectric material such as a TEOS oxide. The TEOS oxide can generate compressive stress, of which the magnitude varies depending on the deposition conditions. Typically, the TEOS oxide can generate compressive stress in a range from 20 MPa to 200 MPa, although lesser and greater compressive stress can also be generated. TEOS oxides include residual carbon at an atomic concentration of at least 10 parts per million, and typically at least 100 parts per million. In one embodiment, the planarization dielectric layer 165L includes a TEOS based silicon oxide material including carbon at an atomic concentration of at least 10 parts per million over the first terrace region and over a topmost surface of the first-tier alternating stacks (132, 142) by plasma enhanced chemical vapor deposition (PECVD) or low pressure chemical vapor deposition (LPCVD) process. The thickness of the planarization dielectric layer 165L can be selected such that the thickness t of the planarization dielectric layer 165L outside the areas of the memory array regions 100 containing the first-tier alternating stacks (132, 142) is less than the sum of the thickness of the first-tier alternating stack (132, 142) and the thickness of the first insulating cap layer 170. In one embodiment, the difference between the sum of the thickness of the first-tier alternating stack (132, 142) and the thickness of the first insulating cap layer 170 and the thickness t of the planarization dielectric layer 165L can be the target thickness of a patterned tensile-stress-generating material layer to be subsequently formed, which may be in a range from 10 nm to 300 nm, such as from 30 nm to 100 nm, although lesser and greater target thicknesses can also be employed.

A continuous tensile-stress-generating material layer 186L is deposited on the top surfaces of the planarization dielectric layer 165L. The continuous tensile-stress-generating material layer 186L includes a tensile-stress-generating dielectric material or a tensile-stress-generating metallic material. In one embodiment, the continuous tensile-stress-generating material layer 186L includes a tensile-stress-generating silicon nitride that applies tensile stress to adjoining material portions (e.g., the planarization dielectric layer 165L). In another embodiment, the continuous tensile-stress-generating material layer 186L can include any tensile-stress-generating metal, such as tungsten, which can be generally formed by controlling a nucleation process during metal deposition. Any method for forming a compressive-stress-generating metal film in the art may be employed. For example, U.S. Pat. No. 9,034,760 discloses methods for forming a tensile-stress-generating tungsten film. The magnitude of the tensile stress that can be generated by the continuous tensile-stress-generating material layer 186L can be in a range from 0.1 GPa to 5 GPa, such as from 0.5 GPa to 3 GPa, although lesser and greater magnitudes of the tensile stress can also be employed.

Figure 19C:
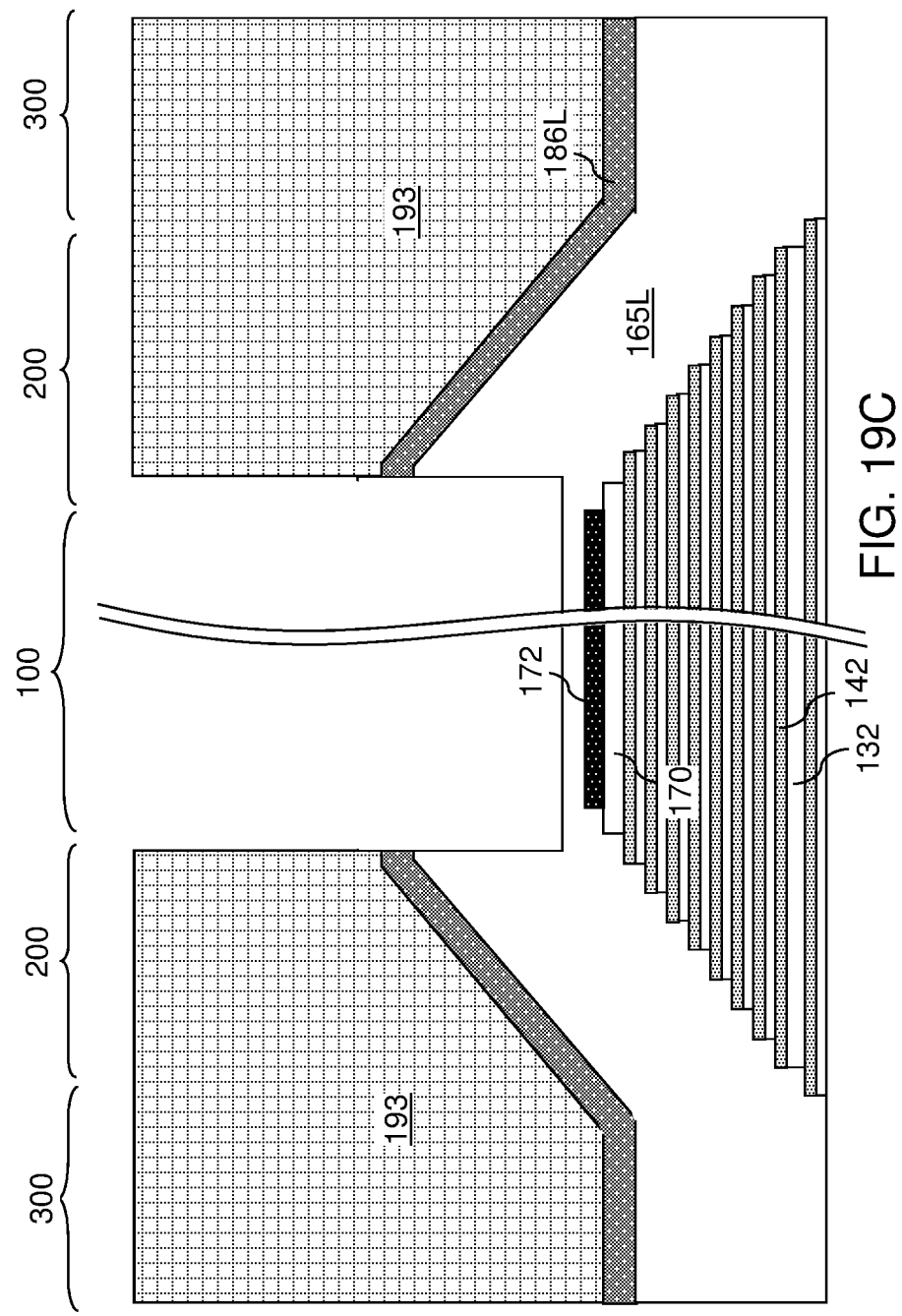

Referring to FIG. 19C, the area located outside the areas of the memory array region 100 and optionally the inner part of the word line contact via regions 200 containing the first insulating cap layer 170 can be masked with an etch mask layer 193. In one embodiment, the etch mask layer 193 can be a patterned photoresist layer. In one embodiment, the area of each opening can include the entire area of the first insulating cap layer 170 that overlies a first-tier alternating stack (132, 142). In this case, each closed periphery of the etch mask layer 193 extends partially over the word line contact via regions 200 and is laterally offset outward from a periphery of a topmost layer in the first-tier alternating stack (132, 142) in the memory array region 100. An etch process can be performed to etch the physically exposed portions of the continuous tensile-stress-generating material layer 186L and the planarization dielectric layer 165L. The etch can process may include at least one anisotropic etch step and/or at least one isotropic etch step to remove each portion of the continuous tensile-stress-generating material layer 186L underneath each opening in the etch mask layer 193, and underlying portions of the planarization dielectric layer 165L to facilitate subsequent planarization of the continuous tensile-stress-generating material layer 186L and the planarization dielectric layer 165L.

Figure 19D:
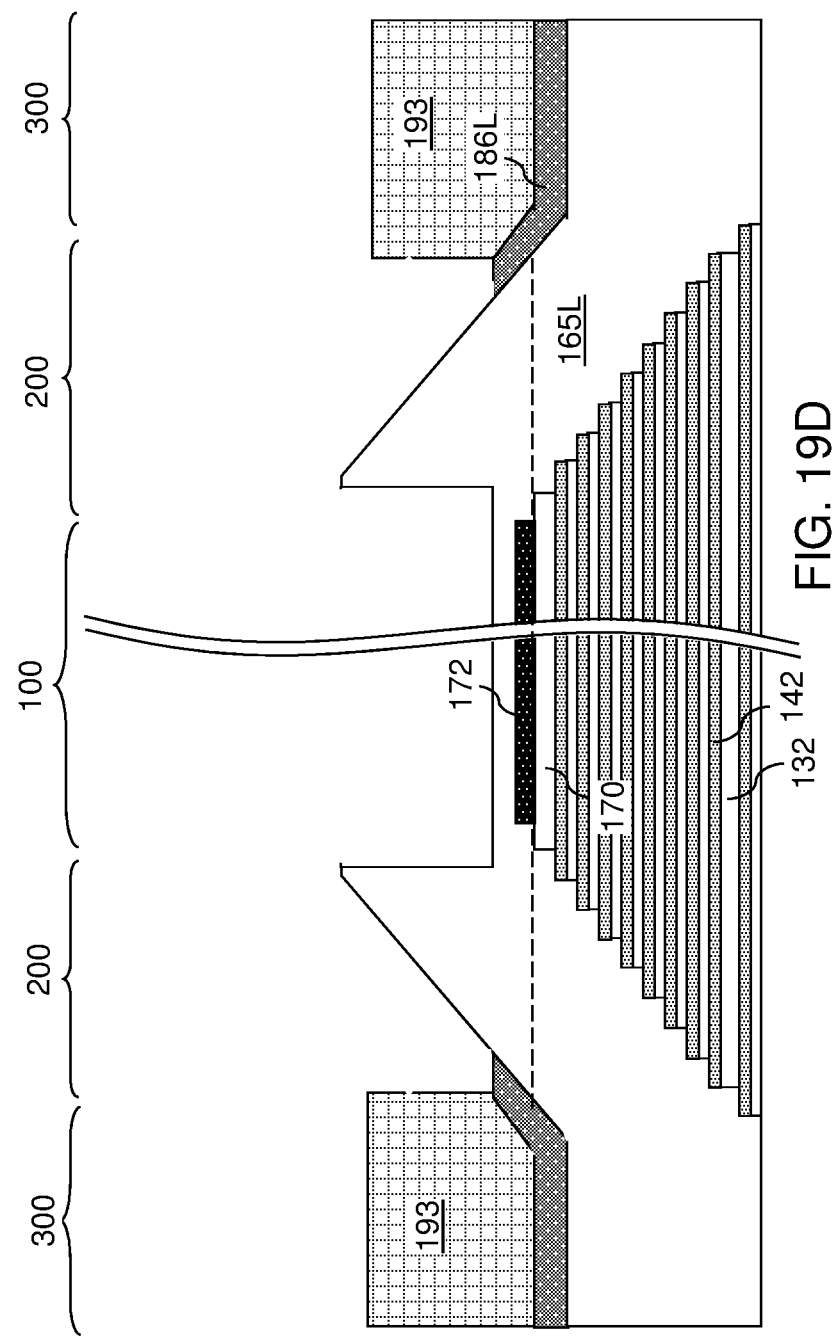

Referring to FIG. 19D, the etch mask layer 193 may be trimmed so that the periphery of each opening in the etch mask layer 193 moves outward toward the outer periphery of each first staircase region in the word line contact via region 200 (i.e., toward the peripheral regions 300). The trimming distance of the etch mask layer 193 can be controlled such that the entirety of the physically exposed portions of the top surface of the planarization dielectric layer 165L is located above a horizontal plane including the top surface of the first insulating cap layer 170. Optionally, newly exposed portions of layer 186L can be recessed as shown in FIG. 19D.

Figure 19E:
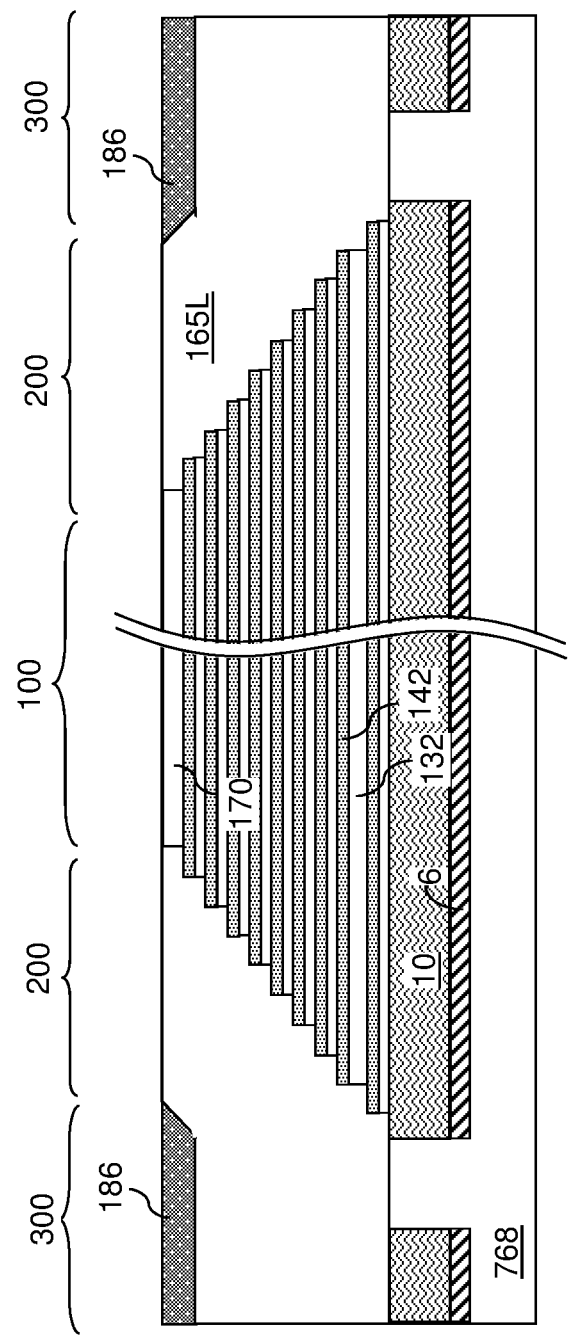

Referring to FIG. 19E, the etch mask layer 193 can be removed, for example, by ashing. A chemical mechanical planarization process can be performed to remove portions of the continuous tensile-stress-generating material layer 186L and the planarization dielectric layer from above the horizontal plane including the top surface of the first insulating cap layer 170. In one embodiment, the sacrificial planarization stopping layer 172 can function as a stopping layer for the chemical mechanical planarization process, and can be subsequent consumed during a latter part of the chemical mechanical planarization process. The remaining portion of the continuous tensile-stress-generating material layer 186L constitutes a patterned tensile-stress-generating material layer 186 located over the peripheral device region 300 and optionally over the peripheral/outer portion of the word line contact via region 200. The remaining portion of the planarization dielectric layer 165L constitutes a first retro-stepped dielectric material portion 165.

In one embodiment, the first retro-stepped dielectric material portion 165 contacts an entire set of sidewalls of each inner periphery of the patterned tensile-stress-generating material layer 186. In one embodiment, the first retro-stepped dielectric material portion 165 contacts an entire set of sidewalls of an inner periphery of the patterned tensile-stress-generating material layer 186. In one embodiment, an interface between the first retro-stepped dielectric material portion 165 and the patterned tensile-stress-generating material layer 186 has a taper angle in a range from 15 degrees and 85 degrees with respect to a vertical direction.

The first retro-stepped dielectric material portion 165 can include a silicon oxide (such as a TEOS oxide) applying a compressive stress to adjoining regions (such as the first-tier alternating stack (132, 142), and the patterned tensile-stress-generating material layer 182 can include a tensile-stress-generating material that applies a tensile stress to adjoining regions (such as the first retro-stepped dielectric material portion 165).

Figure 20:
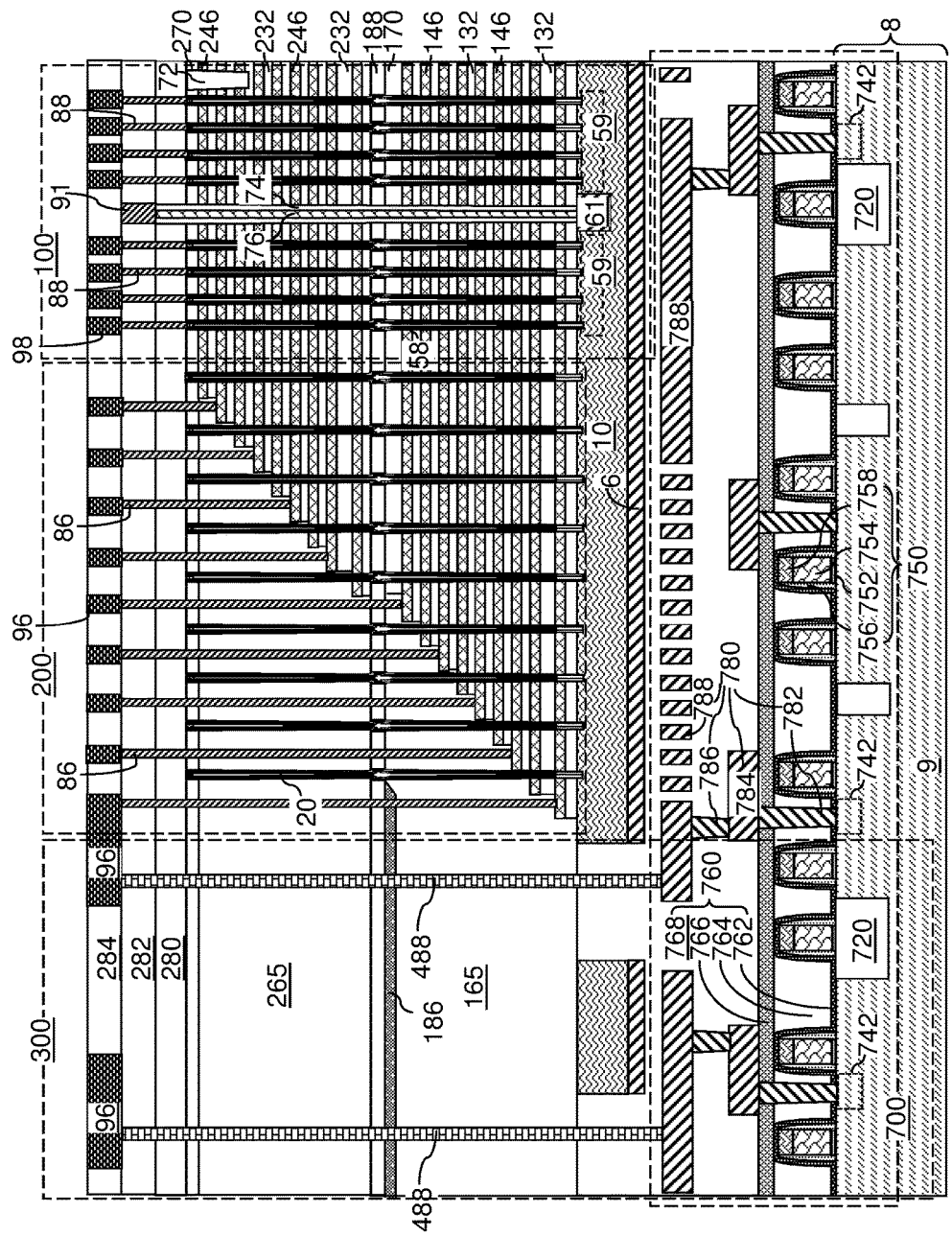
FIG. 20 is a vertical cross-sectional view of the third exemplary structure after formation of upper level line structures according to the third embodiment of the present disclosure.

Subsequently, the processing steps of FIGS. 7A and 7B through the processing steps of FIG. 16 can be performed to provide the third exemplary structure illustrated in FIG. 20.

The patterned tensile-stress-generating material layer 186 applies tensile stress to the first retro-stepped dielectric material portion 165 and the second retro-stepped dielectric material portion 265 to at least partially compensate for the compressive stress that the first and second retro-stepped dielectric material portions (165, 265) apply to the first-tier alternating stack (132, 146) and to the second-tier alternating stack (232, 246). The tensile stress that the patterned tensile-stress-generating material layer 186 applies to the first and second retro-stepped dielectric material portions (165, 265) can be tuned to match the total compressive stress that the first and second retro-stepped dielectric material portions (165, 265) apply to the first-tier alternating stack (132, 146) and to the second-tier alternating stack (232, 246). In one embodiment, the tensile stress that the patterned tensile-stress-generating material layer 186 applies to the first and second retro-stepped dielectric material portions (165, 265) can have a magnitude that is in a range from 20% to 180%, and/or in a range from 50% to 150%, and/or in a range from 75% to 125%, of the magnitude of the total compressive stress that the first and second retro-stepped dielectric material portions (165, 265) apply to the first-tier alternating stack (132, 146) and to the second-tier alternating stack (232, 246). The effect of the compressive stress applied by the first and second retro-stepped dielectric material portions (165, 265) to the first-tier alternating stack (132, 146) and to the second-tier alternating stack (232, 246) can be significantly reduced or eliminated.

In case the patterned tensile-stress-generating material layer 186 includes a dielectric material such as a tensile-stress-generating silicon nitride, the word line contact via structures 86 and the through-memory-level via structures 488 can be formed in the same manner as in the first embodiment, i.e., without any dielectric liner.

Figure 21:
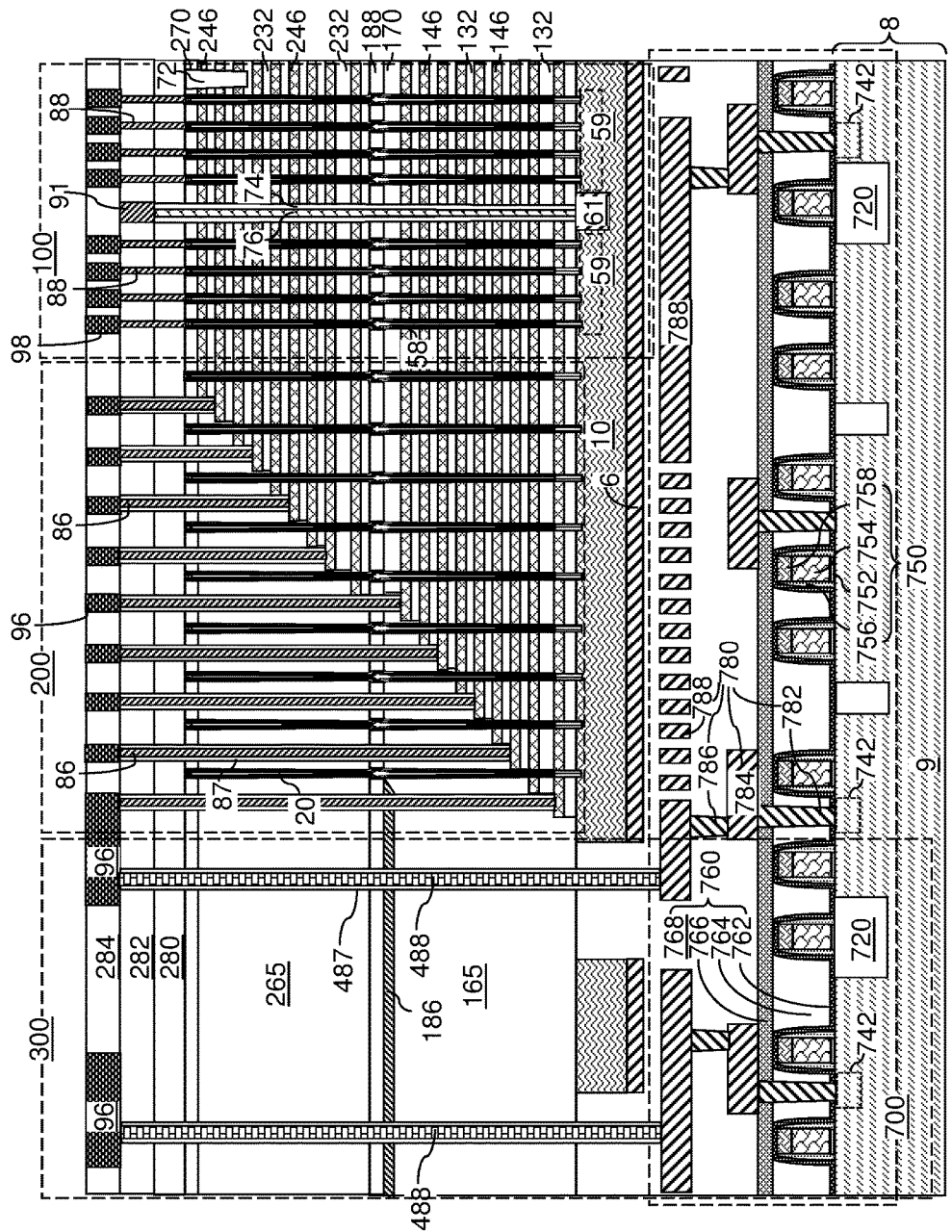
FIG. 21 is a vertical cross-sectional view of a fourth exemplary structure after formation of upper level line structures according to a fourth embodiment of the present disclosure.

In case the patterned tensile-stress-generating material layer 186 includes a conductive material (such as an elemental metal, an intermetallic alloy, a metal nitride, a metal carbide, or a metal silicide), the word line contact via structures 86 and the through-memory-level via structures 488 can be formed with a respective cylindrical dielectric liner (87, 487) as illustrated in FIG. 21 to prevent electrical shorts.

The various exemplary structures of the present disclosure include a semiconductor structure. The semiconductor structure can include: a first-tier alternating stack (132, 146) of first insulating layers 132 and first electrically conductive layers 146 located over a substrate (8, 9), wherein the first-tier alternating stack (132, 146) comprises a first terrace region; memory stack structures 58 extending through the first-tier alternating stack (132, 146), wherein each of the memory stack structures 58 comprises a vertical semiconductor channel 60 and a memory film 50, such as a vertical stack of memory elements (as embodied as portions of the charge storage layer 54) located at levels of a predominant subset of the first electrically conductive layers 146 (with a possible exception of a subset of the first electrically conductive layers 146 that are employed as select gate electrodes); a first retro-stepped dielectric material portion 165 comprising a compressive-stress-generating dielectric material, contacting stepped surfaces of the first terrace region, and laterally surrounding the first-tier alternating stack (132, 146); and a patterned tensile-stress-generating material layer (182, 184, 186) overlying the first retro-stepped dielectric material portion 165, laterally spaced outward from an outer periphery of a topmost layer within the first-tier alternating stack (132, 146), and applying a tensile stress to the first retro-stepped dielectric material portion 165 and to the first-tier alternating stack (132, 146). In one embodiment, the first retro-stepped dielectric material portion 165 comprises a tetraethylorthosilicate (TEOS) based silicon oxide material including carbon at an atomic concentration of at least 10 parts per million. As used herein, a "predominant subset" refers to a subset that includes more than 50% of all elements within the entire set.

In one embodiment, the patterned tensile-stress-generating material layer (182, 184) comprises a patterned silicon nitride layer including a continuous closed inner periphery that is defined by an opening therethrough. In one embodiment, a patterned dielectric material layer (183, 185) may be provided, which overlies the first-tier alternating stack (132, 146), contacts the continuous closed inner periphery of the patterned silicon nitride layer (182, 184), and applies a compressive stress to the first-tier alternating stack (132, 142) and to the patterned tensile-stress-generating material layer (182, 184).

In one embodiment, the patterned dielectric material layer 183 comprises silicon oxide or silicon oxynitride; and a nitrogen concentration gradient is present near an interface between the patterned silicon nitride layer 182 and the patterned dielectric material layer 183 such that nitrogen concentration in the patterned dielectric material layer 183 decreases with distance from the interface.

In one embodiment, the patterned dielectric material layer 185 comprises a silicon nitride material having a higher atomic concentration of hydrogen than atomic concentration of hydrogen in the patterned silicon nitride layer 184.

In one embodiment, a topmost surface of the first retro-stepped dielectric material portion 165 contacts a bottom surface of the patterned tensile-stress-generating material layer (182, 184, 186).

In one embodiment, the first retro-stepped dielectric material portion 165 contacts an entire set of sidewalls of an inner periphery of the patterned tensile-stress-generating material layer 186. In one embodiment, an interface between the first retro-stepped dielectric material portion 165 and the patterned tensile-stress-generating material layer 186 has a taper angle in a range from 15 degrees and 85 degrees with respect to a vertical direction.

In one embodiment, the patterned tensile-stress-generating material layer 186 comprises a tensile-stress-generating metallic material. In this case, contact via structures (such as word line contact via structures 86) extending through the patterned tensile-stress-generating material layer 186 and the first retro-stepped dielectric material portion 165 can be provided, which contact a top surface of a respective one of the first electrically conductive layers 146, wherein each of the contact via structures 86 is electrically isolated from the patterned tensile-stress-generating material layer 186 by a respective cylindrical dielectric liner 87.

In one embodiment, a second-tier alternating stack (232, 246) of second insulating layers 232 and second electrically conductive layers 246 can overlie the first-tier alternating stack (132, 146). Each of the memory stack structures 58 extends through the second-tier alternating stack (232, 246) and an additional vertical stack of memory elements (i.e., portions of the charge storage layer 54 within the second-tier alternating stack (232, 246)) located at levels of a predominant subset of the second electrically conductive layers 246.

Each of the exemplary structures and alternative embodiments can include a three-dimensional memory device. In one embodiment, the three-dimensional memory device comprises a vertical NAND memory device. The electrically conductive layers (146, 246) can comprise, or can be electrically connected to, a respective word line of the monolithic three-dimensional NAND memory device. The substrate (8, 9) can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 146, 246) in a first device level of the array of monolithic three-dimensional NAND strings can be located over another memory cell (as embodied as another portion of the charge storage layer 54 at a level of another electrically conductive layer 146, 246) in a second device level of the array of monolithic three-dimensional NAND strings. The silicon substrate can contain an integrated circuit comprising a driver circuit for the memory device located thereon. The electrically conductive layers can comprise a plurality of control gate electrodes having a strip shape extending substantially parallel to the top surface of the substrate (8, 9), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (8, 9); and a plurality of charge storage elements (as embodied as charge trapping material portions). Each charge storage element can be located adjacent to a respective one of the plurality of semiconductor channels (59, 11, 60).

The silicon substrate (8, 9) contains a peripheral device region 700 comprising an integrated circuit comprising a driver circuit for the memory device located thereon. Word line contact via structures 86 are located in a word line contact via region 200, some of which extend through the patterned tensile-stress-generating material layer and the first retro-stepped dielectric material portion and contact a top surface of the respective the word line 146 in the first tier. Other word line contact via structures contact respective word lines in the second (i.e., upper) tier and do not extend through the patterned tensile-stress-generating material layer. The patterned tensile-stress-generating material layer (182, 184, 186) is located over the peripheral device region 300 and over an outer portion of the word line contact via region 200, but not over an inner portion of the word line contact via region 200 and not over a memory array region 100 comprising a memory plane which contains the array of monolithic three-dimensional NAND strings.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure comprising:
   a first-tier alternating stack of first insulating layers and first electrically conductive layers located over a substrate, wherein the first-tier alternating stack comprises a first terrace region;
   memory stack structures extending through the first-tier alternating stack, wherein each of the memory stack structures comprises a vertical semiconductor channel and a memory film;
   a first retro-stepped dielectric material portion comprising a compressive-stress-generating dielectric material, contacting stepped surfaces of the first terrace region, and laterally surrounding the first-tier alternating stack;
   a patterned tensile-stress-generating material layer overlying the first retro-stepped dielectric material portion, laterally spaced outward from an outer periphery of a topmost layer within the first-tier alternating stack, and applying a tensile stress to the first retro-stepped dielectric material portion and to the first-tier alternating stack, wherein the patterned tensile-stress-generating material layer has continuous closed inner periphery that is defined by an opening therethrough; and
   a dielectric material layer overlying the first-tier alternating stack, contacting the continuous closed inner periphery of the patterned tensile-stress-generating material layer, and applying a compressive stress to the first-tier alternating stack and to the patterned tensile-stress-generating material layer.

2. The semiconductor structure of claim 1, wherein:
   the patterned tensile-stress-generating material layer comprises a silicon nitride layer;
   the dielectric material layer comprises a silicon oxide or silicon oxynitride layer; and
   a nitrogen concentration gradient is present near an interface between the patterned tensile-stress-generating material layer and the dielectric material layer such that nitrogen concentration in the dielectric material layer decreases with distance from the interface.

3. The semiconductor structure of claim 1, wherein:
   the patterned tensile-stress-generating material layer comprises a first silicon nitride layer having a first atomic concentration of hydrogen; and
   the dielectric material layer comprises a second silicon nitride layer having second atomic concentration of hydrogen which is higher than the first atomic concentration of hydrogen.

4. The semiconductor structure of claim 1, wherein the patterned tensile-stress-generating material layer and the dielectric material layer have different thicknesses.

5. The semiconductor structure of claim 1, wherein a topmost surface of the first retro-stepped dielectric material portion contacts a bottom surface of the patterned tensile-stress-generating material layer.

6. The semiconductor structure of claim 1, wherein the first retro-stepped dielectric material portion contacts an entire set of sidewalls of an inner periphery of the patterned tensile-stress-generating material layer.

7. The semiconductor structure of claim 1, wherein an interface between the first retro-stepped dielectric material portion and the patterned tensile-stress-generating material layer has a taper angle in a range from 15 degrees and 85 degrees with respect to a vertical direction.

8. The semiconductor structure of claim 1, wherein the patterned tensile-stress-generating material layer comprises a tungsten layer, and further comprising contact via structures extending through the patterned tensile-stress-generating material layer and the first retro-stepped dielectric material portion and contacting a top surface of a respective one of the first electrically conductive layers, wherein each of the contact via structures is electrically isolated from the patterned tensile-stress-generating material layer by a respective cylindrical dielectric liner.

9. A semiconductor structure comprising:
   a first-tier alternating stack of first insulating layers and first electrically conductive layers located over a substrate, wherein the first-tier alternating stack comprises a first terrace region;
   memory stack structures extending through the first-tier alternating stack, wherein each of the memory stack structures comprises a vertical semiconductor channel and a memory film;
   a first retro-stepped dielectric material portion comprising a compressive-stress-generating dielectric material, contacting stepped surfaces of the first terrace region, and laterally surrounding the first-tier alternating stack; and a patterned tensile-stress-generating material layer overlying the first retro-stepped dielectric material portion, laterally spaced outward from an outer periphery of a topmost layer with the first-tier alternating stack, and applying a tensile stress to the first retro-stepped dielectric material portion and to the first-tier alternating stack;

a second-tier alternating stack of the second insulating layers and second electrically conductive layers overlying the first-tier alternating stack, wherein each of the memory stack structures extends through the second-tier alternating stack and an additional vertical stack of memory elements located at levels of a predominant subset of the second electrically conductive layers;

wherein:

the semiconductor structure comprises a monolithic three-dimensional NAND memory device;

the first and second electrically conductive layers comprise, or are electrically connected to, a respective word line of the monolithic three-dimensional NAND memory device;

the substrate comprises a silicon substrate;

the monolithic three-dimensional NAND memory device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains a peripheral device region comprising an integrated circuit comprising a driver circuit for the memory device located thereon;

word line contact via structures are located in a word line contact via region, extend through the patterned tensile-stress-generating material layer and the first retro-stepped dielectric material portion and contact a top surface of the respective the word line; and a patterned tensile-stress-generating material layer is located over the peripheral device region and over an outer portion of the word line contact via region, but not over an inner portion of the word line contact via region and not over a memory array region comprising a memory plane which contains the array of monolithic three-dimensional NAND strings.

* * * * *